US012669755B2

(12) United States Patent
Rostalski et al.

(10) Patent No.: US 12,669,755 B2
(45) Date of Patent: Jun. 30, 2026

(54) IMAGING OPTICAL UNIT

(71) Applicant: Carl Zeiss SMT GmbH, Oberkochen (DE)

(72) Inventors: Hans-Jürgen Rostalski, Fürstenwalde/Spree (DE); Holger Münz, Aalen (DE); Christoph Menke, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 137 days.

(21) Appl. No.: 18/523,198

(22) Filed: Nov. 29, 2023

(65) Prior Publication Data

US 2024/0103382 A1 Mar. 28, 2024

Related U.S. Application Data

(63) Continuation of application No. PCT/EP2022/065225, filed on Jun. 3, 2022.

(30) Foreign Application Priority Data

Jun. 8, 2021 (DE) ..................... 10 2021 205 775.6

(51) Int. Cl.
*G03F 7/20* (2006.01)
*G02B 17/06* (2006.01)
(Continued)

(52) U.S. Cl.
CPC ..... *G03F 7/70591* (2013.01); *G02B 17/0663* (2013.01); *G02B 27/4222* (2013.01);
(Continued)

(58) Field of Classification Search
CPC .. G03F 7/70591; G03F 7/70158; G03F 7/702; G03F 7/70233; G02B 17/0663; G02B 27/4222; G02B 5/0891
See application file for complete search history.

(56) References Cited

U.S. PATENT DOCUMENTS 9,366,968 B2 6/2016 Mann
10,527,832 B2 1/2020 Schwab et al.
(Continued)

FOREIGN PATENT DOCUMENTS

DE 101 55 711 A 2/2006
DE 10 2015 226 531 A1 10/2016
(Continued)

OTHER PUBLICATIONS

International Search Report and Written Opinion for corresponding PCT Appl. No. PCT/EP2022/065225, mailed Oct. 11, 2022.
(Continued)

*Primary Examiner* — Mesfin T Asfaw
(74) *Attorney, Agent, or Firm* — Fish & Richardson P.C.

(57) ABSTRACT

An imaging optical unit comprises a plurality of mirrors for imaging an object field into an image field. The imaging optical unit has an image-side numerical aperture greater than 0.55. Each mirror is configured so that it can be measured by a testing optical unit having at least one DOE with a predetermined maximum diameter for test wavefront generation. For the complete measurement of all reflection surfaces of the mirrors, a maximum number of DOEs of the testing optical unit and/or a maximum number of DOE test positions of the at least one DOE of the testing optical unit comes into play, which is no more than five times the number of mirrors in the imaging optical unit. The result is an imaging optical unit in which a testing-optical measurement remains manageable even in the case of a design with an image-side numerical aperture which is relatively large.

25 Claims, 19 Drawing Sheets

(51) Int. Cl.
    G02B 27/42         (2006.01)
    G03F 7/00          (2006.01)

(52) U.S. Cl.
    CPC .......... G03F 7/70158 (2013.01); G03F 7/702
            (2013.01); G03F 7/70233 (2013.01)

(56)          References Cited

U.S. PATENT DOCUMENTS

| | | |
|---|---|---|
| 2007/0058269 A1 | 3/2007 | Mann et al. |
| 2010/0177320 A1* | 7/2010 | Arnold ............... G01M 11/0271 |
| | | 359/708 |
| 2013/0128251 A1* | 5/2013 | Mann .................. G03F 7/70216 |
| | | 355/67 |
| 2016/0085061 A1 | 3/2016 | Schwab |
| 2017/0248851 A1* | 8/2017 | Endres ................ G03F 7/70075 |
| 2019/0025562 A1 | 1/2019 | Schwab |
| 2020/0004006 A1 | 1/2020 | Sinclair et al. |

FOREIGN PATENT DOCUMENTS

| | | | |
|---|---|---|---|
| DE | 10 2019 219 209 A1 | 1/2020 |
| DE | 10 2019 208 961 A1 | 12/2020 |
| DE | 10 2019 214 979 A1 | 4/2021 |
| TW | 201827886 A | 8/2018 |
| WO | WO 2012/126867 A | 9/2012 |
| WO | WO 2016/166080 A1 | 10/2016 |

OTHER PUBLICATIONS

GPTO Office Action, with translation thereof, for corresponding DE Appl No. 10 2021 205 775.6 dated Mar. 8, 2022.
Office Action in European Appln. No. 22734231.8, mailed on Nov. 27, 2025, 5 pages.
Office Action in Taiwanese Appln. No. 111121053, mailed on Feb. 9, 2026, 9 pages (with English translation).
Search Report in Taiwanese Appln. No. 111121053, mailed on Feb. 10, 2026, 2 pages (with English machine translation).

* cited by examiner

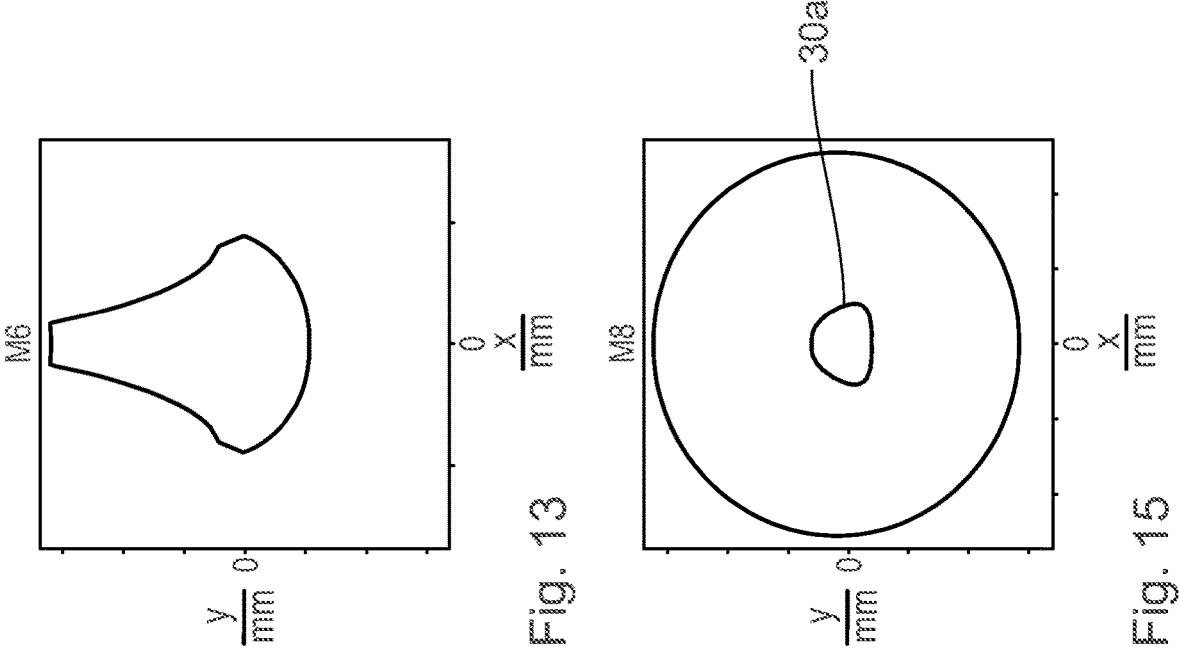
Fig. 12
Fig. 13
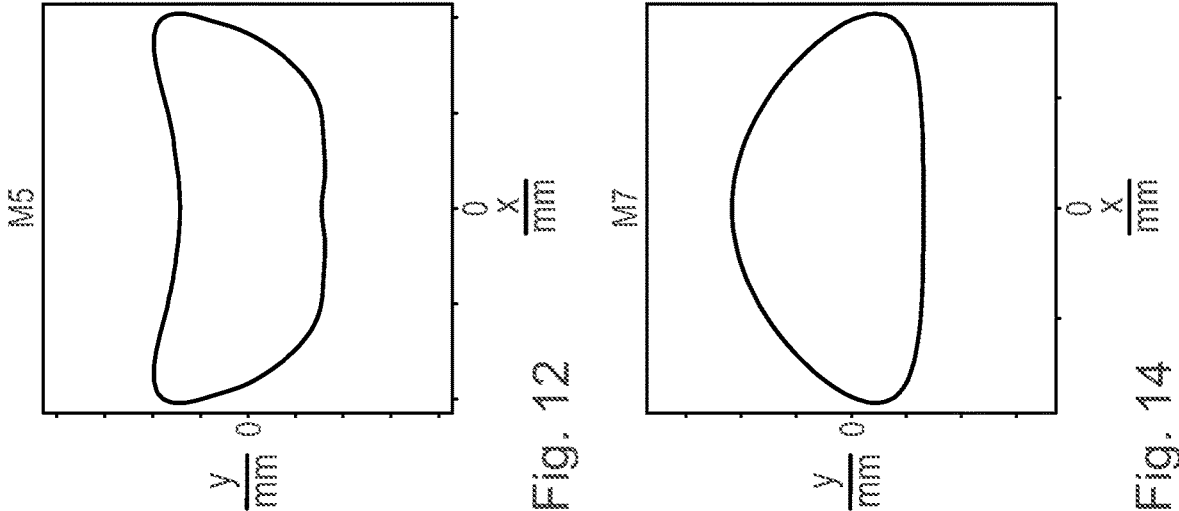
Fig. 14
Fig. 15

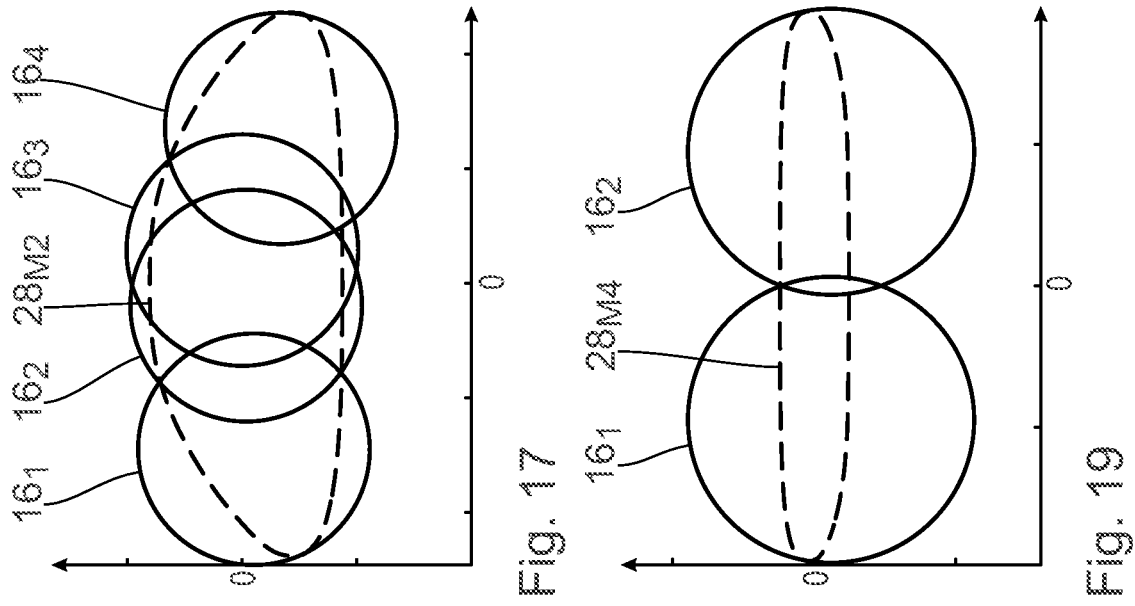
Fig. 16
Fig. 17
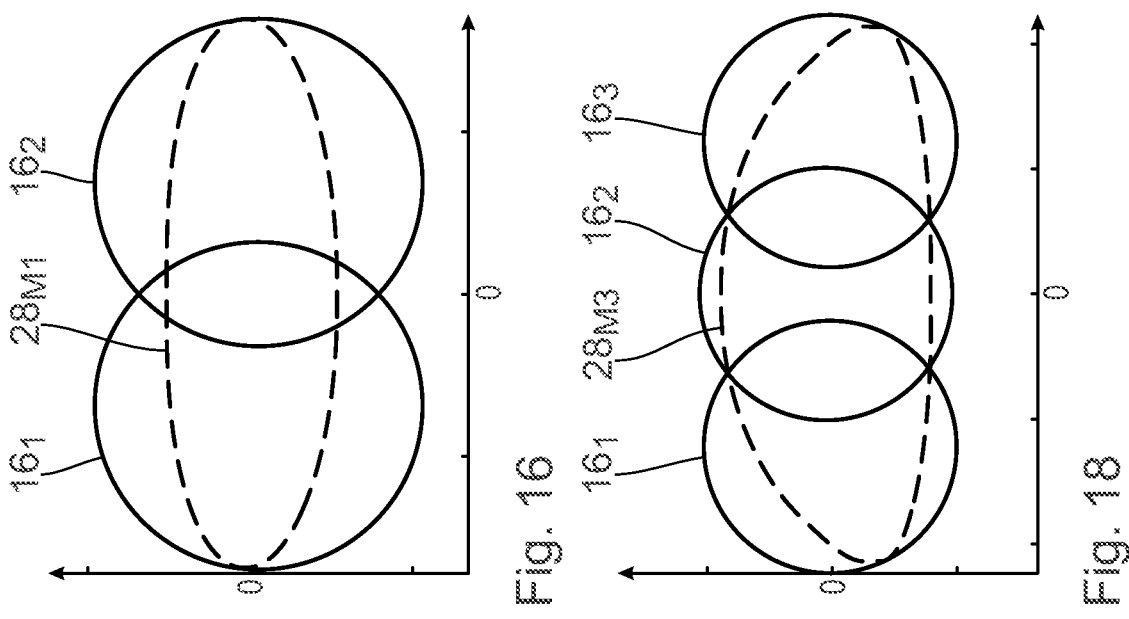
Fig. 18
Fig. 19

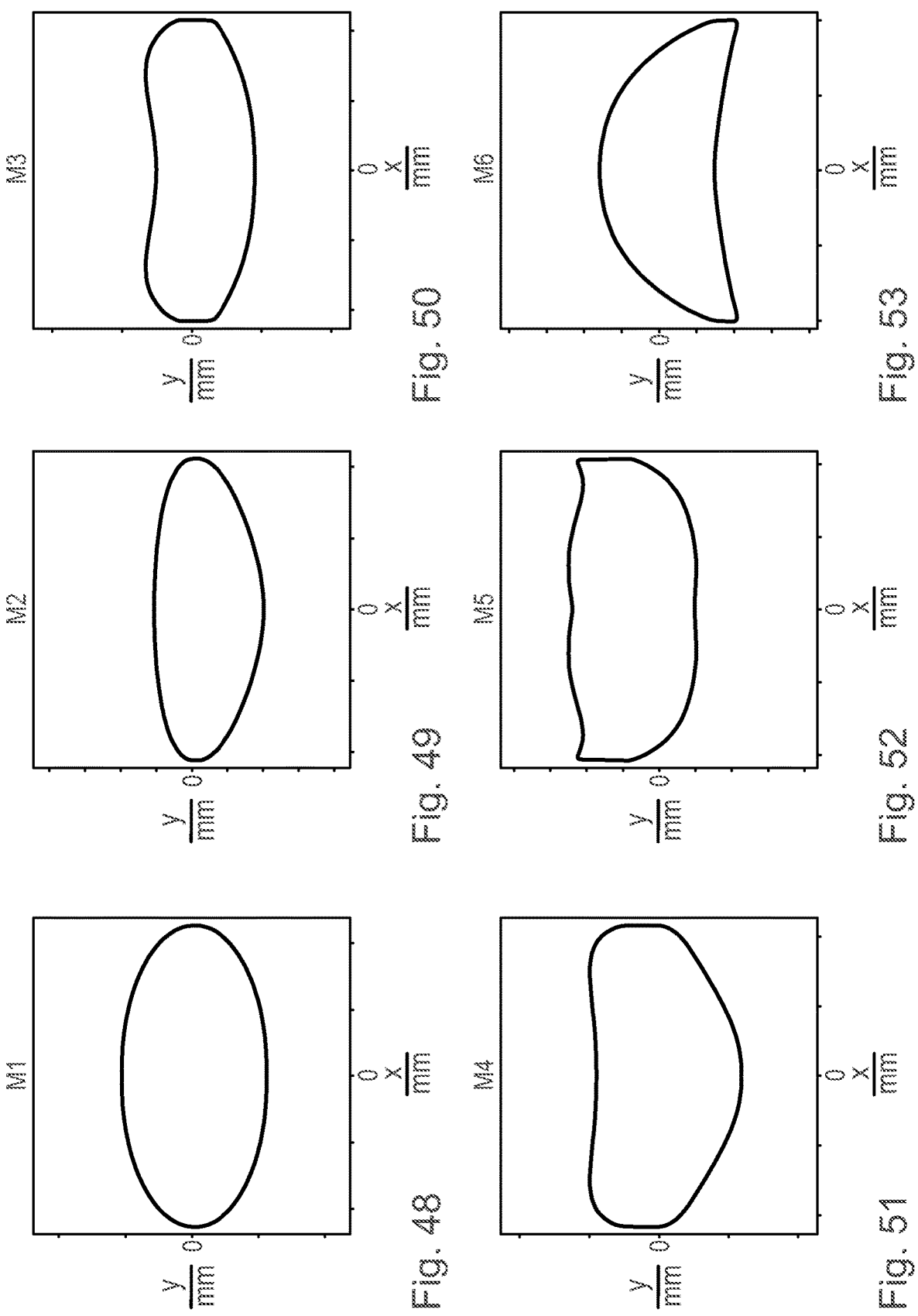

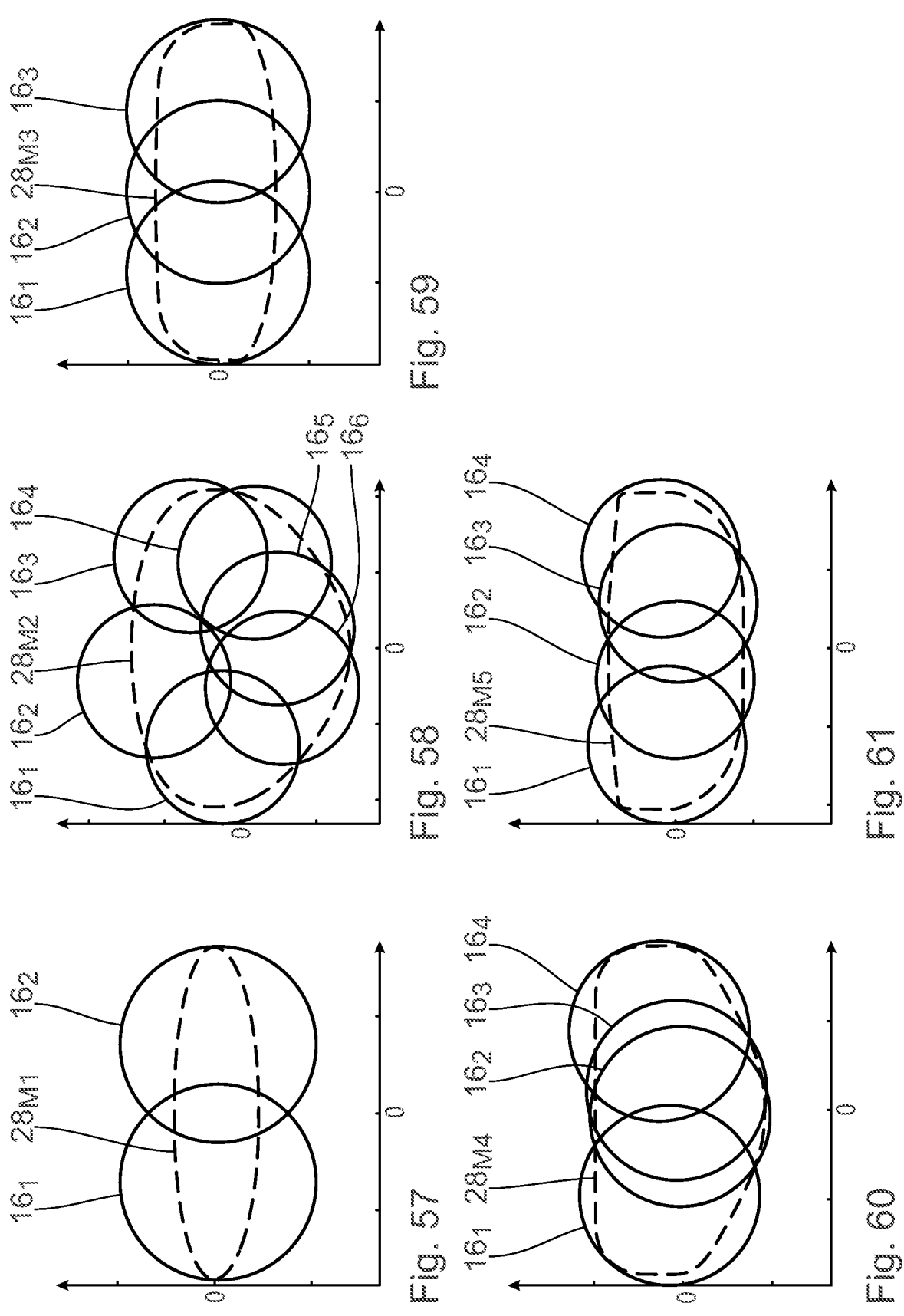

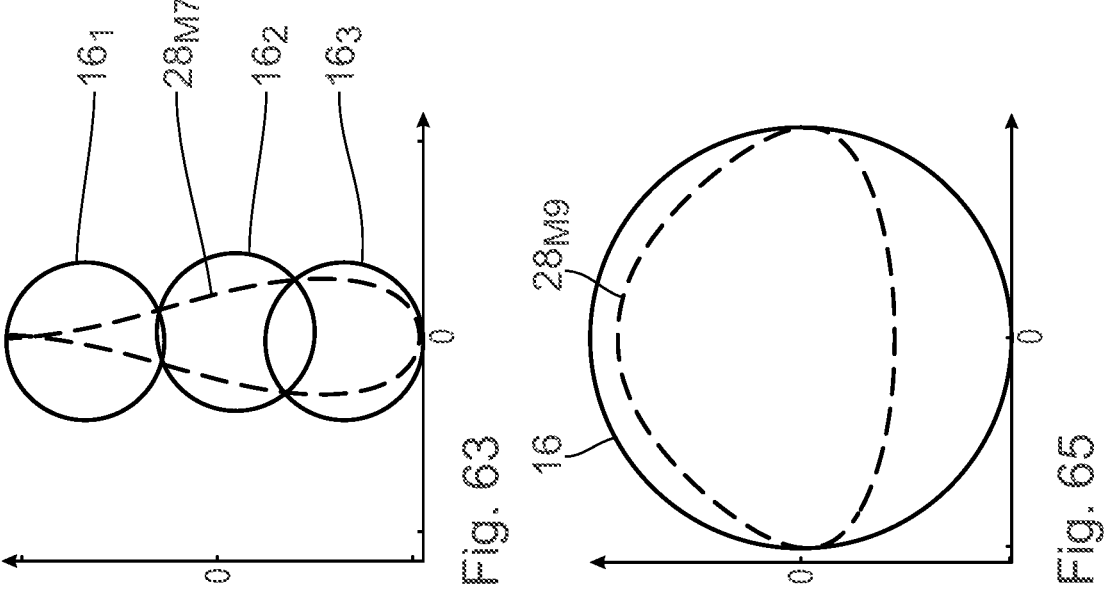
Fig. 63
Fig. 65
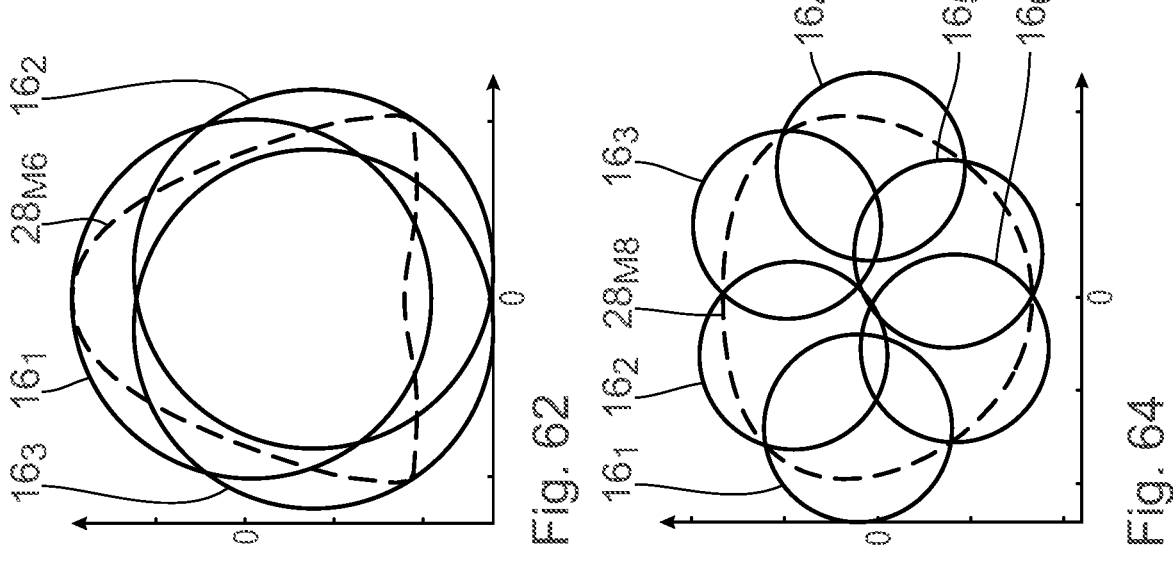
Fig. 62
Fig. 64

IMAGING OPTICAL UNIT

CROSS-REFERENCE TO RELATED APPLICATIONS

The present application is a continuation of, and claims benefit under 35 USC 120 to, international application PCT/EP2022/0652256, filed Jun. 3, 2022, which claims benefit under 35 USC 119 of German Application No 10 2021 205 775.6, filed Jun. 8, 2021. The entire disclosure of each these applications is incorporated by reference herein.

FIELD

The patent application relates to an imaging optical unit comprising a plurality of mirrors for imaging an object field into an image field, the mirrors of the imaging optical unit being able to be measured via a testing optical unit. Further, the disclosure relates to an optical system comprising such an imaging optical unit, an illumination system comprising such an optical system, a projection exposure apparatus comprising such an illumination system, a method for producing a microstructured or nanostructured component, and a microstructured or nanostructured component produced by any such method.

BACKGROUND

An imaging optical unit is known from, for example, DE 10 2019 219 209 A1.

SUMMARY

The testing optical unit used within the scope of mirror measurements uses diffractive optical elements which, for production reasons, can only be produced up to a given maximum diameter.

The present disclosure seeks to develop an imaging optical unit of the type set forth at the outset such that a testing-optical measurement remains manageable even in the case of a design with an image-side numerical aperture which is relatively large.

According to the disclosure, an imaging optical unit comprises a plurality of mirrors for imaging an object field into an image field. The unit has an image-side numerical aperture greater than 0.55. Each mirror is configured in such a way that it can be measured by a testing optical unit having at least one diffractive optical unit (DOE) with a predetermined maximum diameter for test wavefront generation. The unit is configured in such a way that, for the complete measurement of all reflection surfaces of the mirrors. A maximum number of DOEs of the testing optical unit and/or a maximum number of DOE test positions of the at least one DOE of the testing optical unit is used, which is no more than five times the number of mirrors in the imaging optical unit.

The disclosure has recognized that, as a further design criterion, a number of DOEs and/or a number of the DOE test positions in the testing optical unit is taken into account as a design degree of freedom. In this case, an optimization parameter is an overall number of DOEs and/or DOE test positions, which is used for the complete measurement of all reflection surfaces of the mirrors of the imaging optical unit. To the extent that a plurality of DOEs are used and at least one DOE is used in a plurality of DOE test positions, this overall number is the number of all these DOE test positions plus the number of DOEs which are used in exactly one DOE test position.

By way of example, this overall number is ten if ten DOEs are used in exactly one test position. If eight DOEs are used in exactly one test position and two DOEs are each used in three test positions, this overall number is for example eight plus three plus three=14.

This overall number can be minimized such that the maximum number of DOEs and/or DOE test positions is no more than five times the number the mirrors of the imaging optical unit. Consequently, a maximum of 40 DOEs or a maximum of 40 DOE test positions in the testing optical unit are used to measure the reflection surfaces of all mirrors in the case of an imaging optical unit comprising eight mirrors.

This maximum number of DOEs or DOE test positions may be no more than four times, no more than 3.5-times or even no more than three times the number of mirrors in the imaging optical unit.

An object or a portion thereof with structures to be imaged can be arranged in the object field. A substrate which the object structures are imaged or a substrate portion can be arranged in the image field.

In some embodiments, the mirrors are designed for testing with a testing optical unit, the at least one DOE of which having a maximum diameter of less than 500 mm. Such a mirror design can avoid a DOE diameter that is too large, rendering the production of the testing DOE manageable. The maximum DOE diameter may be less than 450 mm and may be of the order of 400 mm.

In some embodiments, the imaging optical unit is an anamorphic optical unit. This can be particularly desirable. A corresponding anamorphic optical unit is known from U.S. Pat. No. 9,366,968.

In some embodiments, the imaging optical unit has a wavefront aberration of no more than 20 m$\lambda$. An imaging optical unit according to claim 4 provides for high-quality structure imaging In some embodiments, the imaging optical unit has a total of at least eight mirrors. This can facilitate good imaging correction over a given image field size.

In some embodiments, for the complete measurement of exactly one reflection surface of the mirrors of the imaging optical unit, a maximum number of DOEs of the testing optical unit and/or a maximum number of DOE test positions of the at least one DOE of the testing optical unit is used, which is no more than 7. Such embodiments can avoid having the absolute number of DOEs or the absolute number of DOE test positions in the testing optical unit becoming too large, in order to avoid issues in the transition regions between test surfaces measured by mutually adjacent DOEs or DOE test positions. This maximum number of DOEs/ DOE test positions per mirror may be no more than six.

In some embodiments, the imaging optical unit has at least four grazing incidence (GI) mirrors and/or at least three normal incidence (NI) mirrors. Such embodiments have proven their worth in practice. There can be more than four GI mirrors, these may total six or eight for example. There can be more than three NI mirrors, these may total four for example.

In some embodiments, an optical system comprises an imaging optical unit according to the disclosure, an illumination system comprising such an optical system, a projection exposure apparatus comprising such an illumination system, a method for producing a microstructured or nanostructured component, or a microstructured or nanostructured component produced by any such method. Features of such technology correspond to those discussed above with reference to the imaging optical unit according to the disclosure.

For example, a semiconductor component, for example a memory chip, can be produced.

BRIEF DESCRIPTION OF THE DRAWINGS

Exemplary embodiments of the disclosure are explained in greater detail below with reference to the drawing, in which:

FIGS. 8 to 15 each show plan views of edge contours of used reflection surfaces of the mirrors of the imaging optical unit according to FIG. 7;

FIGS. 16 to 23 show, in illustrations similar to FIGS. 5 to 6A, beam path cross sections of optimized arrangement planes of the diffractive optical elements of the surface profile measuring device according to FIG. 2, each with a number-optimized coverage by the diffractive optical elements with the given diameter for measuring the mirrors of the imaging optical unit according to FIG. 7;

FIGS. 48 to 56 each show plan views of edge contours of used reflection surfaces of the mirrors of the imaging optical unit according to FIG. 47; and FIGS. 57 to 65 show, in illustrations similar to FIGS. 5 to 6A, beam path cross sections of optimized arrangement planes of the diffractive optical elements of the surface profile measuring device according to FIG. 2, each with a number-optimized coverage by the diffractive optical elements with the given diameter for measuring the mirrors of the imaging optical unit according to FIG. 47.

DETAILED DESCRIPTION

Figure 1:
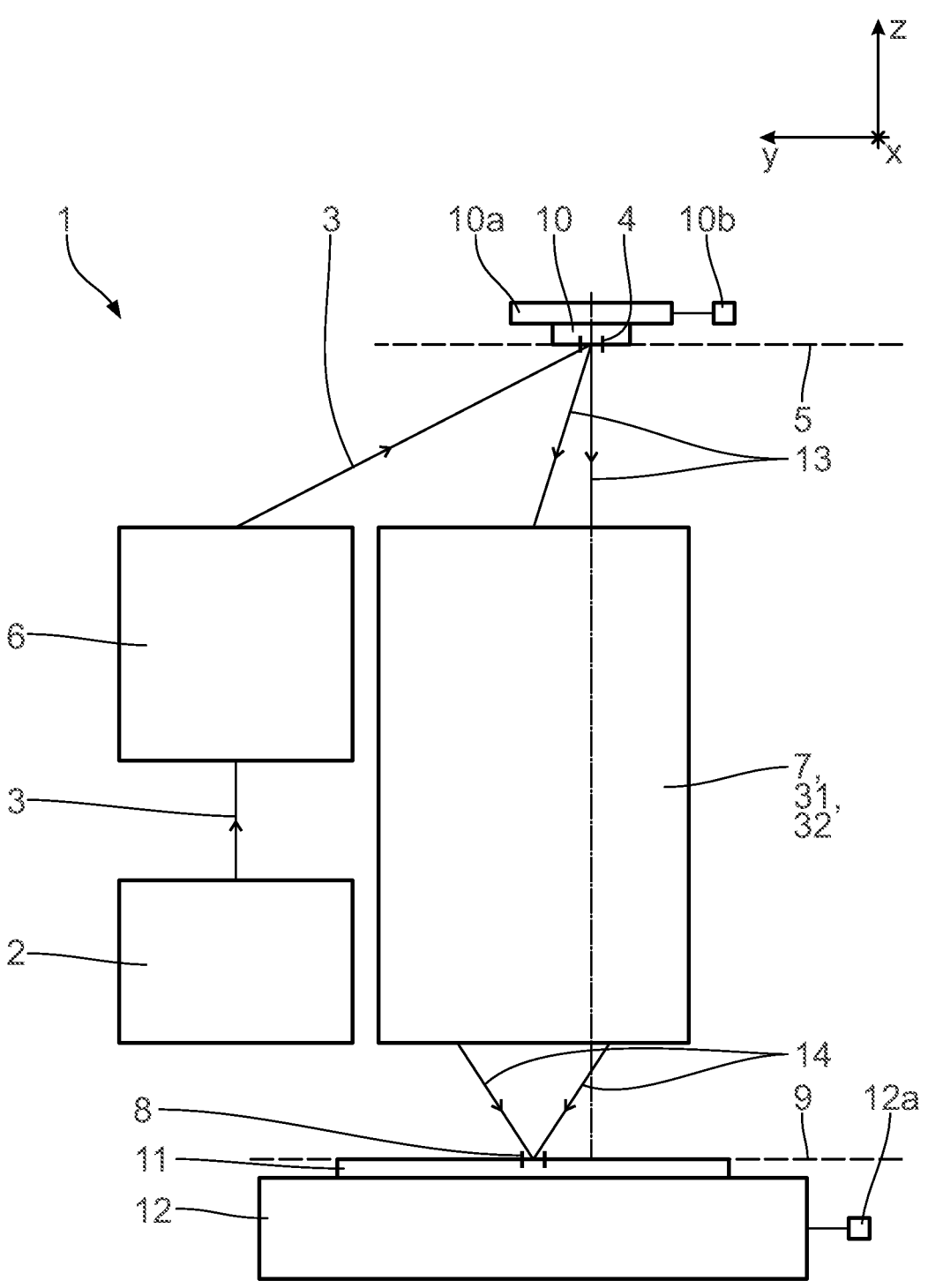
FIG. 1 schematically shows a projection exposure apparatus for EUV microlithography.

A microlithographic projection exposure apparatus 1 comprises a light source 2 for illumination light or imaging light 3. The light source 2 is an EUV light source, which produces light in a wavelength range of, for example, between 5 nm and 30 nm, such as between 5 nm and 15 nm. For example, the light source 2 can be a light source with a wavelength of 13.5 nm or a light source with a wavelength of 6.9 nm. Other EUV wavelengths are also possible. In general, the illumination light 3 guided in the projection exposure apparatus 1 could even have any desired wavelength, for example visible wavelengths or else other wavelengths which may find use in microlithography (e.g. DUV, deep ultraviolet) and for which suitable laser light sources and/or LED light sources are available (e.g. 365 nm, 248 nm, 193 nm, 157 nm, 129 nm, 109 nm). A beam path of the illumination light 3 is depicted very schematically in FIG. 1.

An illumination optical unit 6 is used to guide the illumination light 3 from the light source 2 to an object field 4 in an object plane 5. Using a projection optical unit or imaging optical unit 7, the object field 4 is imaged into an image field 8 in an image plane 9 with a given, possibly anamorphic reduction scale.

In order to facilitate the description of the projection exposure apparatus 1 and the various embodiments of the projection optical unit 7, a Cartesian xyz-coordinate system is indicated in the drawing, from which system the respective positional relationship of the components illustrated in the figures is evident. In FIG. 1, the x-direction runs perpendicular to the plane of the drawing into the latter. The y-direction runs towards the left, and the z-direction runs upward.

The object field 4 and the image field 8 are rectangular. Alternatively, it is also possible for the object field 4 and the image field 8 to have a bent or curved embodiment, that is to say, such as, a partial ring shape. The object field 4 and the image field 8 have an x/y-aspect ratio of greater than 1. Therefore, the object field 4 has a longer object field dimension in the x-direction and a shorter object field dimension in the y-direction. These object field dimensions extend along the field coordinates x and y.

One of the exemplary embodiments depicted in FIGS. 7, 24 and 47, which will still be explained in more detail below, can be used for the projection optical unit 7.

Figure 7:
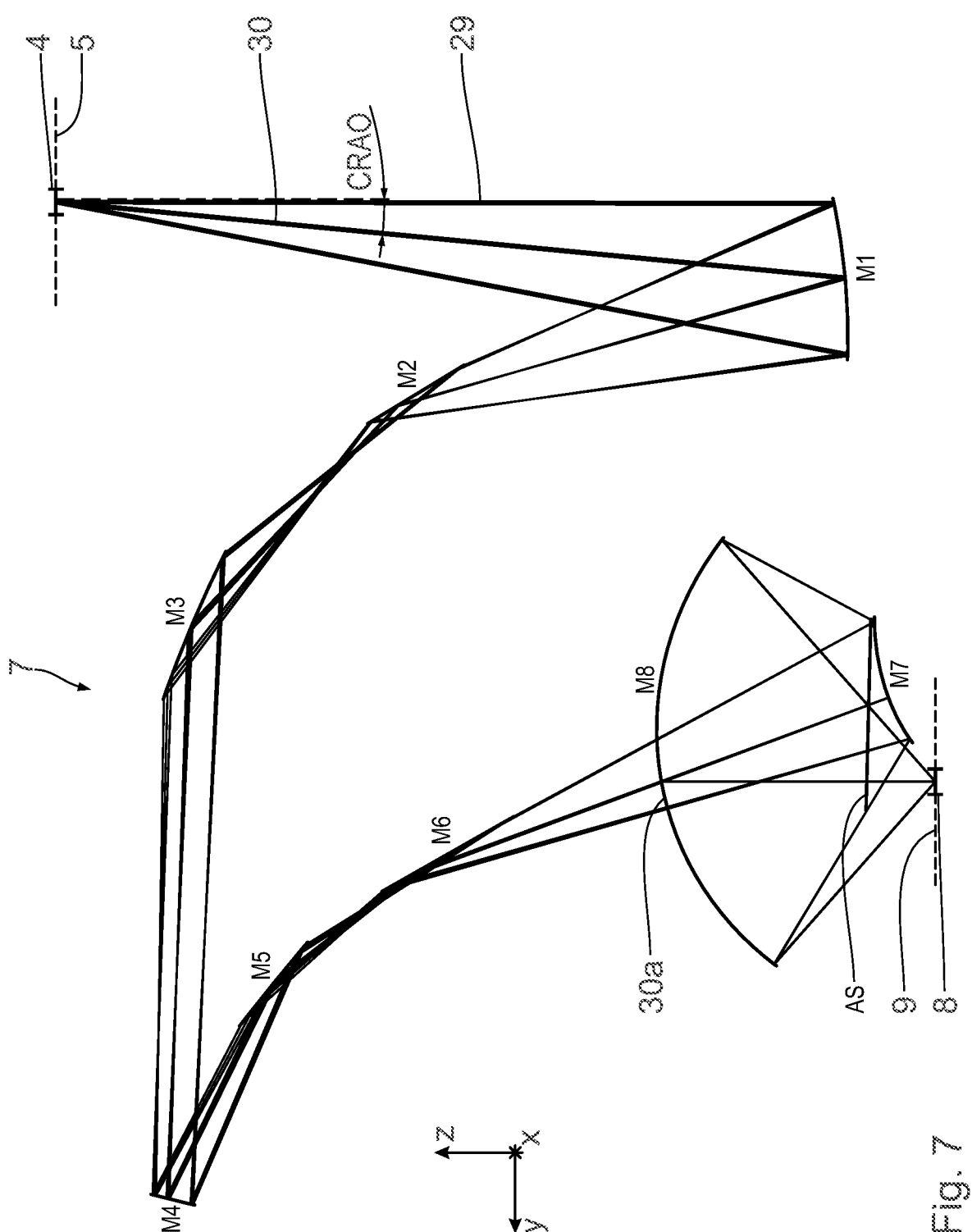
FIG. 7 shows, in a meridional section, an embodiment of an imaging optical unit which can be used as a projection lens in the projection exposure apparatus according to FIG. 1, wherein an imaging beam path for chief rays and for an upper coma ray and a lower coma ray of three selected field points is depicted.
Figures 8, 9:
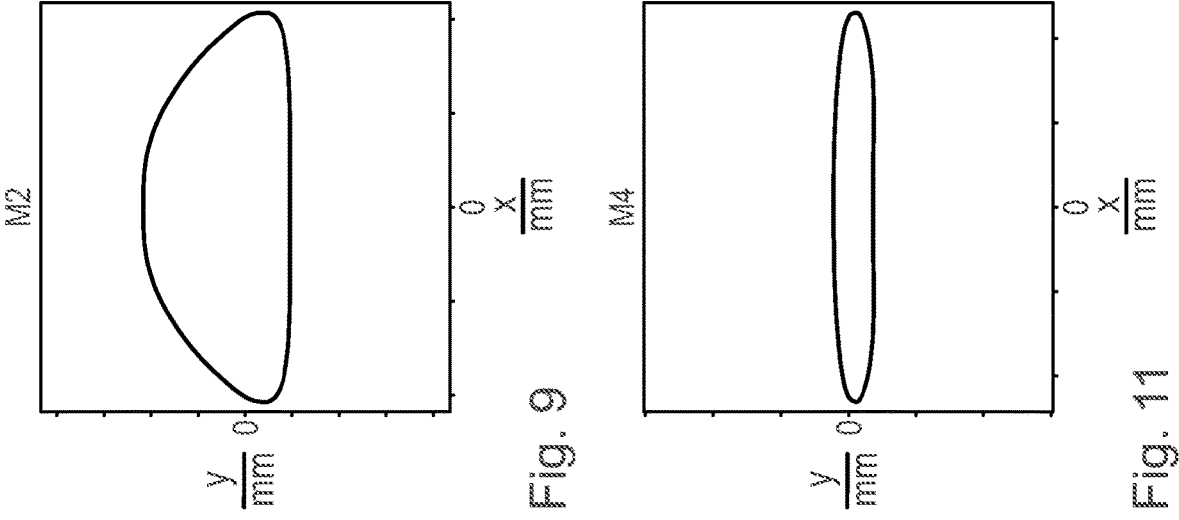
Figures 10, 11:
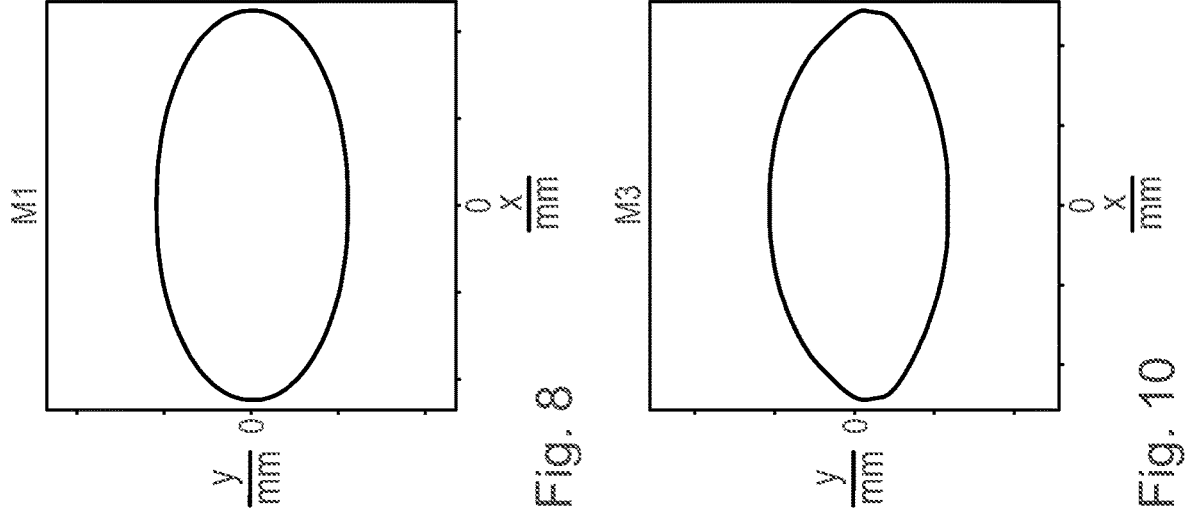
Figures 20, 21, 22, 23:
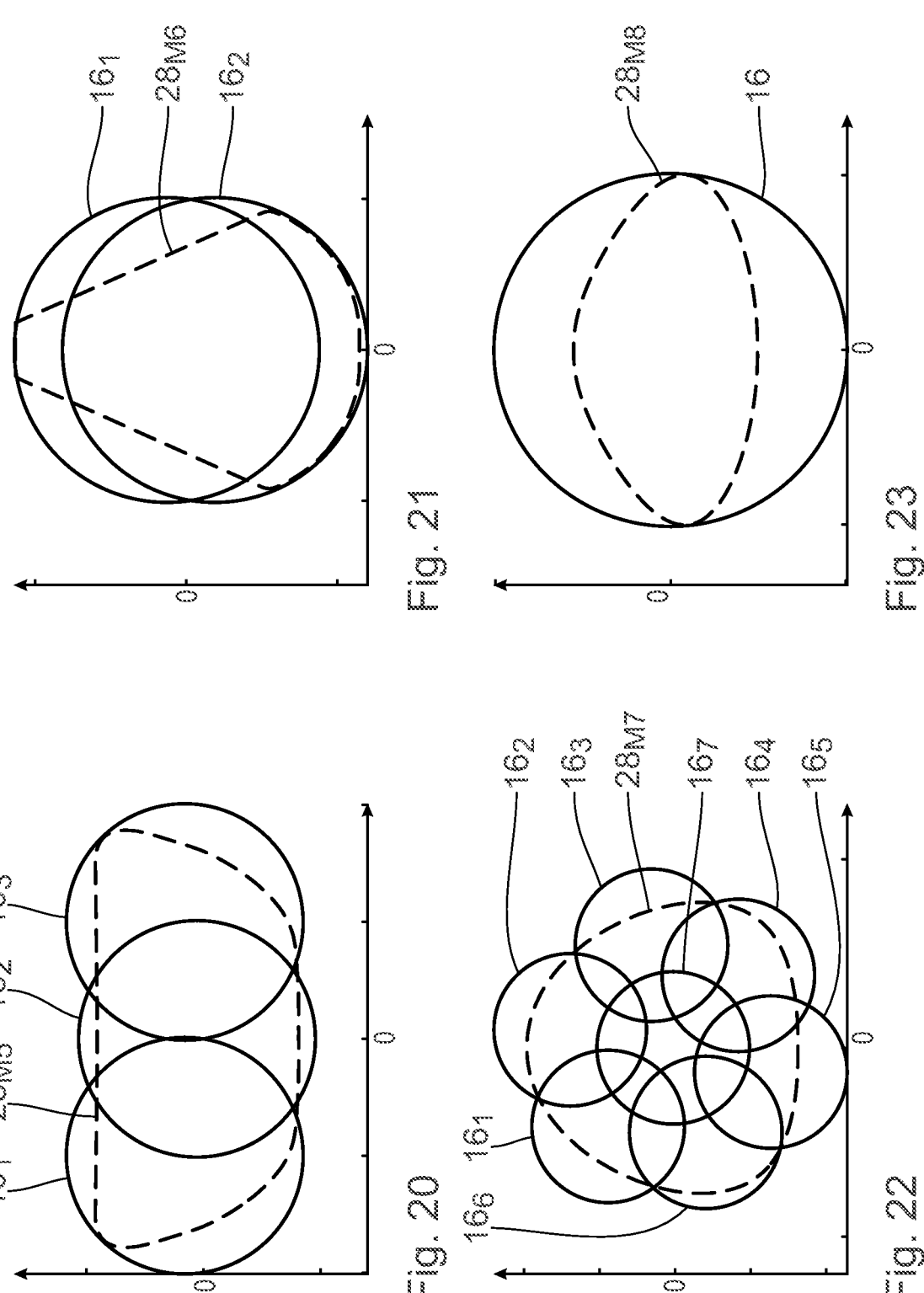

The projection optical unit 7 according to FIG. 7 has an anamorphic embodiment. In the yz-plane, i.e. in the meridional plane of the section according to FIG. 2, the projection optical unit 7 has a reduction scale $|\beta_y|$ of 8. Thus, in the meridional plane yz, the object field 4 is imaged onto the image field 8 with a reduction by a factor of 8. A reduction scale $|\beta_x|$ of the projection optical unit 7 is 4 in the sagittal plane xz, which is perpendicular to the meridional plane. In this xz-plane, the object field 4 is thus imaged with a reduction by a factor of 4 into the image field 8 between the object plane 5 and the image plane 9. Other integer or non-integer absolute reduction scales $\beta_x$, $\beta_y$ are also possible, as will be explained below on the basis of the further exemplary embodiments.

The image field 8 has an x-extent of e.g. 26 mm and a y-extent of e.g. 2 mm.

In the embodiments of the projection optical unit 7 according to FIG. 7 et seq., the image plane 9 is arranged parallel to the object plane 5. What is imaged in this case is a portion of a reflection mask 10, also referred to as reticle, coinciding with the object field 4. The reticle 10 is carried by a reticle holder 10a. The reticle holder 10a is displaced by a reticle displacement drive 10b.

The imaging by way of the projection optical unit 7 is implemented on the surface of a substrate 11 in the form of a wafer, which is carried by a substrate holder 12. The substrate holder 12 is displaced by a wafer or substrate displacement drive 12a.

FIG. 1 schematically depicts, between the reticle 10 and the projection optical unit 7, a beam 13 of the illumination light 3 that enters into the projection optical unit and, between the projection optical unit 7 and the substrate 11, a beam 14 of the illumination light 3 that emerges from the projection optical unit 7. An image field-side numerical aperture (NA) of the projection optical unit 7 is not reproduced to scale in FIG. 1.

The projection exposure apparatus 1 is of the scanner type. Both the reticle 10 and the substrate 11 are scanned in the y-direction during the operation of the projection exposure apparatus 1. A stepper type of the projection exposure apparatus 1, in which a stepwise displacement of the reticle 10 and of the substrate 11 in the y-direction is effected between individual exposures of the substrate 11, is also possible. These displacements are effected synchronously with one another by an appropriate actuation of the displacement drives 10b and 12a.

Figure 2:
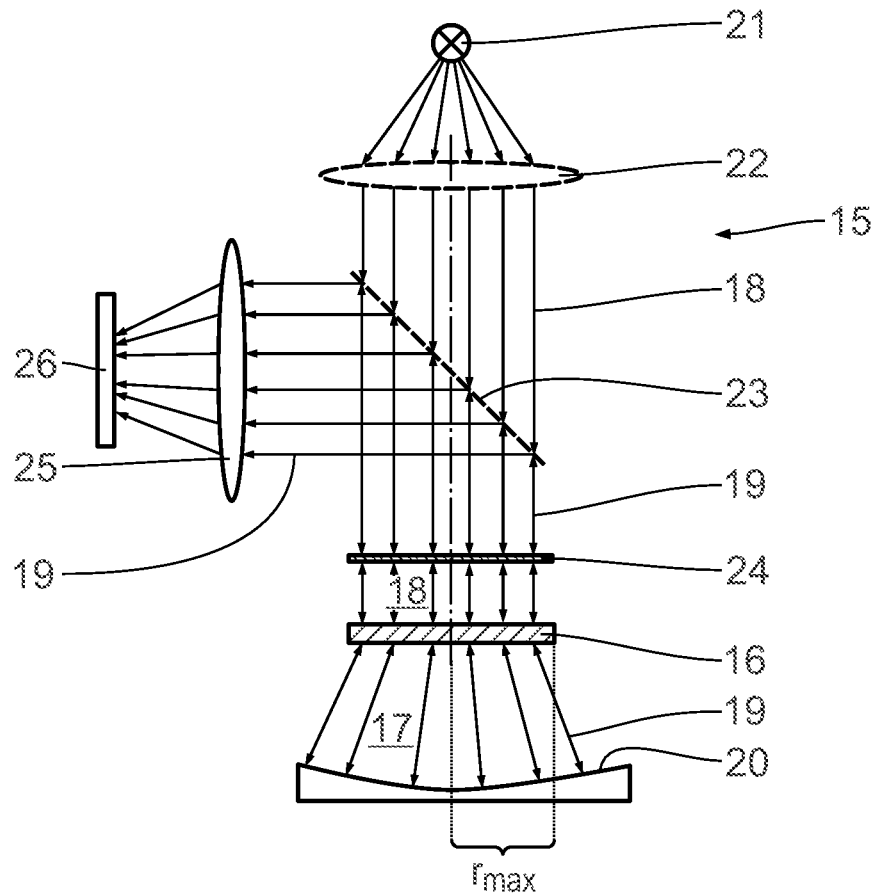
FIG. 2 schematically shows a beam path within a surface profile measuring device for measuring an optical surface, to be tested, of an optical component of the projection exposure apparatus according to FIG. 1 using at least one diffractive optical element.

FIG. 2 schematically shows a test beam path of a surface profile measuring device 15, inter alia in the region of a diffractive optical element (DOE) 16 which is used to produce a test wavefront 17 from an incident plane wavefront 18. In this case, the test wavefront of the test light 19 is designed such that the test light 19 is incident with perpendicular incidence at each point of an optical surface 20 to be tested, provided the latter corresponds to a target surface profile. The optical surface 20 to be tested can be an optical surface of one of the optical components in the projection exposure apparatus 1 and, for example, can be a used reflection surface of one of the mirrors of the projection optical unit 7.

The DOE 16 may be a computer-generated DOE, that is to say the DOE has a complex pattern that was calculated via a computer. Such a DOE 16 may have been manufactured using an electron-beam writer.

Up to a maximum diameter, the DOE 16 can be manufactured with reasonable outlay. Half of this maximum diameter, that is to say the maximum radius Imax, is elucidated in FIG. 2.

The surface profile measuring device 15 is also referred to hereinafter as testing optical unit. The surface profile measuring device 15 is constructed in the style of a Fizeau interferometer. Test light produced by a light source 21 is initially converted into a plane wavefront 18, that is to say a beam of individual rays running in parallel, with the aid of a condenser optical unit 22. The plane wavefront 18 initially passes through a beam splitter 23 and subsequently strikes a reference plate 24. Test light 19 that is retroreflected by a plane optical surface of this reference plane 24 is used as a light component for the surface profile measurement of the optical surface 20 to be tested. This reference test light component is guided by the beam splitter 23 to a further condenser optical unit 25 and to a camera 26. Test light 19 that passes through the reference plate 24 enters the DOE 16 still in the form of a plane wavefront 18. The test wavefront 17 is produced by the DOE 16. Following retroreflection of the test wavefront 17 at the optical surface 20 to be tested, the test light once again passes through the DOE 16 and the reference plate 24, with the component of this test light 19 that was reflected by the optical surface 20 to be tested and subsequently reflected by the beam splitter 23 interfering with the measurement component of the test light 19 retroreflected at the reference plate 24. The interference pattern between, firstly, the reference plate test light component and, secondly, the surface profile test light component is recorded by the camera 26 and represents a measure for the quality of a compliance with a given target surface profile by the measured actual surface profile of the optical surface 20 to be tested.

A surface profile measuring device of the style of FIG. 2 is known from DE 10 2019 219 209 A1.

Figure 3:
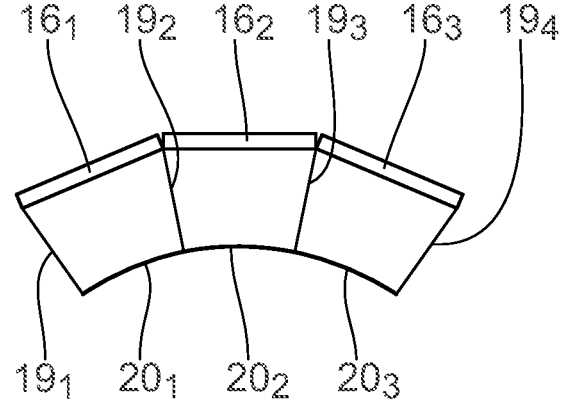
FIG. 3 shows, in an illustration similar to FIG. 2, an arrangement of three diffractive optical elements of the surface profile measuring device according to FIG. 2 for measuring respective portions of an optical surface, to be tested, of an optical component in the projection exposure apparatus according to FIG. 1.
Figure 6:
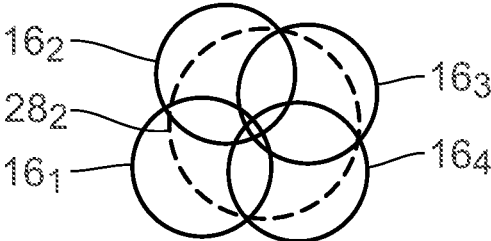

FIG. 3 shows, in a representation corresponding to FIG. 6 of DE 10 2019 219 209 A1 in particular, an arrangement of a plurality of DOEs $16_1$, $16_2$, $16_3$ which are used at the location of the DOE 16 of the surface profile measuring device according to FIG. 2 for the purposes of each measuring a portion $20_1$, $20_2$, $20_3$ of the optical surface 20 to be tested. By way of example, in the case of a sequential use at the location of the DOE 16 of the surface profile measuring device 15, the DOEs $16_1$ to $16_3$ produce an illumination which covers the entire optical surface 20 to be tested and which at all locations is perpendicular to this optical surface 20 to be tested.

When the optical surface 20 to be tested is designed according to FIG. 3, three DOEs $16_1$ to $16_3$ are used for measuring the surface profile of the entire optical surface 20. The minimum number of DOEs $16_i$ used to measure the entire surface 20 depends on a maximum given size of the DOEs $16_i$, for example a given maximum diameter, on the size and design of the optical surface 20 to be tested and on an arrangement plane of the DOEs $16_i$ in the beam path of the test light $19_i$.

The imaging optical unit 7 and also the imaging optical units according to FIGS. 24 and 27 yet to be described below comprise mirrors whose optical surfaces to be tested each meet the precondition that, for the complete measurement of all reflection surfaces of the mirrors $M_i$ of these imaging optical units using DOEs $16_i$ with given maximum diameters, a maximum number of DOEs $16_i$ of the surface profile measuring device 15 and/or a maximum number of DOE test positions $16_i$ of at least one DOE 16, usable in a plurality of test positions, of the surface profile measuring device 15 is used, which is no more than five times the number of the mirrors $M_i$ of the imaging optical unit.

Figure 4:
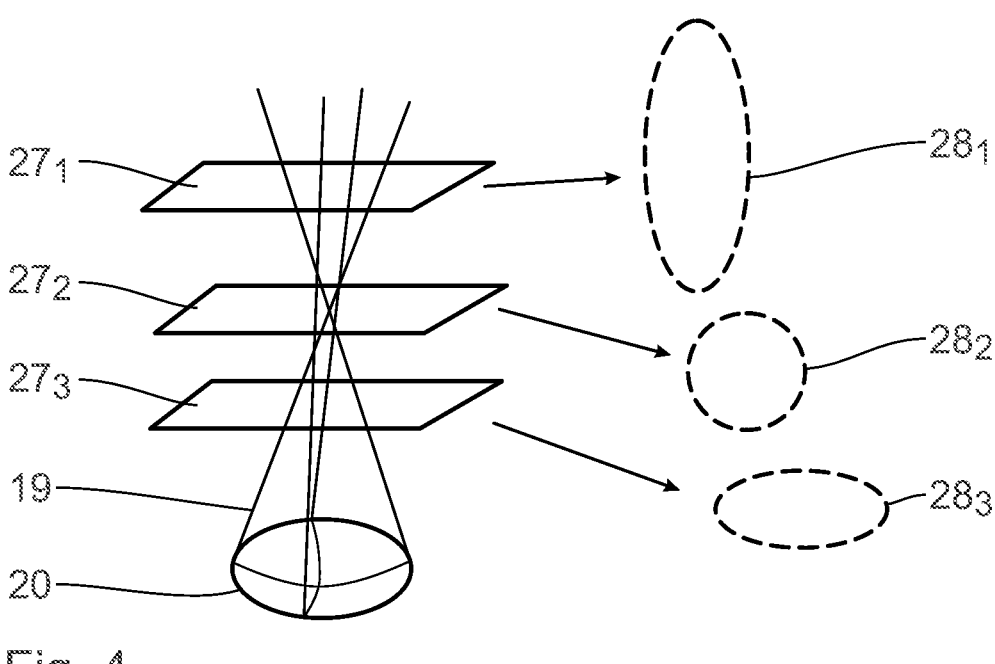
FIG. 4 shows a schematic perspective representation of a measurement beam path of the surface profile measuring device with different possible arrangement planes for the at least one diffractive optical element for determining an arrangement plane in which a smallest number of diffractive optical elements (DOEs) with a given diameter and/or a smallest number of test positions of this DOE for measuring the entire optical surface can be achieved.

FIG. 4 shows four representative individual rays of the test light 19 of a test light beam path within the surface profile measuring device 15 for the optical surface 20 to be tested, and three exemplary arrangement planes $27_1$, $27_2$, $27_3$ for the DOE 16 of the surface profile measuring device 15. The right-hand side of FIG. 4 shows respective edge contours $28_1$, $28_2$, $28_3$ of this test light beam path at the location of the arrangement planes $27_1$, $27_2$, $27_3$.

Due to the precondition that, for as long as the optical surface 20 to be tested corresponds to a target surface profile, the test light 19 is incident with perpendicular incidence at each point on the optical surface to be tested, the test light beam path is exactly defined for all individual rays of the test light 19, and so the edge contours $28_i$ at the location of the respective arrangement plane $27_i$ are as well.

Figure 5:
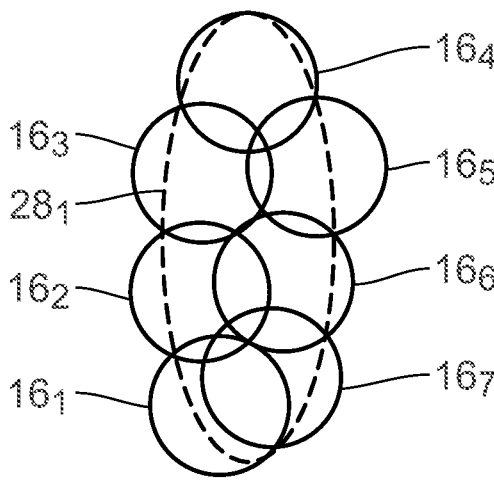
FIGS. 5, 6 and 6A show coverages of an overall beam cross section, given by an edge contour, of the beam path in the respective possible arrangement planes according to FIG. 4 with the diffractive optical elements with given diameters, for determining the number of diffractive optical elements to be used.
Figure 6A:
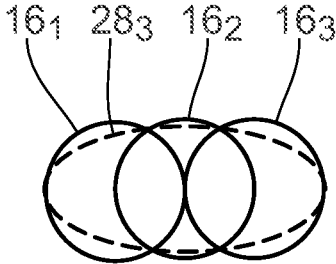

FIGS. 5, 6 and 6A show possible coverages of the edge contours $28_1$, $28_2$ and $28_3$ with DOEs $16_i$ that each have a given maximum diameter, which for example may range between 300 mm and 500 mm, such as between 350 mm and 450 mm, for example on the order of 400 mm.

A total of seven DOEs $16_1$ to $16_7$ are used for complete coverage of the edge contour $28_1$ of the test light beam path (cf. FIG. 5). A total of four DOEs $16_1$ to $16_4$ are used for complete coverage of the edge contour $28_2$ (cf. FIG. 6). A total of three DOEs $16_1$ to $16_3$ are used for complete coverage of the edge contour $28_3$ (cf. FIG. 6A)

Thus, for measuring the optical surface 20 according to FIG. 4, the arrangement of the DOEs $16_i$ in the arrangement plane $27_3$ yields the minimum number of DOEs $16_i$ (i=1 to 3) used for complete measurement of the entire reflection surface of the optical surface 20 to be tested.

These DOEs $16_1$ to $16_3$ may have different embodiments depending on the design of the optical surface 20 to be tested, or it may also be possible to use at least one of the DOEs $16_1$ to $16_3$ at two test positions or else also, for example, to use the DOE $16_1$ at all three test positions.

Thus, in the case of an optimized arrangement of the DOEs $16i$, the optical surface 20, to be tested, according to FIG. 4 uses exactly three DOE test positions, which as a rule corresponds to exactly three used DOEs $16_1$. Thus, the number of DOEs $16_1$ of the testing optical unit and/or the number of DOE test positions of the at least one DOE $16_i$ of the testing optical unit 15 used for the complete measurement of the optical surface 20, to be tested, is three in this optimized arrangement of the DOEs $16_1$.

FIG. 7 shows the optical design of a first embodiment of the projection optical unit 7. FIG. 7 depicts the beam path of, in each case, three individual rays 29 emanating from three object field points which are spaced apart from one another in the y-direction in FIG. 7. What is depicted are chief rays 30, i.e. individual rays 29 which pass through the centre of a pupil in a pupil plane of the projection optical unit 7, and, in each case, an upper coma ray and a lower coma ray, i.e. rays that pass through the upper and lower edge of the pupil, respectively, of these two object field points. Proceeding from the object field 4, the chief rays 30 include an angle CRAO of 5.05° with a normal on the object plane 5.

The projection optical unit 7 has an image-side numerical aperture of 0.75.

The projection optical unit 7 according to FIG. 7 has a total of eight mirrors, which, proceeding from the object field 4, are numbered M1 to M8 in the sequence of the beam path of the individual rays 29. The imaging optical unit 7 can also have a different number of mirrors, for example four mirrors, six mirrors, nine mirrors, ten mirrors, eleven mirrors or even more mirrors.

FIG. 7 depicts the calculated reflection surfaces of the mirrors M1 to M8. Optionally only a portion of these calculated reflection surfaces is used. Only this actually used region of the reflection surfaces is actually present in the real mirrors M1 to M8. These used reflection surfaces are carried by mirror bodies in a manner known per se.

In the projection optical unit 7 according to FIG. 7, the mirrors M1, M4, M7 and M8 are configured as mirrors for normal incidence (NI mirrors), that is to say as mirrors onto which the imaging light 3 impinges with an angle of incidence that is smaller than 45°. Thus, overall, the projection optical unit 7 according to FIG. 7 has four mirrors M1, M4, M7 and M8 for normal incidence.

The mirrors M2, M3, M5 and M6 are mirrors for grazing incidence of the illumination light 3 (GI mirrors), that is to say mirrors onto which the illumination light 3 impinges with angles of incidence that are greater than 60°. A typical angle of incidence of the individual rays 29 of the imaging light 3 on the mirrors M2, M3, M5 and M6 for grazing incidence lies in the region of 80°. Overall, the projection optical unit 7 according to FIG. 7 has exactly four mirrors M2, M3, M5 and M6 for grazing incidence.

The mirrors M2, M3 on the one hand and M5, M6 on the other hand are designed as pairs of successive mirrors and reflect the imaging light 3 in such a way that the angles of reflection of the individual rays 29 at the respective mirrors of the pairs M2, M3 on the one hand and M5, M6 and the other hand summate, that is to say amplify in terms of the deflection effect.

The mirrors M1 to M8 carry a coating optimizing the reflectivity of the mirrors M1 to M8 for the imaging light 3. This can be a ruthenium coating, a molybdenum coating or a molybdenum coating with an uppermost layer of ruthenium. In the mirrors M2, M3, M5 and M6 for grazing incidence, use can be made of a coating with e.g. one ply of molybdenum or ruthenium. These highly reflecting layers, for example, of the mirrors M1, M4, M7 and M8 for normal incidence, can be configured as multi-ply layers, wherein successive layers can be manufactured from different materials. Alternating material layers can also be used. A typical multi-ply layer can have fifty bilayers, respectively made of a layer of molybdenum and a layer of silicon. A multi-ply layer may be provided with an additional capping layer, for example made of ruthenium.

For the purposes of calculating an overall reflectivity of the projection optical unit 7, a system transmission can be calculated as follows: A mirror reflectivity is determined at each mirror surface on the basis of the angle of incidence of a guide ray, i.e. a chief ray of a central object field point, and combined by multiplication to form the system transmission.

Further information concerning the system transmission can be found in US 2016/0085061 A1.

Further information concerning reflection at a GI mirror (grazing incidence mirror) can be found in WO 2012/126867 A. Further information concerning the reflectivity of NI mirrors (normal incidence mirrors) can be found in DE 101 55 711 A.

The mirror M8, that is to say the ultimate mirror upstream of the image field 8 in the imaging beam path, has a passage opening 30a for the passage of the imaging light 3 which is reflected from the antepenultimate mirror M6 toward the penultimate mirror M7. The mirror M8 is used in a reflective manner around the passage opening 30a. All other mirrors M1 to M7 do not have a passage opening and are used in a reflective manner in a region connected in a gap-free manner.

A stop AS is disposed in the imaging beam path between the mirrors M6 and M7, the stop having both the function of an aperture stop and the function of an obscuration stop. Thus, the stop AS firstly specifies the image-side numerical aperture of the projection optical unit 7 and secondly specifies the size of an inner pupil obscuration. The stop AS can be designed as a split stop, as known e.g. from U.S. Pat. No. 10,527,832.

The projection optical unit 7 is approximately telecentric on the object side. If the imaging beam path is only taken into account in relation to the individual rays that pass through the object field 4, the entrance pupil is located 4049.31 mm downstream of the object field 4 in the xz-plane and 41810.58 mm upstream of the object field 4 in the yz-plane.

In the projection optical unit 7, a pupil plane is present in the beam path of the imaging light 3 between the mirrors M1 and M2. A first intermediate image plane is present in the beam path between the mirrors M2 and M3. A further intermediate image plane is present in the beam path between the mirrors M5 and M6. There is no intermediate image plane in the region of the passage opening 30a in the case of the projection optical unit 7. The number of inter-mediate image planes differs from the number of interme-diate images in the meridional plane according to FIG. 7 from the number of intermediate images in a plane perpen-dicular thereto. Such projection optical units with different numbers of intermediate images in mutually perpendicular planes are known from WO 2016/166080 A1 and DE 10 2015 226 531 A1 as a matter of principle.

The stop AS is located in the beam path between the mirrors M7 and M8, in the region of a further pupil plane of the projection optical unit 7.

The mirrors M1 to M8 are embodied as free-form surfaces which cannot be described by a rotationally symmetric function. Other embodiments of the projection optical unit 7, in which at least one of the mirrors M1 to M8 is embodied as a rotationally symmetric asphere, are also possible. It is also possible for all mirrors M1 to M8 to be embodied as such aspheres.

A free-form surface can be described by the following free-form surface equation (Equation 1):

$$Z = \frac{c_x x^2 + c_y y^2}{1 + \sqrt{1 - (1 + k_x)(c_x x)^2 - (1 + k_y)(c_y y)^2}} + C_1 x + C_2 y + C_3 x^2 + \quad (1)$$
$$C_4 xy + C_5 y^2 + C_6 x^3 + \ldots + C_9 y^3 + C_{10} x^4 + \ldots + C_{12} x^2 y^2 + \ldots + $$
$$C_{14} y^4 + C_{15} x^5 + \ldots + C_{20} y^5 + C_{21} x^6 + \ldots + C_{24} x^3 y^3 + \ldots + C_{27} y^6 + \ldots$$

The following applies to the parameters of this Equation (1):

Z is the sagittal height of the free-form surface at the point x, y, where $x^2 + y^2 = r^2$. Here, r is the distance from the reference axis of the free-form surface equation (x=0; y=0).

In the free-form surface Equation (1), $C_1$, $C_2$, $C_3$ . . . denote the coefficients of the free-form surface series expan-sion in powers of x and y.

In the case of a conical base area, $c_x$, $c_y$ is a constant corresponding to the vertex curvature of a corresponding asphere. Thus, $c_x = 1/R_x$ and $c_y = 1/R_y$ applies. $k_x$ and $k_y$ each correspond to a conical constant of a corresponding asphere. Thus, Equation (1) describes a biconical free-form surface.

An alternative possible free-form surface can be produced from a rotationally symmetric reference surface. Such free-form surfaces for reflection surfaces of the mirrors of projection optical units of microlithographic projection exposure apparatuses are known from US 2007-0058269 A1.

Alternatively, free-form surfaces can also be described with the aid of two-dimensional spline surfaces. Examples for this are Bezier curves or non-uniform rational basis splines (NURBS). By way of example, two-dimensional spline surfaces can be described by a grid of points in an xy-plane and associated z-values, or by these points and gradients associated therewith. Depending on the respective type of the spline surface, the complete surface is obtained by interpolation between the grid points using e.g. polyno-mials or functions which have specific properties in respect of the continuity and the differentiability thereof. Examples for this are analytical functions.

The optical design data of the reflection surfaces of the mirrors M1 to M8 (=M01 to M08) of the projection optical unit 7 can be gathered from the following tables.

The first of these tables indicates vertex radii (Radiusx=$R_x$, Radiusy=$R_y$) and refractive power values (Powerx, Powery) for the optical surfaces of the optical components. Negative radii values denote curves that are concave towards the incident illumination light 3 at the intersection of the respective surface with the considered plane (xz, yz) that is spanned by a surface normal at the vertex with the respective direction of curvature (x, y). The two radii Radiusx, Radiusy may explicitly have different signs.

The vertices at each optical surface are defined as points of incidence of a guide ray which travels from an object field centre to the image field 8 along a plane of symmetry x=0, i.e. the plane of the drawing of FIG. 7 (meridional plane).

The refractive powers Powerx ($P_x$), Powery ($P_y$) at the vertices are defined as:

$$P_x = -\frac{2\cos AOI}{R_x}$$

$$P_y = -\frac{2}{R_y \cos AOI}$$

Here, AOI denotes an angle of incidence of the guide ray with respect to the surface normal.

The second table specifies the absolute value along which the respective mirror, proceeding from a reference surface, was decentred ($D_y$) in the y-direction, displaced ($D_z$) in the z-direction and tilted ($\alpha_x$, $\alpha_y$, $\alpha_z$). This corresponds to a parallel shift and a tilting in the case of the free-form surface design method. Here, a displacement is carried out in the y-direction and in the z-direction in mm, and tilting is carried out about the x-axis, about the y-axis and about the z-axis. In this case, the angle of rotation is specified in degrees. Decentring is carried out first, followed by tilting. The reference surface during decentring is in each case the first surface of the specified optical design data. Decentring in the y-direction and in the z-direction is also specified for the object field 4 (reticle). In addition to the values assigned to the individual mirrors M1 to M8, this table also tabulates the object plane (reticle) as a first surface, the image plane (wafer) as an ultimate surface and a stop surface (denoted "stop") as an arrangement plane for an aperture or obscu-ration stop.

The third table (Tables 3a to 3c) specifies the free-from surface coefficients $C_n$, respectively assigned to the polyno-mials $x^k$, $y^l$, for the mirrors M1 to M8. Coefficients $C_n$ not tabulated each have a value of 0.

The fourth table specifies a boundary of the stop AS as a polygonal chain in local coordinates xy. As described above, the stop is still decentred and tilted. In this table, the coordinates are specified in two columns. The first column (consisting of an x-and a y-coordinate) contains the coordinates of the corners 1 to M/2 of the polygon, and the second column contains the coordinates of the corners N/2+1 to N. Each row therefore contains four numbers, specifically $x_i$, $y_i$, $x_{i+N/2}$, $y_{i+N/2}$.

Table 1 for FIG. 7
Radii of the surfaces

|  | Radius$_x$ [mm] | Power$_x$ [1/mm] | Radius$_y$ [mm] | Power$_y$ [1/mm] |
|---|---|---|---|---|
| M01 | −4010.12586920 | 0.00048785 | −1912.32973165 | 0.00102302 |
| M02 | 3032.56293835 | −0.00008312 | 10200.72278759 | −0.00002471 |
| M03 | −17899.44185965 | 0.00004605 | −3054.20330985 | 0.00026989 |
| M04 | −2949.17773323 | 0.00066765 | −3463.52914828 | 0.00056850 |
| M05 | −6424.69311474 | 0.00009275 | −5807.69148834 | 0.00010261 |
| M06 | 353735.31498119 | −0.00000017 | 11075.51069253 | −0.00000551 |
| M07 | 9638.75974818 | −0.00018069 | 591.44323699 | −0.00294470 |
| M08 | −1014.02402632 | 0.00194257 | −862.10705275 | 0.00228488 |

Table 2 for FIG. 7
Decentring (location, angle) the surfaces

|  | D$_x$ [mm] | D$_y$ [mm] | D$_z$ [mm] |
|---|---|---|---|
| Reticle | 0.000000000 | 0.000000000 | 0.000000000 |
| M01 | 0.000000000 | −215.951560067 | 2242.742701369 |
| M02 | 0.000000000 | −579.619168146 | 972.327826712 |
| M03 | 0.000000000 | −1211.960692867 | 382.045757189 |
| M04 | 0.000000000 | −2836.571591757 | 318.474455743 |
| M05 | 0.000000000 | −2229.334121721 | 613.628374773 |
| M06 | 0.000000000 | −1910.060188189 | 1021.981064020 |
| M07 | −0.000000000 | −1410.771400546 | 2366.554366656 |
| Stop | −0.000000000 | −1431.489974732 | 2310.759719532 |
| M08 | 0.000000000 | −1649.846081233 | 1722.731711425 |
| Wafer | −0.000000000 | −1649.789892286 | 2500.244279290 |

|  | α$_x$ [°] | α$_y$ [°] | α$_z$ [°] |
|---|---|---|---|
| Reticle | 0.000000000 | 0.000000000 | 0.000000000 |
| M01 | −5.237121318 | 0.000000000 | 0.000000000 |
| M02 | 58.527751559 | 180.000000000 | 0.000000000 |
| M03 | 202.635298067 | 0.000000000 | 0.000000000 |
| M04 | −75.918305600 | 180.000000000 | 0.000000000 |
| M05 | 218.951084881 | 0.000000000 | 0.000000000 |
| M06 | 60.803922689 | 180.000000000 | 0.000000000 |
| M07 | −20.371785963 | −0.000000000 | −0.000000000 |
| Stop | 1.433657482 | 180.000000000 | −0.000000000 |
| M08 | −10.187963295 | 180.000000000 | −0.000000000 |
| Wafer | −0.004140627 | −0.000000000 | 0.000000000 |

Table 3a for FIG. 7
Free-form coefficients of the surfaces

| Coefficient | Formula | M01 | M02 | M03 |
|---|---|---|---|---|
| C7 | $x^2 y$ | 2.1174801142e−08 | 1.1989744170e−07 | −1.3797931887e−07 |
| C9 | $y^3$ | 7.9980176200e−09 | −3.5362142403e−07 | 3.8748673060e−08 |
| C10 | $x^4$ | 6.2440301492e−12 | 2.7577237094e−11 | −6.6405463948e−11 |
| C12 | $x^2 y^2$ | 6.6254279949e−12 | −1.7805715258e−10 | 7.4087849241e−11 |
| C14 | $y^4$ | −3.8675796924e−11 | 8.7756835100e−10 | 6.7653877979e−12 |
| C16 | $x^4 y$ | 1.8959036344e−14 | 9.9243055997e−14 | 3.7479448960e−14 |
| C18 | $x^2 y^3$ | 4.8095697911e−14 | 1.3317234865e−15 | −2.3867707009e−14 |
| C20 | $y^5$ | −7.5141261707e−14 | −2.1074282163e−12 | −5.4141757956e−14 |
| C21 | $x^6$ | 6.8622080244e−18 | −1.7071965936e−17 | 4.1736494743e−18 |
| C23 | $x^4 y^2$ | 6.0907712011e−18 | 2.4464264430e−16 | 8.0161471382e−18 |
| C25 | $x^2 y^4$ | 8.3909828142e−17 | −1.2973060127e−16 | −4.3898590062e−17 |
| C27 | $y^6$ | −1.6690476393e−16 | 7.4099466253e−15 | 7.8334243713e−17 |
| C29 | $x^6 y$ | −7.3364982188e−21 | 2.4849084494e−19 | 1.5065355821e−20 |
| C31 | $x^4 y^3$ | −2.1394764719e−20 | −1.0753819694e−18 | −4.7619189576e−20 |
| C33 | $x^2 y^5$ | 1.0942334040e−19 | −1.0940889972e−18 | 2.7449846178e−20 |
| C35 | $y^7$ | −3.3832212226e−20 | −1.4455177016e−17 | 4.5311399004e−19 |
| C36 | $x^8$ | −4.2922458387e−24 | 4.5505690074e−22 | 4.5619803413e−23 |
| C38 | $x^6 y^2$ | 6.1664128041e−24 | −3.8997511455e−23 | −5.4666097712e−23 |

-continued

Table 3a for FIG. 7
Free-form coefficients of the surfaces

| Coefficient | Formula | M01 | M02 | M03 |
|---|---|---|---|---|
| C40 | $x^4 y^4$ | 2.4985612094e−23 | 1.2854522646e−21 | 2.0503521492e−22 |
| C42 | $x^2 y^6$ | −1.5641989401e−22 | 4.8448153679e−21 | 2.5614705885e−21 |
| C44 | $y^8$ | 1.0979142283e−21 | −2.5021176674e−19 | −6.3302549538e−22 |
| C46 | $x^8 y$ | 3.3630438005e−26 | −5.5901692883e−25 | −7.6381711572e−26 |
| C48 | $x^6 y^3$ | 3.1487459729e−25 | −8.1490046448e−25 | 2.0589935068e−25 |
| C50 | $x^4 y^5$ | 2.2527226970e−24 | 8.2626699124e−24 | 1.8198645276e−24 |
| C52 | $x^2 y^7$ | −2.9044491366e−24 | 1.8921147342e−22 | −1.0315175027e−23 |
| C54 | $y^9$ | −1.6163832334e−23 | 2.3419336995e−21 | −3.4878654964e−23 |
| C55 | $x^{10}$ | −1.5249406869e−29 | −2.3829982035e−27 | −1.8187750017e−28 |
| C57 | $x^8 y^2$ | −1.0261849828e−28 | 5.2201627501e−27 | 3.7439063115e−28 |
| C59 | $x^6 y^4$ | −2.5788436965e−27 | 1.1415416017e−27 | −4.3491378430e−28 |
| C61 | $x^4 y^6$ | 1.4248767442e−27 | −8.2749101952e−26 | −3.2408638835e−26 |
| C63 | $x^2 y^8$ | 9.0265830843e−28 | −2.1611938456e−24 | −1.6380230105e−25 |
| C65 | $y^{10}$ | −1.8418718563e−25 | −4.3576149574e−24 | 1.3996699971e−25 |
| C67 | $x^{10} y$ | −1.5699502249e−31 | 6.8847345425e−30 | 2.3378941649e−31 |
| C69 | $x^8 y^3$ | −3.0516909101e−30 | 1.6496434205e−29 | 1.0913071218e−31 |
| C71 | $x^6 y^5$ | −3.4443833615e−29 | 2.1148924841e−28 | −1.8712818771e−29 |
| C73 | $x^4 y^7$ | −8.4276040283e−29 | −2.1280340569e−27 | −6.2685199960e−29 |
| C75 | $x^2 y^9$ | 2.0967832422e−28 | −6.3948038201e−27 | 8.0736154794e−28 |
| C77 | $y^{11}$ | −2.2894088470e−28 | −4.0724437896e−26 | 9.3047037780e−28 |
| C78 | $x^{12}$ | 2.1122109385e−34 | 1.0726058757e−32 | 5.6639417043e−35 |
| C80 | $x^{10} y^2$ | 8.1060598522e−34 | −5.3774133078e−32 | −1.5075649699e−33 |
| C82 | $x^8 y^4$ | 2.6445683390e−32 | 1.2074487315e−31 | −3.3880993742e−34 |
| C84 | $x^6 y^6$ | 2.1247901811e−31 | −2.6871982046e−31 | 1.1934842353e−31 |
| C86 | $x^4 y^8$ | −1.1672529203e−31 | 2.7894944685e−29 | 2.2496335961e−30 |
| C88 | $x^2 y^{10}$ | 1.1778943675e−30 | 2.1859415004e−28 | 5.7224755335e−30 |
| C90 | $y^{12}$ | 3.5010567181e−30 | 3.0580303822e−28 | −5.8197214548e−30 |
| C92 | $x^{12} y$ | 6.2250287994e−37 | 6.5367677580e−36 | −2.4414616439e−37 |
| C94 | $x^{10} y^3$ | 1.5931164238e−35 | 2.2639266717e−35 | −1.3915445025e−35 |
| C96 | $x^8 y^5$ | 2.1985741917e−34 | −4.0923874115e−33 | 2.6633023939e−35 |
| C98 | $x^6 y^7$ | 1.4433628067e−33 | −1.3563926447e−32 | 9.1430290886e−34 |
| C100 | $x^4 y^9$ | 1.1097257434e−34 | 1.2205776740e−31 | −4.2528490302e−34 |
| C102 | $x^2 y^{11}$ | −6.7513837640e−34 | −5.6135642570e−31 | −2.7666119954e−32 |
| C104 | $y^{13}$ | 1.1116011538e−32 | 1.9187331145e−31 | −1.2668099219e−32 |
| C105 | $x^{14}$ | −9.0498871808e−40 | −3.1771311781e−38 | 1.2736997198e−39 |
| C107 | $x^{12} y^2$ | −2.7243375199e−39 | 5.7558530884e−37 | 6.7602492088e−40 |
| C109 | $x^{10} y^4$ | −1.2312731339e−37 | −2.1272959851e−36 | −3.5785311828e−38 |
| C111 | $x^8 y^6$ | −1.8603265627e−36 | 1.6729970552e−36 | −3.1709996386e−37 |
| C113 | $x^6 y^8$ | −7.0509229242e−36 | −2.4619912833e−35 | −8.4497718674e−36 |
| C115 | $x^4 y^{10}$ | 3.5205198938e−36 | −3.0400859114e−33 | −7.7767055127e−35 |
| C117 | $x^2 y^{12}$ | −2.3197943913e−35 | −9.5428587903e−33 | −1.1502589044e−34 |
| C119 | $y^{14}$ | −1.3039074383e−35 | −1.8764032094e−32 | 1.2716380410e−34 |
| C121 | $x^{14} y$ | −2.2401149205e−42 | −1.3067146457e−40 | −1.3195276417e−42 |
| C123 | $x^{12} y^3$ | −4.2272379763e−41 | −9.3423565108e−40 | 8.8020107969e−41 |
| C125 | $x^{10} y^5$ | −8.3669998720e−40 | 2.3728445688e−38 | 3.1205113023e−40 |
| C127 | $x^8 y^7$ | −6.1382551780e−39 | 2.6968513474e−37 | −2.1068220541e−39 |
| C129 | $x^6 y^9$ | −2.9111253787e−38 | 9.8159039085e−37 | −1.3678812755e−38 |
| C131 | $x^4 y^{11}$ | 5.4279834264e−38 | 9.0309168595e−36 | 5.1656233166e−38 |
| C133 | $x^2 y^{13}$ | −1.2360977271e−37 | 8.2889688493e−35 | 4.7384612155e−37 |
| C135 | $y^{15}$ | −1.2787035404e−37 | 1.4474691853e−34 | 4.7735966305e−38 |
| C136 | $x^{16}$ | 1.9496669313e−45 | 9.1154531274e−44 | −4.2488253408e−45 |
| C138 | $x^{14} y^2$ | 5.9548985588e−45 | −3.1697962341e−42 | 1.5930964003e−44 |
| C140 | $x^{12} y^4$ | 2.7529148552e−43 | 1.2887985337e−41 | 3.1148110324e−43 |
| C142 | $x^{10} y^6$ | 6.3530343554e−42 | 4.2011456647e−41 | 1.5440977589e−42 |
| C144 | $x^8 y^8$ | 4.7900480431e−41 | −9.9159623677e−40 | 2.1403734624e−41 |
| C146 | $x^6 y^{10}$ | 9.4638079438e−41 | 1.4783904004e−39 | 2.0656051437e−40 |
| C148 | $x^4 y^{12}$ | 2.1948202624e−41 | 5.9405724504e−38 | 1.4074973934e−39 |
| C150 | $x^2 y^{14}$ | −1.0165201864e−40 | −2.8054867594e−37 | 1.1680324708e−39 |
| C152 | $y^{16}$ | −4.2711871028e−40 | −5.2755252791e−37 | −1.3514412534e−39 |
| C154 | $x^{16} y$ | 3.6024654006e−48 | 4.9946944283e−46 | 5.0588284826e−48 |
| C156 | $x^{14} y^3$ | 3.8297465267e−47 | 5.3404126392e−45 | −1.7083865629e−46 |
| C158 | $x^{12} y^5$ | 1.1769264177e−45 | −3.7467356886e−44 | −1.1588231097e−45 |
| C160 | $x^{10} y^7$ | 1.1581643635e−44 | −7.7753601317e−43 | 8.4334983149e−46 |
| C162 | $x^8 y^9$ | 5.5236245288e−44 | −6.1003485937e−42 | 6.2949920797e−45 |
| C164 | $x^6 y^{11}$ | 2.2833881417e−43 | −4.5623185554e−41 | 1.1238996175e−43 |
| C166 | $x^4 y^{13}$ | −9.2603735584e−43 | −3.9550474560e−40 | −8.4110728210e−43 |
| C168 | $x^2 y^{15}$ | 2.3849879076e−42 | 4.4893541206e−40 | −2.9894253815e−42 |
| C170 | $y^{17}$ | −6.1413904766e−43 | 9.5163381902e−40 | 1.3531928344e−43 |
| C171 | $x^{18}$ | −1.8217035740e−51 | −9.1124901724e−50 | 4.2309076161e−51 |
| C173 | $x^{16} y^2$ | −8.4733900600e−51 | 8.2468330293e−48 | −3.3735116572e−50 |
| C175 | $x^{14} y^4$ | −2.1902329415e−49 | −1.3747955017e−47 | −7.8824115986e−49 |
| C177 | $x^{12} y^6$ | −8.0838998212e−48 | −2.2283703445e−46 | −3.7934908221e−48 |
| C179 | $x^{10} y^8$ | −8.4386947553e−47 | 2.7836971569e−45 | −4.2077457200e−47 |
| C181 | $x^8 y^{10}$ | −4.1874318153e−46 | 2.9548263441e−44 | −2.3128996559e−46 |

-continued

| | | Table 3a for FIG. 7 Free-form coefficients of the surfaces | | |
|---|---|---|---|---|
| Coefficient | Formula | M01 | M02 | M03 |
| C183 | $x^6 y^{12}$ | −3.2580310845e−46 | 1.1493731927e−43 | −2.0825363342e−45 |
| C185 | $x^4 y^{14}$ | −1.6817962740e−45 | 6.3167008886e−43 | −9.8032192667e−45 |
| C187 | $x^2 y^{16}$ | 6.9370560479e−45 | −2.9124894793e−43 | −5.3983316466e−45 |
| C189 | $y^{18}$ | 4.2367681827e−46 | −6.7287596921e−43 | 5.8940194904e−45 |

| | | Table 3b for FIG. 7 | | |
|---|---|---|---|---|
| Coefficient | Formula | M04 | M05 | M06 |
| C7 | $x^2 y$ | 2.6902982211e−08 | 2.8936205682e−08 | −3.3247779979e−08 |
| C9 | $y^3$ | 8.3730358539e−08 | 5.0914370159e−08 | −3.0006529003e−08 |
| C10 | $x^4$ | 3.5818605735e−12 | −4.3587228178e−13 | 6.7438686569e−11 |
| C12 | $x^2 y^2$ | 1.4467915885e−10 | −2.8669697589e−11 | 8.4873379079e−11 |
| C14 | $y^4$ | 7.5646220484e−10 | −9.1895064550e−11 | 5.3441809822e−11 |
| C16 | $x^4 y$ | 2.2216070363e−14 | −9.1058498615e−15 | 5.4728450565e−14 |
| C18 | $x^2 y^3$ | 5.5432159779e−13 | −3.4841662596e−14 | 3.6017413950e−14 |
| C20 | $y^5$ | −6.7719825380e−13 | 2.0121909034e−13 | −6.6133783758e−14 |
| C21 | $x^6$ | 1.4545975601e−18 | 9.1988925615e−18 | −1.7040688169e−16 |
| C23 | $x^4 y^2$ | 1.2788261895e−16 | 3.3277481636e−17 | 5.2029662288e−16 |
| C25 | $x^2 y^4$ | 1.6300210774e−15 | 1.7390298957e−16 | −3.3012947904e−16 |
| C27 | $y^6$ | −2.6227802822e−14 | −4.6489343716e−16 | 7.7189293044e−16 |
| C29 | $x^6 y$ | 1.5732915219e−20 | −3.0252146628e−20 | −7.0399564675e−19 |
| C31 | $x^4 y^3$ | 4.5692955506e−19 | 3.0809999722e−20 | 1.1645280513e−18 |
| C33 | $x^2 y^5$ | −2.2141550535e−17 | −6.0785850731e−19 | −3.0851751482e−18 |
| C35 | $y^7$ | −2.2007570305e−16 | 1.0746571783e−18 | −1.5482914120e−17 |
| C36 | $x^8$ | −1.6648501578e−24 | 2.0089333092e−22 | −6.4770191670e−21 |
| C38 | $x^6 y^2$ | 5.7552888332e−23 | −1.8102627780e−22 | −3.6065512167e−21 |
| C40 | $x^4 y^4$ | −5.1775684738e−21 | −1.2964783264e−21 | −5.7781896397e−20 |
| C42 | $x^2 y^6$ | 1.8332072830e−19 | −4.1828912390e−22 | 4.7733979386e−20 |
| C44 | $y^8$ | 3.4243484284e−17 | −9.9726267644e−21 | 6.4712653761e−20 |
| C46 | $x^8 y$ | −3.2397417210e−27 | −6.5510363374e−25 | −2.1534095356e−22 |
| C48 | $x^6 y^3$ | 9.5583938620e−25 | 1.0367662620e−24 | 4.8272099299e−22 |
| C50 | $x^4 y^5$ | 2.1185860332e−22 | 7.9502534483e−24 | 5.8877037611e−22 |
| C52 | $x^2 y^7$ | 2.8098810033e−20 | −1.2851050708e−24 | −3.6674008091e−22 |
| C54 | $y^9$ | 1.0668818432e−19 | 8.0040576252e−23 | 8.2872459966e−22 |
| C55 | $x^{10}$ | 6.5783074104e−30 | −2.6940327729e−27 | 8.1655125861e−25 |
| C57 | $x^8 y^2$ | 4.1271246544e−28 | 3.4583221116e−27 | −3.9208159979e−24 |
| C59 | $x^6 y^4$ | 1.0140982208e−25 | 8.4247940036e−27 | −2.2392767243e−24 |
| C61 | $x^4 y^6$ | 1.3774151190e−23 | 4.2142559895e−26 | 1.3261041904e−23 |
| C63 | $x^2 y^8$ | 2.6334374880e−23 | 1.2554108024e−25 | 2.0877321879e−24 |
| C65 | $y^{10}$ | −8.4906239200e−21 | 3.7024677120e−25 | −8.8208974047e−24 |
| C67 | $x^{10} y$ | 2.9088205451e−32 | 1.4264317823e−29 | 2.1625114850e−26 |
| C69 | $x^8 y^3$ | 1.0353158271e−29 | −2.1104190244e−29 | −6.2509386516e−26 |
| C71 | $x^6 y^5$ | 2.2768822672e−27 | −1.2677462963e−28 | −2.3462550496e−25 |
| C73 | $x^4 y^7$ | −2.1157405318e−26 | −3.2688897985e−28 | −1.6105913803e−25 |
| C75 | $x^2 y^9$ | −5.8945239240e−24 | −7.0232036901e−28 | 3.7362193533e−26 |
| C77 | $y^{11}$ | −2.0592513154e−23 | −5.4448776982e−27 | 4.4436686019e−27 |
| C78 | $x^{12}$ | −4.8890108613e−36 | 1.5568756027e−32 | −4.0950399152e−29 |
| C80 | $x^{10} y^2$ | −1.7967338099e−33 | −4.9748663942e−32 | 3.8287353321e−28 |
| C82 | $x^8 y^4$ | −2.1495628489e−31 | 7.5147502824e−34 | 1.3069852869e−27 |
| C84 | $x^6 y^6$ | −6.7238647002e−29 | 1.8122914103e−31 | 9.3140914953e−28 |
| C86 | $x^4 y^8$ | −4.6206286547e−27 | −3.4726563673e−30 | −9.5083206673e−28 |
| C88 | $x^2 y^{10}$ | 1.8620235323e−28 | 2.7630520707e−30 | −6.2621515391e−28 |
| C90 | $y^{12}$ | 2.1155138406e−24 | −2.0577006821e−29 | 3.3720385863e−28 |
| C92 | $x^{12} y$ | −8.7205870151e−38 | −1.1581815496e−34 | −1.0007399867e−30 |
| C94 | $x^{10} y^3$ | −6.0308021218e−35 | 2.3329501375e−34 | 2.9963280814e−30 |
| C96 | $x^8 y^5$ | −1.2230350234e−32 | 9.2162384666e−34 | 2.3128637870e−29 |
| C98 | $x^6 y^7$ | −1.4066974868e−30 | 5.2763382356e−33 | 2.9063028483e−29 |
| C100 | $x^4 y^9$ | −1.2922423069e−29 | 1.1482602342e−32 | 1.6889650706e−29 |
| C102 | $x^2 y^{11}$ | 8.1039269850e−28 | 4.2616571156e−32 | 1.5771278696e−30 |
| C104 | $y^{13}$ | 1.2114603232e−26 | 2.4001356774e−31 | −1.9706426998e−30 |
| C105 | $x^{14}$ | −5.4595738543e−42 | −4.3924396328e−38 | 1.1684930617e−33 |
| C107 | $x^{12} y^2$ | 5.9385823866e−39 | 4.0887306962e−37 | −1.4018480052e−32 |
| C109 | $x^{10} y^4$ | 6.0694201556e−37 | −8.0688764675e−37 | −1.2329322685e−31 |
| C111 | $x^8 y^6$ | 1.0843084929e−34 | −7.8340658455e−36 | −2.1527307571e−31 |
| C113 | $x^6 y^8$ | 1.8417215372e−32 | 5.2564648364e−36 | −1.4847105541e−31 |
| C115 | $x^4 y^{10}$ | 7.3974624174e−31 | 9.7132314977e−35 | −1.7979048932e−32 |
| C117 | $x^2 y^{12}$ | 1.9777574952e−30 | −3.5170733243e−34 | 2.3971881635e−32 |
| C119 | $y^{14}$ | −3.3270614995e−28 | 5.8651644650e−34 | 3.1190073316e−33 |
| C121 | $x^{14} y$ | 4.2337088254e−43 | 4.1801691299e−40 | 2.2484309459e−35 |
| C123 | $x^{12} y^3$ | 3.0540949474e−40 | −1.1035517700e−39 | −3.8436654204e−35 |

-continued

Table 3b for FIG. 7

| Coefficient | Formula | M04 | M05 | M06 |
|---|---|---|---|---|
| C125 | $x^{10} y^5$ | 4.4400315834e-38 | -2.7061458344e-39 | -1.0662700884e-33 |
| C127 | $x^8 y^7$ | 6.9485310014e-36 | 2.3021607898e-38 | -1.9626846271e-33 |
| C129 | $x^6 y^9$ | 5.0133376150e-34 | -3.1806719331e-37 | -9.4713447448e-34 |
| C131 | $x^4 y^{11}$ | 6.2264305478e-33 | 2.4475503236e-37 | -5.8859957609e-34 |
| C133 | $x^2 y^{13}$ | 8.6487128022e-33 | -1.9455431552e-36 | -2.1557881512e-34 |
| C135 | $y^{15}$ | -4.2140319257e-30 | 4.9561209575e-36 | 1.1209725565e-35 |
| C136 | $x^{16}$ | 1.3303320191e-47 | 4.6292191952e-44 | -1.8541276824e-38 |
| C138 | $x^{14} y^2$ | 3.4295907574e-46 | -1.7164680140e-42 | 1.7483410549e-37 |
| C140 | $x^{12} y^4$ | 2.7535997893e-42 | 6.1048480302e-42 | 4.5088606712e-36 |
| C142 | $x^{10} y^6$ | 3.1419738857e-40 | 3.2084860066e-41 | 1.4230927852e-35 |
| C144 | $x^8 y^8$ | 4.8222404350e-38 | 1.0589313108e-40 | 1.3226337542e-35 |
| C146 | $x^6 y^{10}$ | 1.2551990634e-36 | -2.4312556213e-41 | 7.8732286052e-36 |
| C148 | $x^4 y^{12}$ | 3.3128875761e-35 | -1.2056724665e-39 | 3.4338805866e-36 |
| C150 | $x^2 y^{14}$ | -4.3501478341e-34 | 1.0592868162e-38 | 7.6864847922e-37 |
| C152 | $y^{16}$ | 1.1903396199e-32 | -7.4218898550e-39 | -6.0158162658e-38 |
| C154 | $x^{16} y$ | -4.1752421933e-49 | -4.3643443857e-46 | -1.9449599458e-40 |
| C156 | $x^{14} y^3$ | -3.2161434382e-46 | 1.6521607773e-45 | -2.9280624874e-40 |
| C158 | $x^{12} y^5$ | -3.1381167931e-44 | 2.6927160336e-45 | 1.6219112391e-38 |
| C160 | $x^{10} y^7$ | -2.5589188771e-42 | -3.4255871218e-43 | 5.6105895182e-38 |
| C162 | $x^8 y^9$ | -5.1835500205e-40 | 6.1363814911e-43 | 2.7650244185e-38 |
| C164 | $x^6 y^{11}$ | -1.8767739644e-38 | 3.8721297493e-42 | -1.6505237097e-38 |
| C166 | $x^4 y^{13}$ | 3.0931853685e-37 | -1.0096703705e-41 | -7.6964268148e-39 |
| C168 | $x^2 y^{15}$ | -1.5777760684e-35 | 3.3992932061e-41 | -1.3187710039e-39 |
| C170 | $y^{17}$ | 4.4105310647e-34 | 3.6748787552e-41 | 1.0635654494e-40 |
| C171 | $x^{18}$ | 3.7093557654e-54 | -4.1670630369e-50 | 1.2774956991e-43 |
| C173 | $x^{16} y^2$ | -4.7012152422e-51 | 2.4947375500e-48 | 1.2320827615e-43 |
| C175 | $x^{14} y^4$ | -5.2019344929e-48 | -1.2211078446e-47 | -5.3774167323e-41 |
| C177 | $x^{12} y^6$ | -6.2815865764e-47 | 1.0147782248e-47 | -3.0090064784e-40 |
| C179 | $x^{10} y^8$ | -5.4889948522e-44 | 1.0055804681e-45 | -4.5530694157e-40 |
| C181 | $x^8 y^{10}$ | -3.5940876754e-42 | -6.2373911512e-45 | -1.7302619999e-40 |
| C183 | $x^6 y^{12}$ | -1.0644406210e-40 | 1.2032076826e-44 | 9.5421263771e-42 |
| C185 | $x^4 y^{14}$ | 1.8289550742e-39 | -1.7081120533e-44 | 6.3813940934e-42 |
| C187 | $x^2 y^{16}$ | -1.0493218014e-37 | -7.8571254843e-44 | 9.0036099967e-43 |
| C189 | $y^{18}$ | 2.0596747055e-36 | -7.4465345998e-45 | -6.9564863186e-44 |

Table 3c for FIG. 7

| Coefficient | Formula | M07 | M08 |
|---|---|---|---|
| C7 | $x^2 y$ | 6.7970642423e-07 | -8.2894401535e-09 |
| C9 | $y^3$ | -5.9078575122e-07 | 2.1079080222e-08 |
| C10 | $x^4$ | 3.9701219519e-10 | -1.2639355247e-11 |
| C12 | $x^2 y^2$ | 1.1770112269e-09 | -5.8671799363e-11 |
| C14 | $y^4$ | 2.4637068524e-09 | -1.5568955969e-11 |
| C16 | $x^4 y$ | 1.0502216981e-12 | -2.1593191431e-14 |
| C18 | $x^2 y^3$ | 3.4008082302e-12 | 3.0658352454e-15 |
| C20 | $y^5$ | -7.5135572239e-12 | 2.1577751942e-14 |
| C21 | $x^6$ | 4.8383957865e-16 | -2.3742571355e-17 |
| C23 | $x^4 y^2$ | 5.2286574774e-15 | -1.0582640841e-16 |
| C25 | $x^2 y^4$ | 8.6827912201e-16 | -1.1291571767e-16 |
| C27 | $y^6$ | 2.6095833165e-14 | -2.5689284444e-17 |
| C29 | $x^6 y$ | 3.6627518762e-18 | -2.3194913367e-20 |
| C31 | $x^4 y^3$ | 1.0881286866e-17 | -2.5037817502e-20 |
| C33 | $x^2 y^5$ | 2.4533623457e-17 | 2.2975747813e-20 |
| C35 | $y^7$ | -1.2356057364e-16 | 2.6651822491e-20 |
| C36 | $x^8$ | 1.6285109456e-21 | -3.5366141166e-23 |
| C38 | $x^6 y^2$ | 1.6999606660e-20 | -1.4861649304e-22 |
| C40 | $x^4 y^4$ | 5.3165121408e-20 | -2.6406866513e-22 |
| C42 | $x^2 y^6$ | -8.4138193599e-20 | -1.7679836743e-22 |
| C44 | $y^8$ | 4.4074844183e-19 | -3.3432019844e-23 |
| C46 | $x^8 y$ | 9.6430446019e-24 | -1.1786079307e-26 |
| C48 | $x^6 y^3$ | 6.1448438107e-23 | -6.3546817009e-26 |
| C50 | $x^4 y^5$ | -8.5529066332e-23 | -9.1475494697e-27 |
| C52 | $x^2 y^7$ | 6.7483094152e-22 | 5.2515853352e-26 |
| C54 | $y^9$ | 1.4673220379e-21 | 2.2993114320e-26 |
| C55 | $x^{10}$ | 4.1225387383e-27 | -2.0377027815e-29 |
| C57 | $x^8 y^2$ | 6.2729343801e-26 | -3.0629620047e-28 |
| C59 | $x^6 y^4$ | 2.5978116495e-25 | -7.9902386913e-28 |
| C61 | $x^4 y^6$ | 1.7522096253e-24 | -9.4569588133e-28 |
| C63 | $x^2 y^8$ | 6.6679293367e-24 | -4.6512425655e-28 |
| C65 | $y^{10}$ | 8.5095016125e-24 | -9.7375687594e-29 |
| C67 | $x^{10} y$ | 9.0085922037e-30 | -4.2350989163e-32 |
| C69 | $x^8 y^3$ | 3.5057250047e-28 | 2.1557736741e-32 |
| C71 | $x^6 y^5$ | 4.7025528427e-27 | -8.9665066453e-32 |
| C73 | $x^4 y^7$ | 1.6191419220e-26 | -7.7362939590e-32 |
| C75 | $x^2 y^9$ | -2.1292935872e-26 | 2.6358918731e-32 |
| C77 | $y^{11}$ | -3.5393383200e-25 | 5.2757653981e-32 |
| C78 | $x^{12}$ | -2.1359063228e-32 | -2.5789293433e-35 |
| C80 | $x^{10} y^2$ | 4.8435808605e-31 | 4.4104962582e-34 |
| C82 | $x^8 y^4$ | 2.2669035524e-30 | 2.1509031171e-33 |
| C84 | $x^6 y^6$ | -1.7225486468e-29 | 4.5151491587e-33 |
| C86 | $x^4 y^8$ | -1.4597826495e-28 | 3.9319587542e-33 |
| C88 | $x^2 y^{10}$ | -9.7446863145e-28 | 1.2091962521e-33 |
| C90 | $y^{12}$ | 9.7215792255e-28 | 1.8506083494e-34 |
| C92 | $x^{12} y$ | 1.0156254191e-33 | -1.8827122974e-37 |
| C94 | $x^{10} y^3$ | 9.2877834885e-33 | -1.3366539492e-36 |
| C96 | $x^8 y^5$ | -4.6411119050e-32 | -1.3353040419e-36 |
| C98 | $x^6 y^7$ | -4.6268678045e-31 | 5.9288629388e-37 |
| C100 | $x^4 y^9$ | -1.3732016825e-30 | 1.7526888076e-36 |
| C102 | $x^2 y^{11}$ | 5.0399712919e-30 | 1.2518058326e-36 |
| C104 | $y^{13}$ | 1.6049192180e-29 | 2.0342744359e-37 |
| C105 | $x^{14}$ | 4.1953615265e-37 | -1.7271127409e-40 |
| C107 | $x^{12} y^2$ | -7.0000666356e-37 | -3.9645826651e-39 |
| C109 | $x^{10} y^4$ | -2.6113898116e-35 | -2.0926367546e-38 |
| C111 | $x^8 y^6$ | 2.5109998852e-34 | -5.3037026852e-38 |
| C113 | $x^6 y^8$ | 2.8449614741e-33 | -6.7087350234e-38 |
| C115 | $x^4 y^{10}$ | 1.4799238868e-32 | -4.3306102675e-38 |
| C117 | $x^2 y^{12}$ | 5.1678535529e-32 | -1.1259492734e-38 |
| C119 | $y^{14}$ | -9.6213102793e-32 | -1.1603180007e-39 |
| C121 | $x^{14} y$ | -1.2672765169e-38 | 8.5472281223e-43 |
| C123 | $x^{12} y^3$ | -2.0767830748e-37 | 5.9087817199e-42 |
| C125 | $x^{10} y^5$ | -1.2960033991e-37 | 9.8772532421e-42 |
| C127 | $x^8 y^7$ | 7.6201604393e-36 | 2.0864897943e-42 |
| C129 | $x^6 y^9$ | 3.0786092579e-35 | -1.1268111746e-41 |

-continued

-continued

| Table 3c for FIG. 7 | | | |
|---|---|---|---|
| Coefficient | Formula | M07 | M08 |
| C131 | $x^4 y^{11}$ | 4.9183755647e−35 | −1.2446375466e−41 |
| C133 | $x^2 y^{13}$ | −4.2745386027e−34 | −6.9853781895e−42 |
| C135 | $y^{15}$ | −3.0198258643e−34 | −1.2712693546e−42 |
| C136 | $x^{16}$ | −3.2639938335e−42 | 5.0096225730e−46 |
| C138 | $x^{14} y^2$ | −1.5525179590e−41 | 1.2105494087e−44 |
| C140 | $x^{12} y^4$ | 2.3895501062e−40 | 7.7993368972e−44 |
| C142 | $x^{10} y^6$ | 2.8552512886e−40 | 2.4755423678e−43 |
| C144 | $x^8 y^8$ | −3.3901937227e−38 | 4.1745155229e−43 |
| C146 | $x^6 y^{10}$ | −1.9655261239e−37 | 3.9322107368e−43 |
| C148 | $x^4 y^{12}$ | −8.2379066952e−37 | 2.0124339374e−43 |
| C150 | $x^2 y^{14}$ | −9.9193562139e−37 | 4.1716336752e−44 |
| C152 | $y^{16}$ | 4.1962214480e−36 | 3.1010579959e−45 |
| C154 | $x^{16} y$ | 1.1580267699e−43 | −2.3675469449e−48 |
| C156 | $x^{14} y^3$ | 2.7319385918e−42 | −1.8659173127e−47 |
| C158 | $x^{12} y^5$ | 1.4018721248e−41 | −4.6101048907e−47 |
| C160 | $x^{10} y^7$ | −3.5064542017e−41 | −4.2954997978e−47 |
| C162 | $x^8 y^9$ | −4.3381418953e−40 | 2.1872108271e−47 |
| C164 | $x^6 y^{11}$ | −1.0361610776e−39 | 6.9732946279e−47 |
| C166 | $x^4 y^{13}$ | −3.2518392263e−40 | 5.7726988504e−47 |
| C168 | $x^2 y^{15}$ | 1.7849778855e−38 | 2.8120356200e−47 |
| C170 | $y^{17}$ | −9.0358932498e−39 | 5.3520269194e−48 |
| C171 | $x^{18}$ | 2.2198733683e−47 | −1.3519141401e−51 |
| C173 | $x^{16} y^2$ | 5.7311741316e−46 | −2.8897477192e−50 |
| C175 | $x^{14} y^4$ | 4.9461334881e−45 | −2.0485040722e−49 |
| C177 | $x^{12} y^6$ | 1.3393924193e−44 | −7.5236646888e−49 |
| C179 | $x^{10} y^8$ | 1.2990662420e−43 | −1.5690873359e−48 |
| C181 | $x^8 y^{10}$ | 1.9397890176e−42 | −1.9545219554e−48 |
| C183 | $x^6 y^{12}$ | 6.7622219538e−42 | −1.4616727693e−48 |
| C185 | $x^4 y^{14}$ | 2.7005399337e−41 | −6.2091358891e−49 |
| C187 | $x^2 y^{16}$ | −3.1716206518e−41 | −1.1118921179e−49 |
| C189 | $y^{18}$ | −3.8203956226e−41 | −7.1282199203e−51 |
| C191 | $x^{18} y$ | −5.4447916296e−49 | 3.2039971584e−54 |
| C193 | $x^{16} y^3$ | −1.6517668017e−47 | 2.9536859588e−53 |
| C195 | $x^{14} y^5$ | −1.3942505179e−46 | 9.4356644907e−53 |
| C197 | $x^{12} y^7$ | −2.5876132845e−46 | 1.4293579867e−52 |
| C199 | $x^{10} y^9$ | 2.2045472140e−45 | 4.3548558136e−53 |
| C201 | $x^8 y^{11}$ | 1.0716887109e−44 | −1.4247679093e−52 |
| C203 | $x^6 y^{13}$ | 2.0380217012e−44 | −1.9863557956e−52 |

-continued

| Table 3c for FIG. 7 | | | |
|---|---|---|---|
| Coefficient | Formula | M07 | M08 |
| C205 | $x^4 y^{15}$ | −5.2803582029e−44 | −1.3054475128e−52 |
| C207 | $x^2 y^{17}$ | −2.2419329092e−43 | −5.4868828706e−53 |
| C209 | $y^{19}$ | 2.4877563605e−43 | −1.0099252056e−53 |
| C210 | $x^{20}$ | −8.9327229128e−53 | 1.7970943296e−57 |
| C212 | $x^{18} y^2$ | −4.2152206640e−51 | 3.7608786470e−56 |
| C214 | $x^{16} y^4$ | −6.3645033096e−50 | 2.9065681533e−55 |
| C216 | $x^{14} y^6$ | −3.6369055165e−49 | 1.2080200826e−54 |
| C218 | $x^{12} y^8$ | −9.9749679811e−49 | 2.9787459814e−54 |
| C220 | $x^{10} y^{10}$ | −5.5258229488e−48 | 4.6315533987e−54 |
| C222 | $x^8 y^{12}$ | −4.8656256980e−47 | 4.5792000902e−54 |
| C224 | $x^6 y^{14}$ | −1.2157558726e−46 | 2.8452231315e−54 |
| C226 | $x^4 y^{16}$ | −3.2787067054e−46 | 1.0305641711e−54 |
| C228 | $x^2 y^{18}$ | 1.0728913097e−45 | 1.6184312129e−55 |
| C230 | $y^{20}$ | −5.7046137479e−46 | 9.0177653609e−57 |
| C232 | $x^{20} y$ | 1.2276085551e−54 | −2.0894750662e−60 |
| C234 | $x^{18} y^3$ | 4.4080266077e−53 | −2.2136833230e−59 |
| C236 | $x^{16} y^5$ | 4.9384078173e−52 | −8.7756059518e−59 |
| C238 | $x^{14} y^7$ | 2.0892235257e−51 | −1.8439035136e−58 |
| C240 | $x^{12} y^9$ | 6.7673603843e−52 | −1.7378672310e−58 |
| C242 | $x^{10} y^{11}$ | −3.8096714699e−50 | 2.7445146337e−59 |
| C244 | $x^8 y^{13}$ | −7.9387347722e−50 | 2.2923432344e−58 |
| C246 | $x^6 y^{15}$ | −2.2374465113e−49 | 2.3826110438e−58 |
| C248 | $x^4 y^{17}$ | 1.3277981388e−48 | 1.3698462898e−58 |
| C250 | $x^2 y^{19}$ | −1.5320505047e−48 | 5.0315916673e−59 |
| C252 | $y^{21}$ | 6.6606646146e−49 | 8.5645107817e−60 |
| C253 | $x^{22}$ | 1.8462871592e−58 | −1.2652222688e−63 |
| C255 | $x^{20} y^2$ | 1.3035807840e−56 | −2.5110269625e−62 |
| C257 | $x^{18} y^4$ | 2.5630550325e−55 | −2.0153247661e−61 |
| C259 | $x^{16} y^6$ | 2.0097364713e−54 | −9.0879946944e−61 |
| C261 | $x^{14} y^8$ | 8.2347344956e−54 | −2.5348268529e−60 |
| C263 | $x^{12} y^{10}$ | 1.2572723477e−53 | −4.6572219719e−60 |
| C265 | $x^{10} y^{12}$ | 9.7429169012e−53 | −5.7420266651e−60 |
| C267 | $x^8 y^{14}$ | 3.7343879328e−52 | −4.7173897302e−60 |
| C269 | $x^6 y^{16}$ | 1.1315981070e−51 | −2.5280992143e−60 |
| C271 | $x^4 y^{18}$ | −1.2286991914e−51 | −8.1186738159e−61 |
| C273 | $x^2 y^{20}$ | 4.8801464776e−52 | −1.2112653718e−61 |
| C275 | $y^{22}$ | −3.8028486496e−52 | −6.8360525636e−63 |

| Table 4 for FIG. 7 | | | |
|---|---|---|---|
| Coordinates of the stop edge | | | |
| $x_i$ [mm] | $y_i$ [mm] | $x_{i+N/2}$ [mm] | $y_{i+N/2}$ [mm] |
| −402.949474 | −54.556507 | 403.374997 | −67.760326 |
| −402.301960 | −47.907550 | 403.152254 | −74.306857 |
| −401.365920 | −41.232932 | 402.639488 | −80.811093 |
| −400.142937 | −34.537026 | 401.837539 | −87.269148 |
| −398.635063 | −27.824262 | 400.747727 | −93.677266 |
| −396.844809 | −21.099111 | 399.371838 | −100.031820 |
| −394.775127 | −14.366071 | 397.712114 | −106.329323 |
| −392.429401 | −7.629654 | 395.771237 | −112.566425 |
| −389.811422 | −0.894369 | 393.552307 | −118.739917 |
| −386.925373 | 5.835282 | 391.058824 | −124.846728 |
| −383.775808 | 12.554822 | 388.294665 | −130.883926 |
| −380.367628 | 19.259798 | 385.264057 | −136.848713 |
| −376.706057 | 25.945793 | 381.971550 | −142.738422 |
| −372.796623 | 32.608429 | 378.421993 | −148.550513 |
| −368.645127 | 39.243366 | 374.620502 | −154.282569 |
| −364.257623 | 45.846309 | 370.572433 | −159.932288 |
| −359.640392 | 52.413005 | 366.283353 | −165.497475 |
| −354.799912 | 58.939247 | 361.759011 | −170.976040 |
| −349.742838 | 65.420866 | 357.005310 | −176.365986 |
| −344.475973 | 71.853738 | 352.028280 | −181.665403 |
| −339.006244 | 78.233772 | 346.834051 | −186.872461 |
| −333.340677 | 84.556915 | 341.428829 | −191.985402 |
| −327.486369 | 90.819141 | 335.818873 | −197.002535 |
| −321.450464 | 97.016447 | 330.010473 | −201.922226 |
| −315.240131 | 103.144847 | 324.009931 | −206.742894 |
| −308.862536 | 109.200364 | 317.823543 | −211.463009 |
| −302.324819 | 115.179019 | 311.457585 | −216.081080 |
| −295.634073 | 121.076824 | 304.918297 | −220.595657 |
| −288.797320 | 126.889769 | 298.211871 | −225.005325 |

-continued

Table 4 for FIG. 7
Coordinates of the stop edge

| $x_i$ [mm] | $y_i$ [mm] | $x_{i+N/2}$ [mm] | $y_{i+N/2}$ [mm] |
|---|---|---|---|
| −281.821492 | 132.613816 | 291.344443 | −229.308702 |
| −274.713411 | 138.244882 | 284.322080 | −233.504434 |
| −267.479769 | 143.778834 | 277.150779 | −237.591197 |
| −260.127114 | 149.211479 | 269.836450 | −241.567692 |
| −252.661834 | 154.538552 | 262.384923 | −245.432644 |
| −245.090143 | 159.755716 | 254.801933 | −249.184803 |
| −237.418070 | 164.858553 | 247.093120 | −252.822941 |
| −229.651447 | 169.842566 | 239.264030 | −256.345855 |
| −221.795901 | 174.703181 | 231.320105 | −259.752362 |
| −213.856847 | 179.435754 | 223.266689 | −263.041303 |
| −205.839483 | 184.035577 | 215.109018 | −266.211543 |
| −197.748786 | 188.497893 | 206.852231 | −269.261970 |
| −189.589513 | 192.817907 | 198.501357 | −272.191498 |
| −181.366197 | 196.990805 | 190.061326 | −274.999067 |
| −173.083152 | 201.011766 | 181.536964 | −277.683643 |
| −164.744479 | 204.875983 | 172.932999 | −280.244225 |
| −156.354070 | 208.578675 | 164.254057 | −282.679839 |
| −147.915618 | 212.115105 | 155.504670 | −284.989546 |
| −139.432626 | 215.480590 | 146.689278 | −287.172443 |
| −130.908422 | 218.670522 | 137.812230 | −289.227663 |
| −122.346170 | 221.680371 | 128.877792 | −291.154378 |
| −113.748888 | 224.505711 | 119.890147 | −292.951802 |
| −105.119462 | 227.142226 | 110.853406 | −294.619192 |
| −96.460664 | 229.585735 | 101.771608 | −296.155852 |
| −87.775169 | 231.832213 | 92.648726 | −297.561132 |
| −79.065572 | 233.877816 | 83.488676 | −298.834434 |
| −70.334401 | 235.718910 | 74.295320 | −299.975208 |
| −61.584136 | 237.352108 | 65.072474 | −300.982959 |
| −52.817216 | 238.774300 | 55.823911 | −301.857248 |
| −44.036054 | 239.982694 | 46.553370 | −302.597689 |
| −35.243042 | 240.974852 | 37.264557 | −303.203955 |
| −26.440561 | 241.748723 | 27.961157 | −303.675776 |
| −17.630982 | 242.302677 | 18.646833 | −304.012942 |
| −8.816673 | 242.635529 | 9.325234 | −304.215302 |
| 0.000000 | 242.746560 | 0.000000 | −304.282765 |
| 8.816673 | 242.635529 | −9.325234 | −304.215302 |
| 17.630982 | 242.302677 | −18.646833 | −304.012942 |
| 26.440561 | 241.748723 | −27.961157 | −303.675776 |
| 35.243042 | 240.974852 | −37.264557 | −303.203955 |
| 44.036054 | 239.982694 | −46.553370 | −302.597689 |
| 52.817216 | 238.774300 | −55.823911 | −301.857248 |
| 61.584136 | 237.352108 | −65.072474 | −300.982959 |
| 70.334401 | 235.718910 | −74.295320 | −299.975208 |
| 79.065572 | 233.877816 | −83.488676 | −298.834434 |
| 87.775169 | 231.832213 | −92.648726 | −297.561132 |
| 96.460664 | 229.585735 | −101.771608 | −296.155852 |
| 105.119462 | 227.142226 | −110.853406 | −294.619192 |
| 113.748888 | 224.505711 | −119.890147 | −292.951802 |
| 122.346170 | 221.680371 | −128.877792 | −291.154378 |
| 130.908422 | 218.670522 | −137.812230 | −289.227663 |
| 139.432626 | 215.480590 | −146.689278 | −287.172443 |
| 147.915618 | 212.115105 | −155.504670 | −284.989546 |
| 156.354070 | 208.578675 | −164.254057 | −282.679839 |
| 164.744479 | 204.875983 | −172.932999 | −280.244225 |
| 173.083152 | 201.011766 | −181.536964 | −277.683643 |
| 181.366197 | 196.990805 | −190.061326 | −274.999067 |
| 189.589513 | 192.817907 | −198.501357 | −272.191498 |
| 197.748786 | 188.497893 | −206.852231 | −269.261970 |
| 205.839483 | 184.035577 | −215.109018 | −266.211543 |
| 213.856847 | 179.435754 | −223.266689 | −263.041303 |
| 221.795901 | 174.703181 | −231.320105 | −259.752362 |
| 229.651447 | 169.842566 | −239.264030 | −256.345855 |
| 237.418070 | 164.858553 | −247.093120 | −252.822941 |
| 245.090143 | 159.755716 | −254.801933 | −249.184803 |
| 252.661834 | 154.538552 | −262.384923 | −245.432644 |
| 260.127114 | 149.211479 | −269.836450 | −241.567692 |
| 267.479769 | 143.778834 | −277.150779 | −237.591197 |
| 274.713411 | 138.244882 | −284.322080 | −233.504434 |
| 281.821492 | 132.613816 | −291.344443 | −229.308702 |
| 288.797320 | 126.889769 | −298.211871 | −225.005325 |
| 295.634073 | 121.076824 | −304.918297 | −220.595657 |
| 302.324819 | 115.179019 | −311.457585 | −216.081080 |
| 308.862536 | 109.200364 | −317.823543 | −211.463009 |
| 315.240131 | 103.144847 | −324.009931 | −206.742894 |

-continued

Table 4 for FIG. 7
Coordinates of the stop edge

| $x_i$ [mm] | $y_i$ [mm] | $x_{i+N/2}$ [mm] | $y_{i+N/2}$ [mm] |
|---|---|---|---|
| 321.450464 | 97.016447 | −330.010473 | −201.922226 |
| 327.486369 | 90.819141 | −335.818873 | −197.002535 |
| 333.340677 | 84.556915 | −341.428829 | −191.985402 |
| 339.006244 | 78.233772 | −346.834051 | −186.872461 |
| 344.475973 | 71.853738 | −352.028280 | −181.665403 |
| 349.742838 | 65.420866 | −357.005310 | −176.365986 |
| 354.799912 | 58.939247 | −361.759011 | −170.976040 |
| 359.640392 | 52.413005 | −366.283353 | −165.497475 |
| 364.257623 | 45.846309 | −370.572433 | −159.932288 |
| 368.645127 | 39.243366 | −374.620502 | −154.282569 |
| 372.796623 | 32.608429 | −378.421993 | −148.550513 |
| 376.706057 | 25.945793 | −381.971550 | −142.738422 |
| 380.367628 | 19.259798 | −385.264057 | −136.848713 |
| 383.775808 | 12.554822 | −388.294665 | −130.883926 |
| 386.925373 | 5.835282 | −391.058824 | −124.846728 |
| 389.811422 | −0.894369 | −393.552307 | −118.739917 |
| 392.429401 | −7.629654 | −395.771237 | −112.566425 |
| 394.775127 | −14.366071 | −397.712114 | −106.329323 |
| 396.844809 | −21.099111 | −399.371838 | −100.031820 |
| 398.635063 | −27.824262 | −400.747727 | −93.677266 |
| 400.142937 | −34.537026 | −401.837539 | −87.269148 |
| 401.365920 | −41.232932 | −402.639488 | −80.811093 |
| 402.301960 | −47.907550 | −403.152254 | −74.306857 |
| 402.949474 | −54.556507 | −403.374997 | −67.760326 |
| 403.307360 | −61.175504 | −403.307360 | −61.175504 |

The mirrors M1, M3, M4, M5 and M8 have negative values for the radius, i.e. are, in principle, concave mirrors. The mirrors M2, M6 and M7 have positive values for the radius, i.e. are, in principle, convex mirrors. The mirrors M1 to M8 of the projection optical unit according to FIG. 7 have no $R_x$, $R_y$ radius values with in each case different signs. None of the mirrors M1 to M8 therefore has a saddle shape as a matter of principle.

A boundary of a stop surface of the stop (cf., also, Table 4 for FIG. 7) emerges from intersection points on the stop surface of all rays of the illumination light 3 which, on the image side, propagate at the field centre point in the direction of the stop surface with a complete image-side telecentric aperture. When the stop is embodied as an aperture stop, the boundary is an inner boundary.

The stop AS can lie in a plane or else have a three-dimensional embodiment. The extent of the stop AS can be smaller in the scan direction (y) than in the cross-scan direction (x).

Further data of the projection optical unit 7 arise from Table 5 below:

Table 5 for FIG. 7

| NA | Numerical aperture | 0.75 |
|---|---|---|
| \|βx\| | Magnification scale in the cross-scan direction | 4 |
| \|βy\| | Magnification scale in the scan direction | 8 |
| RMS | Scanned wavefront deviation | 10.0 mλ |
| N | Number of mirrors | 8 |

The value NA specified in Table 5 denotes the image-side numerical aperture of the projection optical unit. Thus, this is a different variable to the variable NA introduced above, which is a measure for an angle between a normal of the optical surface to be tested and an optical axis.

The projection optical unit 7 is designed for a wavelength of the illumination light 3 of 13.5 nm.

The mean wavefront aberration RMS (scanned wavefront deviation) is a measure for the imaging quality of the projection optical unit 7.

The projection optical unit 7 is at least approximately telecentric on the image side.

FIGS. 8 to 15 show the edge contours of the reflection surfaces of the mirrors M1 to M8 in their respective local xy-coordinates. Moreover, contour lines are plotted in FIGS. 8 to 15 in order to provide a vague understanding of a profile of the curvature of mirrors M1 to M8.

The local xy-coordinates, provided below for describing the mirrors M1 to M8 in particular, each have x-axes that run parallel to the x-axis of the global xyz-coordinate system according to FIG. 7. The local y-axis of the local coordinates is tilted about the respective x-axis such that the local xy-plane corresponds to a principal arrangement plane, in which the reflection surface of the respective mirror M1 to M8 is arranged.

The different scalings of the x- and y-coordinates in FIGS. 8 to 15 should be observed. The GI mirrors M2, M3, M5, M6 have x/y-aspect ratios of their reflection surfaces that are deviate strongly from one, with the x-dimension regularly being significantly larger than the y-dimension such that this yields aspect ratios that may even be significantly larger than 2 and even be significantly larger than 3. The mirror M6 forms an exception, with a y-dimension of the extent of the used reflection surface being approximately the same size as the x-dimension.

The NI mirror M4 has a very large x/y-aspect ratio, of the order of 10. The NI mirror M4 this has much greater extent perpendicular to the meridional plane of FIG. 7 than in the meridional plane.

The edge contours of the mirrors M1 to M7, which partially deviate quite significantly from a round shape, the x/y-aspect ratio which in part deviates significantly from 1 and also, in part, the absolute extent of the used reflection surface, which is larger in the case of the mirror M8 than in the case of all other mirrors, in addition to the topography of the used reflection surfaces of the mirror M1 to M8, involve a respective different edge contour of the test light beam path 28 when measuring the used reflection surface of the respective mirror M1 to M8. This is elucidated in FIGS. 16 to 23, which show the edge contours $28_{M1}$ to $28_{M18}$ of the test light beam paths for testing the mirrors M1 to M8, in each case for the respective case optimized in respect of the coverage by the DOEs $16_i$, in accordance with the above-described example of the edge contour $28_3$ (cf. FIG. 6A). It should be observed here that the edge contours $28_{Mi}$ of the test light beam path in this case also in part deviate very significantly in qualitative fashion from the edge contours, depicted in FIGS. 8 to 15, of the used reflection surfaces of the mirrors M1 to M8. By way of example, the edge contour $28_{M8}$ of the mirror M8 which to a good approximation has a circular edge in respect of its used reflection surface deviates significantly from a circular shape.

What also emerges from the scaling of the x- and y-co-ordinates of FIGS. 16 to 23 are areal extents of the edge contours $28_{Mi}$ that, depending on the mirror, differ significantly from one another. Thus, the areal extent of the edge contour $28_{M8}$ of the test light beam path for measuring the used reflection surface of the mirror M8 is so small that it is completely covered by single DOE 16. The edge contours $28_{M1}$, $28_{M4}$, $28_{M6}$ are so extensive that two DOEs $16_1$, $16_2$ are used in each case for the complete coverage of the edge contours. Three DOEs $16_1$, $16_2$, $16_3$ are used in each case to cover the edge contours $28_{M3}$ and $28_{M5}$ of the test light beam path for mirrors M3 and M5. Four DOEs $16_1$ to $16_4$ are used to cover the edge contour $28_{M2}$ and seven DOEs $16_1$ to $16_7$ are used to cover the edge contour $28_{M7}$ of the test light beam path for the mirror M7.

Thus, for the complete measurement of all reflection surfaces of the mirrors M1 to M8 of the imaging optical unit 7 according to FIG. 7, a total of two+four+three+two+three+two+seven+one=24 DOEs $16_i$ are used, that is to say exactly 3 times as many DOEs $16_i$ as there are mirrors M1 to M8 to be measured.

The maximum number of DOEs $16_i$ used to measure exactly one reflection surface of one of the mirrors M1 to M8 therefore is seven, for the mirror M7, in the case of the projection optical unit 7 according to FIG. 7.

Figure 24:
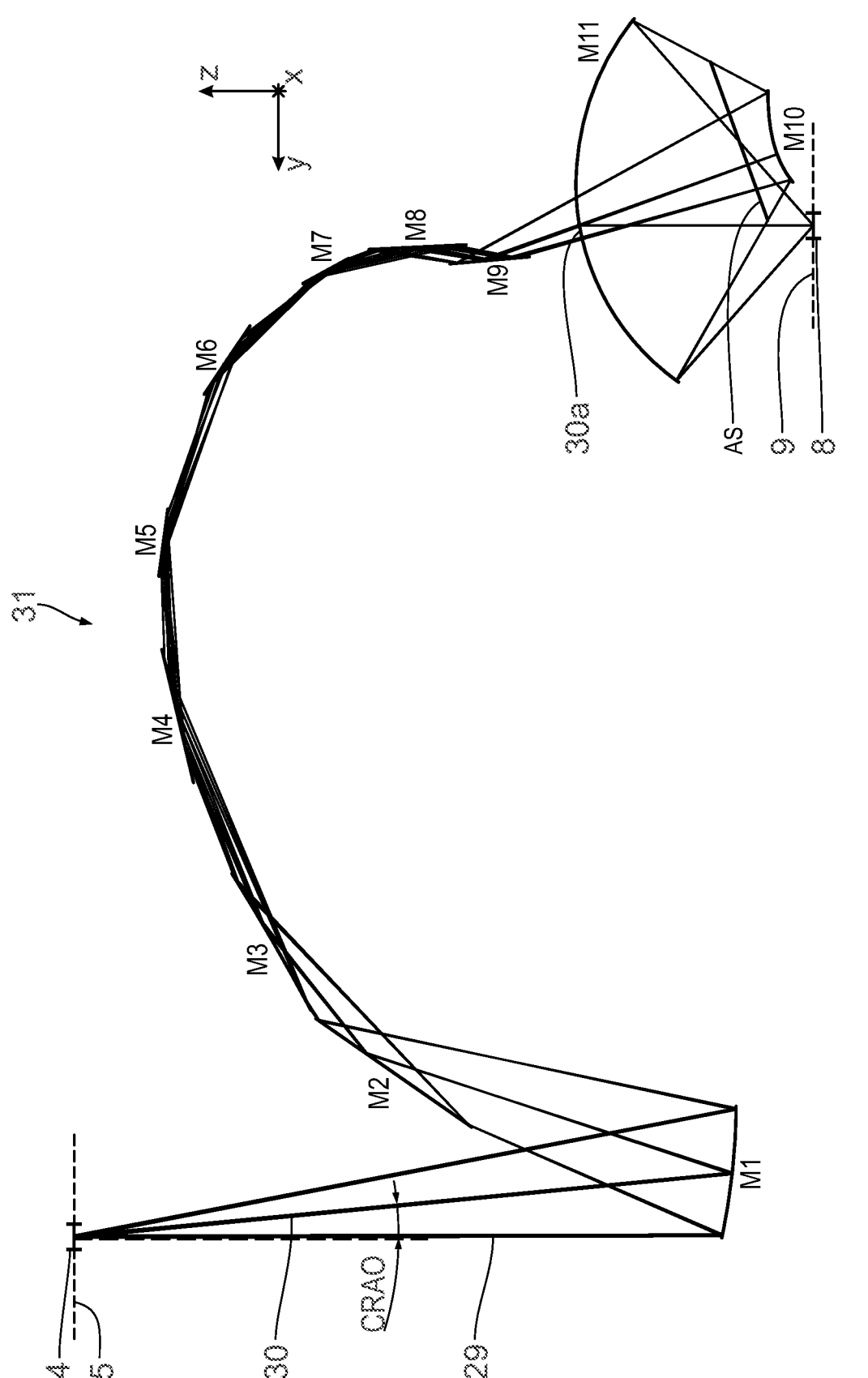
FIG. 24 shows, in an illustration similar to FIG. 7, a further embodiment of an imaging optical unit which is usable as a projection optical unit in the projection exposure apparatus in FIG. 1.
Figures 25, 26, 27, 28, 29, 30:
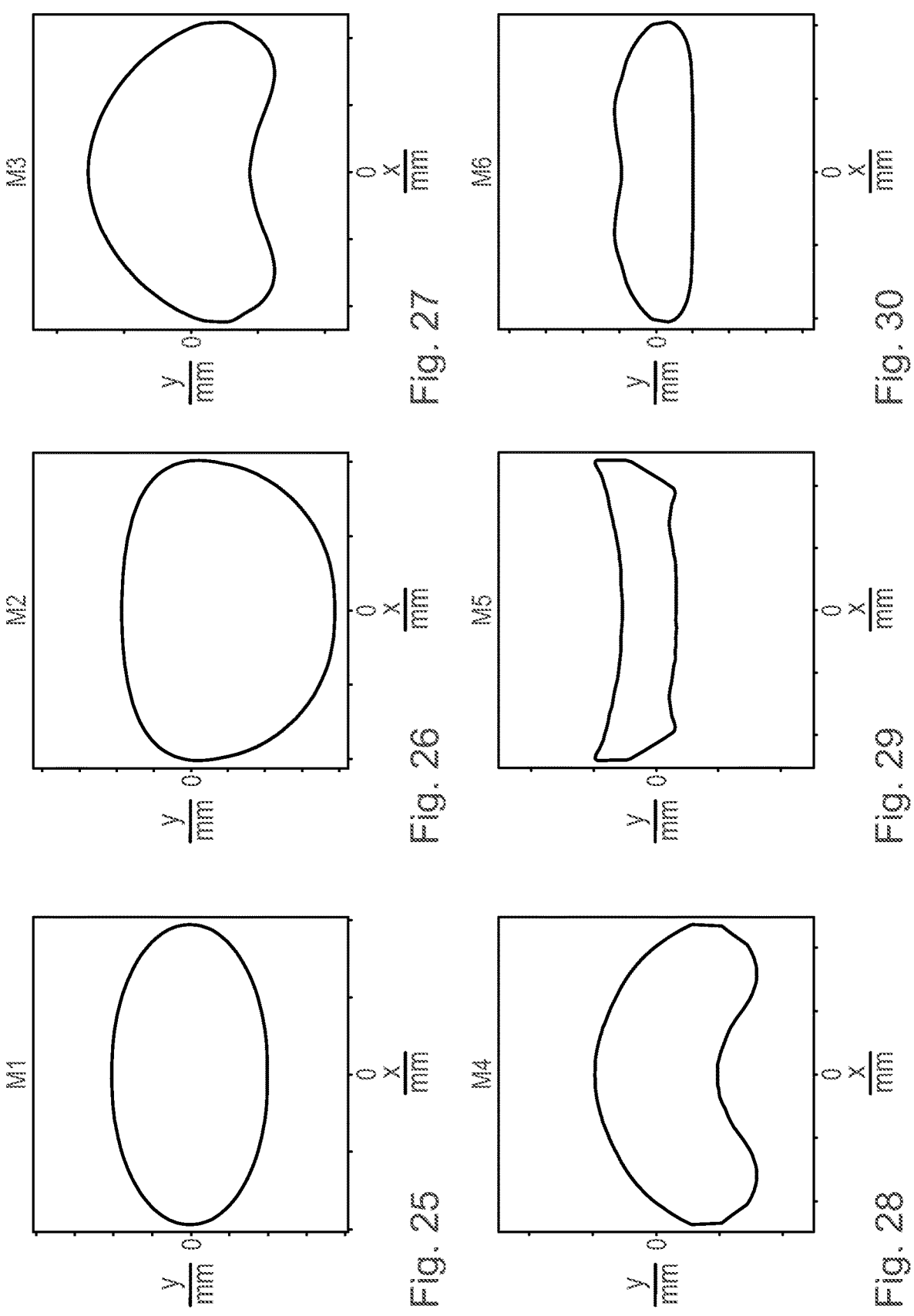
FIGS. 25 to 35 each show plan views of edge contours of used reflection surfaces of the mirrors of the imaging optical unit according to FIG. 24.
Figures 31, 32, 33, 34, 35:
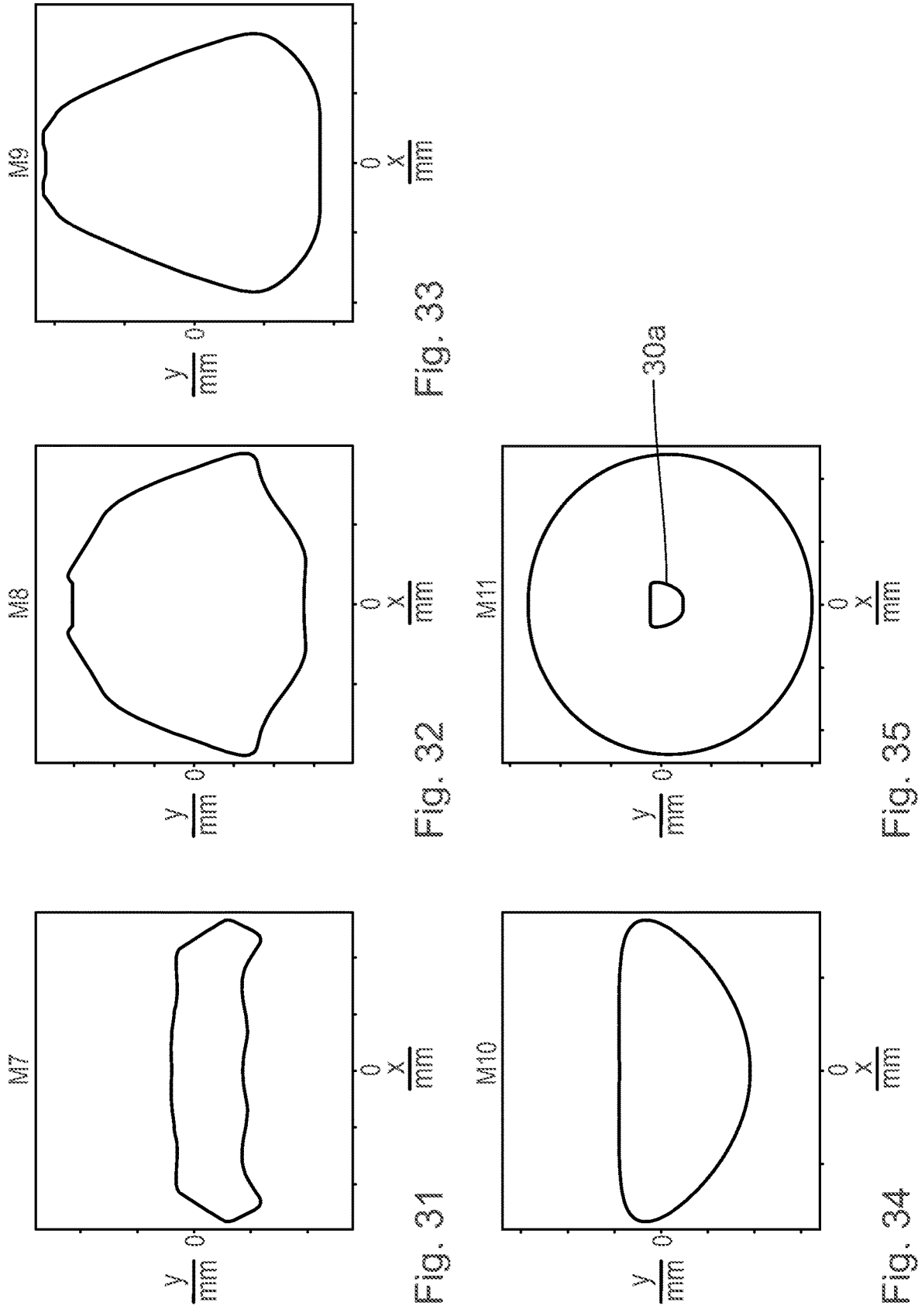
Figures 36, 37, 38, 39, 40, 41:
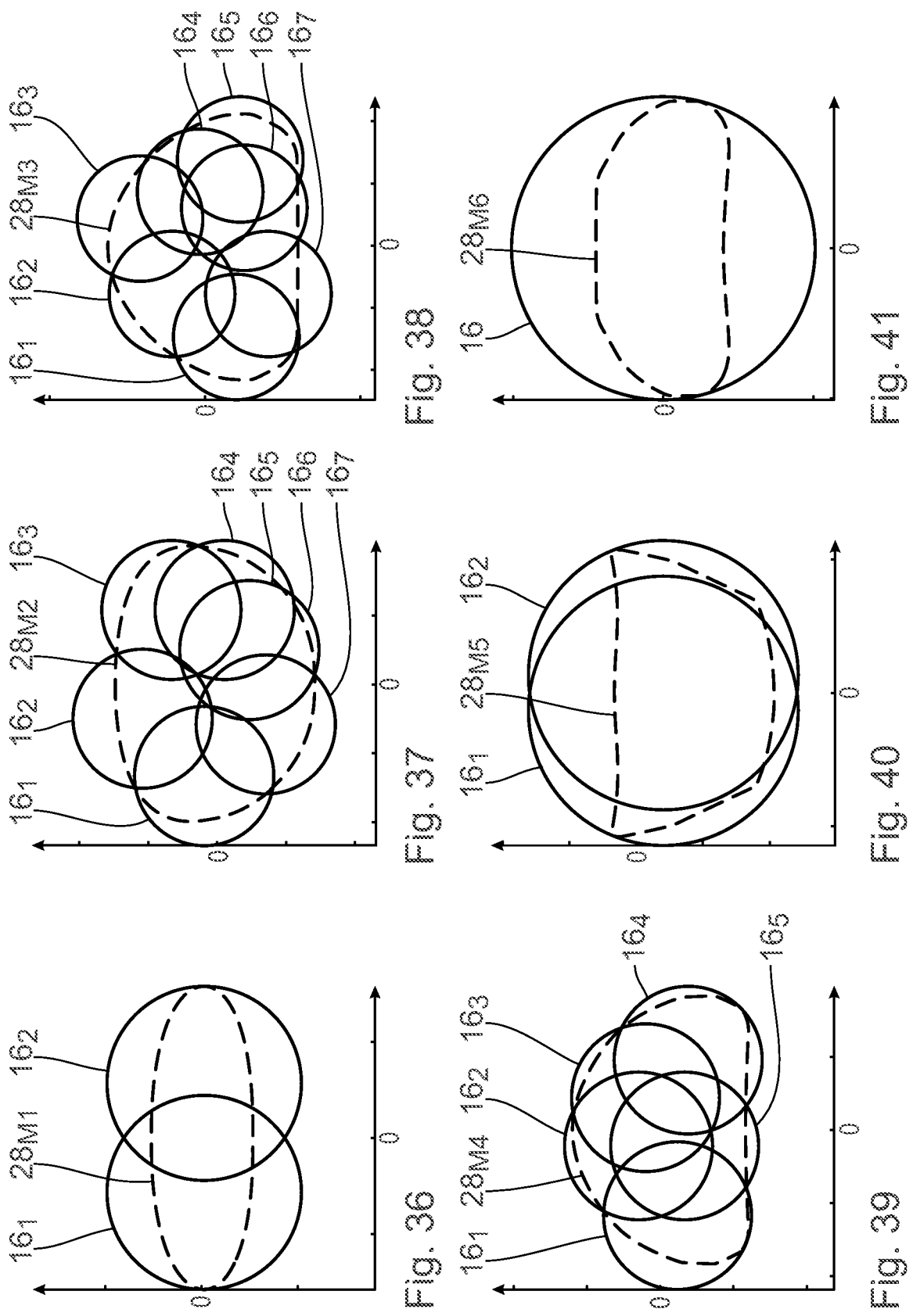
FIGS. 36 to 46 show, in illustrations similar to FIGS. 5 to 6A, beam path cross sections of optimized arrangement planes of the diffractive optical elements of the surface profile measuring device according to FIG. 2, each with a number-optimized coverage by the diffractive optical elements with the given diameter for measuring the mirrors of the imaging optical unit according to FIG. 24.
Figures 42, 43, 44, 45, 46:
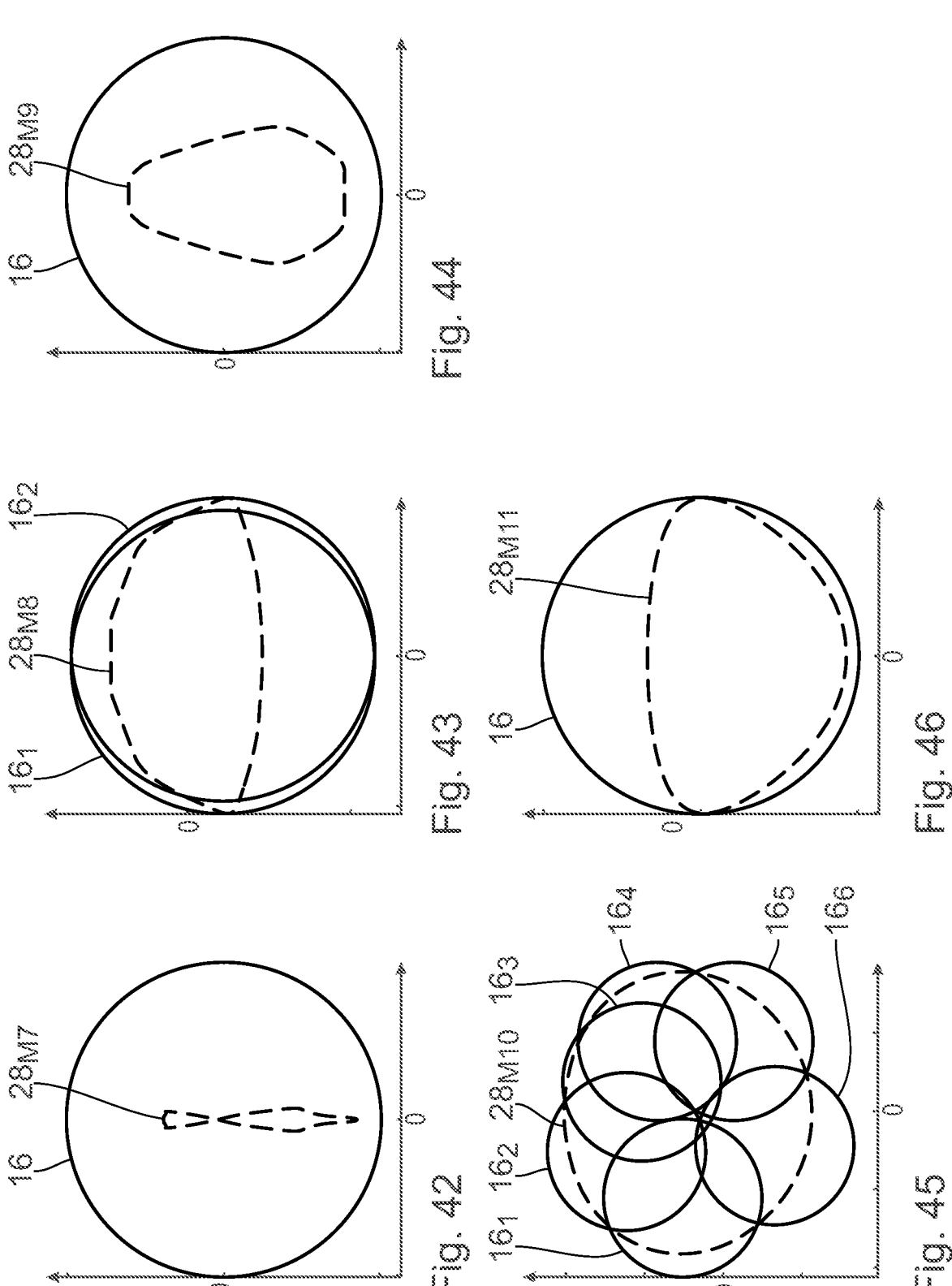

FIG. 24 shows a further embodiment of a projection optical unit or imaging optical unit 31, which can be used in the projection exposure apparatus 1 instead of the projection optical unit 7. Components and functions corresponding to those which have already been explained above with reference to FIGS. 1 to 23 have the same reference signs and will not be discussed in detail again.

The projection optical unit 31 has an image-side numerical aperture of 0.75.

The projection optical unit 31 has a total of eleven mirrors M1 to M11. The mirrors M1, M10 and M11 are embodied as mirrors for normal incidence. The mirrors M2 to M9 are embodied as mirrors for grazing incidence of the illumination light 3. The projection optical unit 31 has exactly eight mirrors for grazing incidence.

The mirrors M2 to M8, that is to say seven of the eight GI mirrors of the projection optical unit 31, reflect the imaging light 3 in such a way that the angles of reflection of the individual rays 29 at the respective mirrors M2 to M8 add up, i.e. lead to an amplification of the deflection effect thereof. The subsequent GI mirror M9 is a so-called counter mirror and reflects the imaging light 3 such that this yields a deflection effect directed against the deflection effect of the mirrors M2 to M8, that is to say this has a subtractive effect on the deflection effect of the GI mirrors M2 to M8. In accordance with the rules for the surrounding effects of the mirrors, which are specified in the context of the explanations regarding the projection optical unit in DE 10 2019 219 209 A1, the projection optical unit 31 has the following sequence of deflecting effects for the mirrors M1 to M11: RLLLLLLLR0L:

The projection optical unit 31 is approximately telecentric on the object side. If the imaging beam path is only taken into account in relation to the individual rays that pass through the object field 4, the entrance pupil is located 4001.06 mm downstream of the object field 4 in the xz-plane and 6466.33 mm downstream of the object field 4 in the yz-plane.

The projection optical unit 31 has a pupil plane in the beam path between the mirrors M1 and M2. An intermediate image plane is located in the region of a reflection on the mirror M5. A further pupil plane is located between the mirrors M5 and M6 in the imaging light beam path. A further intermediate image plane is located between the mirrors M6 and M7. The number of intermediate image planes differs from the number of intermediate images in the meridional plane according to FIG. 24 from the number of intermediate images in a plane perpendicular thereto. Such projection optical units with different numbers of intermediate images in mutually perpendicular planes are known from WO 2016/166080 A1 and DE 10 2015 226 531 A1 as a matter of principle.

The optical design data for the projection optical unit 31 emerge from following Tables 1 to 5, which, in turn, correspond in terms of the basic structure to Tables 1 to 5 relating to the embodiment according to FIG. 7.

Table 1 for FIG. 24
Radii of the surfaces

|  | Radius$_x$ [mm] | Power$_x$ [1/mm] | Radius$_y$ [mm] | Power$_y$ [1/mm] |
|---|---|---|---|---|
| M01 | −5043.37023844 | 0.00038813 | −2042.86166975 | 0.00095822 |
| M02 | −30415.47889237 | 0.00001287 | 26963.82408958 | −0.00001452 |
| M03 | −8486.32405306 | 0.00004763 | 5633.72518157 | −0.00007175 |
| M04 | −5277.47408171 | 0.00004620 | −11734.64283564 | 0.00002078 |
| M05 | −1467.59917784 | 0.00031042 | −3857.10103746 | 0.00011811 |
| M06 | −973.61865002 | 0.00058199 | −1731.71334144 | 0.00032721 |
| M07 | −1924.50822132 | 0.00015276 | −16879.47119438 | 0.00001742 |
| M08 | 6166.26357440 | −0.00008257 | −3537.09214074 | 0.00014394 |
| M09 | −3966.73768242 | 0.00016591 | 1948.22898194 | −0.00033781 |
| M10 | 25483.32557260 | −0.00006840 | 359.56085674 | −0.00484758 |
| M11 | −954.45352800 | 0.00206189 | −777.18598478 | 0.00253218 |

Table 2 for FIG. 24
Decentring (location, angle) the surfaces

| | D$_x$ [mm] | D$_y$ [mm] | D$_z$ [mm] |
|---|---|---|---|
| Reticle | 0.000000000 | 0.000000000 | 0.000000000 |
| M01 | 0.000000000 | 197.140408508 | 2047.381422893 |
| M02 | 0.000000000 | 570.780746017 | 909.549156095 |
| M03 | 0.000000000 | 976.403611864 | 585.426570971 |
| M04 | 0.000000000 | 1607.622418091 | 323.810402777 |
| M05 | 0.000000000 | 2196.231172328 | 281.390843146 |
| M06 | 0.000000000 | 2731.732101857 | 473.978872934 |
| M07 | 0.000000000 | 3002.757211233 | 775.232622615 |
| M08 | 0.000000000 | 3081.039882645 | 1059.350814400 |
| M09 | 0.000000000 | 3041.986439678 | 1277.910150281 |
| M10 | 0.000000000 | 3370.532600948 | 2187.046499371 |
| Stop | 0.000000000 | 3337.532188605 | 2095.752968097 |
| M11 | −0.000000000 | 3148.568109526 | 1572.995922393 |
| Wafer | 0.000000000 | 3148.567979010 | 2300.000590487 |

-continued

| | α$_x$ [°] | α$_y$ [°] | α$_z$ [°] |
|---|---|---|---|
| Reticle | 0.000000000 | 0.000000000 | 0.000000000 |
| M01 | 6.339549673 | 0.000000000 | 0.000000000 |
| M02 | −55.224167225 | 180.000000000 | 0.000000000 |
| M03 | 149.430210289 | 0.000000000 | 0.000000000 |
| M04 | −13.317091330 | 180.000000000 | 0.000000000 |
| M05 | 187.829311144 | 0.000000000 | 0.000000000 |
| M06 | 33.902149793 | 180.000000000 | 0.000000000 |
| M07 | 241.309619348 | 0.000000000 | 0.000000000 |
| M08 | 87.363309364 | 180.000000000 | 0.000000000 |
| M09 | 85.131020296 | 0.000000000 | 0.000000000 |
| M10 | −19.871341113 | 0.000000000 | 180.000000000 |
| Stop | 160.126297478 | −0.000000000 | −0.000000000 |
| M11 | 170.063153882 | −0.000000000 | 0.000000000 |
| Wafer | 0.000010286 | 0.000000000 | 180.000000000 |

Table 3a for FIG. 24
Free-form coefficients of the surfaces

| Coefficient | Formula | M01 | M02 | M03 |
|---|---|---|---|---|
| C7 | x$^2$ y | −1.2741868398e−08 | −1.4819181706e−08 | 1.1295957762e−07 |
| C9 | y$^3$ | −1.9184163301e−08 | 1.0993836744e−08 | −1.6879870366e−08 |
| C10 | x$^4$ | −5.0652957833e−12 | 1.2845429487e−10 | 1.1085897949e−10 |
| C12 | x$^2$ y$^2$ | 8.9461937748e−11 | −1.2363844612e−10 | −5.0886369628e−11 |
| C14 | y$^4$ | −2.0368284638e−11 | −1.5223462064e−11 | −5.0067209640e−11 |
| C16 | x$^4$ y | −7.2468109998e−14 | −1.0885363078e−13 | −2.2834099144e−13 |
| C18 | x$^2$ y$^3$ | −1.2344154720e−13 | −1.8534841755e−13 | −1.6880203405e−13 |
| C20 | y$^5$ | −3.6210262766e−16 | −1.5035596255e−14 | −3.4089256547e−14 |
| C21 | x$^6$ | 1.1439984274e−17 | −6.4842115323e−17 | −3.2360466788e−16 |
| C23 | x$^4$ y$^2$ | −1.4884601952e−17 | −6.9997664309e−17 | −7.7928873452e−17 |
| C25 | x$^2$ y$^4$ | 1.1384372878e−16 | 1.8832826285e−16 | −2.1238435246e−17 |
| C27 | y$^6$ | 7.3627428342e−17 | −2.3566064016e−16 | 2.1514000028e−16 |
| C29 | x$^6$ y | 2.4308604391e−21 | −1.1485613790e−19 | −2.9343431558e−19 |
| C31 | x$^4$ y$^3$ | 1.8637506957e−19 | 3.5416465757e−19 | 1.7996340613e−19 |
| C33 | x$^2$ y$^5$ | −7.8582221425e−19 | −2.1344292037e−19 | 5.3673550749e−19 |
| C35 | y$^7$ | 3.3087289811e−19 | −8.3363669699e−19 | −3.0316225567e−19 |
| C36 | x$^8$ | −2.8770762310e−23 | −1.1609574295e−22 | −3.7650145908e−22 |
| C38 | x$^6$ y$^2$ | −5.2131672621e−22 | −1.3528116535e−21 | 7.9071630361e−22 |
| C40 | x$^4$ y$^4$ | 1.6422080968e−21 | −1.5012077445e−21 | 4.0291179705e−21 |
| C42 | x$^2$ y$^6$ | 9.0616177414e−22 | −1.0683248462e−21 | 2.3739951598e−21 |
| C44 | y$^8$ | −1.3621023978e−20 | −2.8643370712e−21 | 2.7159317416e−22 |
| C46 | x$^8$ y | 2.6714674908e−25 | −7.4611966222e−25 | 7.5680577607e−25 |
| C48 | x$^6$ y$^3$ | −1.0401759038e−24 | 1.6001444733e−23 | 4.5018293915e−24 |
| C50 | x$^4$ y$^5$ | 1.7160347562e−24 | 2.5305794560e−23 | 2.5940609257e−24 |
| C52 | x$^2$ y$^7$ | 5.7684575220e−24 | 7.3435934462e−24 | 3.1521660218e−24 |
| C54 | y$^9$ | −5.7051662721e−23 | −1.4022490726e−23 | −4.6134097295e−24 |
| C55 | x$^{10}$ | 1.1348121831e−27 | −6.1257584556e−28 | 1.8100013129e−27 |
| C57 | x$^8$ y$^2$ | 1.2898656724e−26 | 4.4653393609e−26 | −1.4134009130e−26 |
| C59 | x$^6$ y$^4$ | −1.1601497283e−26 | 7.4922477719e−26 | −7.8450168837e−26 |
| C61 | x$^4$ y$^6$ | −1.6932682227e−25 | 5.7786884461e−26 | −1.5865195643e−25 |
| C63 | x$^2$ y$^8$ | 4.8686431126e−26 | −1.9079857249e−26 | −1.3775612391e−25 |
| C65 | y$^{10}$ | 1.2483436751e−24 | −5.5493346877e−26 | 5.3566038925e−26 |
| C67 | x$^{10}$ y | −3.2431818733e−30 | −1.3648517090e−29 | −6.5559718377e−30 |
| C69 | x$^8$ y$^3$ | 1.3656852798e−29 | −3.7315781690e−28 | −4.3117653242e−29 |
| C71 | x$^6$ y$^5$ | 8.4596512930e−30 | −9.6134628599e−28 | −1.9636736331e−28 |
| C73 | x$^4$ y$^7$ | −3.7678746613e−28 | −9.1704627072e−28 | −2.4933823963e−28 |
| C75 | x$^2$ y$^9$ | 1.2293234710e−27 | −3.2311553077e−28 | 8.2981286899e−29 |
| C77 | y$^{11}$ | 3.3221737408e−27 | −6.4112491603e−29 | −9.8582254924e−29 |
| C78 | x$^{12}$ | −1.8073041303e−32 | 1.7285755266e−32 | −5.3352440389e−33 |
| C80 | x$^{10}$ y$^2$ | −2.5198678710e−31 | −5.6142767966e−31 | 1.3812239726e−31 |
| C82 | x$^8$ y$^4$ | −2.6555315358e−31 | −1.0825672259e−30 | 8.6524158731e−31 |
| C84 | x$^6$ y$^6$ | 5.1877501127e−30 | −6.6939982642e−31 | 2.8114784635e−30 |
| C86 | x$^4$ y$^8$ | 1.2428781666e−29 | −1.6213692295e−30 | 5.3973562552e−30 |
| C88 | x$^2$ y$^{10}$ | −1.5528993552e−29 | 1.4426188229e−31 | 1.9472082937e−30 |
| C90 | y$^{12}$ | −7.0156762408e−29 | 3.5878207265e−31 | −1.0268602888e−30 |
| C92 | x$^{12}$ y | 4.4730314443e−35 | 1.0645390568e−34 | 5.5091541838e−35 |
| C94 | x$^{10}$ y$^3$ | −5.6241771985e−35 | 5.2155310316e−33 | 2.6317765341e−34 |
| C96 | x$^8$ y$^5$ | −5.9699123029e−34 | 1.9895453827e−32 | 2.5791978254e−33 |
| C98 | x$^6$ y$^7$ | 4.4532967339e−33 | 2.9048097100e−32 | 6.9194420639e−33 |
| C100 | x$^4$ y$^9$ | 1.7785329827e−32 | 1.6094144761e−32 | 1.7153070168e−33 |
| C102 | x$^2$ y$^{11}$ | −1.2082092711e−31 | 6.1918052928e−33 | 3.6346899970e−34 |
| C104 | y$^{13}$ | −1.3108338389e−31 | 1.7139069378e−33 | 2.3542132538e−33 |
| C105 | x$^{14}$ | 1.6820745880e−37 | −1.8732269027e−37 | 2.7203983558e−38 |

-continued

Table 3a for FIG. 24
Free-form coefficients of the surfaces

| Coefficient | Formula | M01 | M02 | M03 |
|---|---|---|---|---|
| C107 | $x^{12} y^2$ | 2.9841795030e−36 | 4.2344428013e−36 | −6.7430701811e−37 |
| C109 | $x^{10} y^4$ | 9.5648206744e−36 | 1.1856626758e−35 | −5.5889093660e−36 |
| C111 | $x^8 y^6$ | −5.9164953119e−35 | 5.2707274781e−36 | −2.2672566405e−35 |
| C113 | $x^6 y^8$ | −3.7775800264e−34 | 2.8200851992e−35 | −7.0360801174e−35 |
| C115 | $x^4 y^{10}$ | −4.0800660120e−34 | 5.1163249631e−35 | −8.8909683388e−35 |
| C117 | $x^2 y^{12}$ | 1.1769869152e−33 | 1.5304213660e−35 | −1.4992570218e−35 |
| C119 | $y^{14}$ | 2.5172104320e−33 | 3.7667630899e−36 | 1.4431872155e−35 |
| C121 | $x^{14} y$ | −3.5331856073e−40 | 5.6140627314e−41 | −2.7574517385e−40 |
| C123 | $x^{12} y^3$ | −1.5102144535e−40 | −3.7921870405e−38 | −6.3592289662e−40 |
| C125 | $x^{10} y^5$ | 5.5387488199e−39 | −2.0814406049e−37 | −1.3567706294e−38 |
| C127 | $x^8 y^7$ | −1.4756784321e−38 | −4.6696106276e−37 | −7.5749541500e−38 |
| C129 | $x^6 y^9$ | −2.4332468576e−37 | −3.3590181319e−37 | −1.0876172013e−37 |
| C131 | $x^4 y^{11}$ | −2.1890495220e−37 | −6.7937677839e−38 | 1.8314326740e−38 |
| C133 | $x^2 y^{13}$ | 4.9969106032e−36 | 7.1054536278e−39 | −5.2684189671e−38 |
| C135 | $y^{15}$ | 2.7954336278e−36 | 4.3096333755e−39 | −2.3588225429e−38 |
| C136 | $x^{16}$ | −9.3058845881e−43 | 1.8123904160e−42 | −2.9384146135e−43 |
| C138 | $x^{14} y^2$ | −2.0384117753e−41 | −1.8789437367e−41 | 2.0364045001e−42 |
| C140 | $x^{12} y^4$ | −1.1111637237e−40 | −8.5982134104e−41 | 2.0187024932e−41 |
| C142 | $x^{10} y^6$ | 2.2561297775e−40 | −1.4722583120e−40 | 9.2403669179e−41 |
| C144 | $x^8 y^8$ | 3.9631205750e−39 | −3.5685442702e−40 | 3.4004695196e−40 |
| C146 | $x^6 y^{10}$ | 1.2115697723e−38 | −6.4428123192e−40 | 9.5559409160e−40 |
| C148 | $x^4 y^{12}$ | 4.4104016490e−39 | −6.1227257779e−40 | 6.7814833904e−40 |
| C150 | $x^2 y^{14}$ | −4.2337879319e−38 | −2.3076034648e−41 | 1.4683779697e−40 |
| C152 | $y^{16}$ | −5.3855525075e−38 | −2.2165301483e−42 | −1.6082780369e−40 |
| C154 | $x^{16} y$ | 1.3707620876e−45 | −2.7070616473e−45 | 8.7545305519e−46 |
| C156 | $x^{14} y^3$ | 2.4985729503e−45 | 1.3769734404e−43 | −3.8619902042e−46 |
| C158 | $x^{12} y^5$ | −2.5853304876e−44 | 1.0544053868e−42 | 1.3510808797e−44 |
| C160 | $x^{10} y^7$ | 6.3259313789e−46 | 3.4466149943e−42 | 3.2487022585e−43 |
| C162 | $x^8 y^9$ | 8.1712379355e−43 | 3.8436821619e−42 | 1.1050304602e−42 |
| C164 | $x^6 y^{11}$ | 4.6454559936e−42 | 8.0905407649e−43 | 5.0234922992e−43 |
| C166 | $x^4 y^{13}$ | −4.3373633177e−42 | −9.4728077455e−43 | 1.1611786734e−43 |
| C168 | $x^2 y^{15}$ | −9.8163807075e−41 | −6.3335848309e−44 | 3.9731153967e−43 |
| C170 | $y^{17}$ | −2.7564045251e−41 | −1.2781632060e−44 | 2.1553606641e−43 |
| C171 | $x^{18}$ | 2.8457339168e−48 | −9.0410527124e−48 | 1.1488079593e−48 |
| C173 | $x^{16} y^2$ | 7.4400779220e−47 | 4.3830526911e−47 | −3.9515818091e−48 |
| C175 | $x^{14} y^4$ | 5.7054927205e−46 | 3.4643567303e−46 | −4.3399206369e−47 |
| C177 | $x^{12} y^6$ | 4.2628529512e−46 | 1.5565705242e−45 | −2.3171709938e−46 |
| C179 | $x^{10} y^8$ | −1.6775907620e−44 | 4.1485463397e−45 | −3.6040615083e−46 |
| C181 | $x^8 y^{10}$ | −9.2165567448e−44 | 4.7009721582e−45 | −2.8687049919e−45 |
| C183 | $x^6 y^{12}$ | −1.7891845956e−43 | 4.0996691970e−45 | −5.2263182565e−45 |
| C185 | $x^4 y^{14}$ | 4.8966408481e−44 | 1.5763443633e−45 | −2.9325381249e−45 |
| C187 | $x^2 y^{16}$ | 7.5360793693e−43 | −4.7168113909e−47 | −7.9015409186e−46 |
| C189 | $y^{18}$ | 6.1547572101e−43 | −1.0260235370e−47 | 9.5867819174e−46 |
| C191 | $x^{18} y$ | −2.0587001589e−51 | 7.0595956406e−51 | −1.3203077947e−51 |
| C193 | $x^{16} y^3$ | −7.0194713306e−51 | −1.9434986024e−49 | 2.6370585575e−51 |
| C195 | $x^{14} y^5$ | 5.9203086220e−50 | −2.0798495304e−48 | 6.9142773517e−50 |
| C197 | $x^{12} y^7$ | 4.9919523584e−50 | −9.3247134492e−48 | −3.8785383967e−49 |
| C199 | $x^{10} y^9$ | −5.6301228005e−49 | −1.5932461778e−47 | −3.0208696243e−48 |
| C201 | $x^8 y^{11}$ | −7.9900319804e−48 | −8.2452760069e−48 | −4.2680525576e−48 |
| C203 | $x^6 y^{13}$ | −2.2138325112e−47 | 8.2918476065e−48 | −1.0513531962e−48 |
| C205 | $x^4 y^{15}$ | 9.6822880110e−47 | 6.8680058869e−48 | −1.9860634023e−48 |
| C207 | $x^2 y^{17}$ | 7.3944652171e−46 | 1.3575741255e−49 | 1.7159025459e−50 |
| C209 | $y^{19}$ | 7.8903362989e−47 | −6.4828617205e−51 | −1.6731653324e−48 |
| C210 | $x^{20}$ | −3.6997869672e−54 | 1.6103206414e−53 | −1.5051543494e−54 |
| C212 | $x^{18} y^2$ | −1.1258659144e−52 | −3.6574838915e−53 | 3.5397391185e−54 |
| C214 | $x^{16} y^4$ | −1.1065785937e−51 | −5.7734875552e−52 | 5.8581535845e−53 |
| C216 | $x^{14} y^6$ | −3.3200555031e−51 | −4.9904843726e−51 | 4.6744791738e−52 |
| C218 | $x^{12} y^8$ | 2.1706915974e−50 | −1.7731134617e−50 | −7.0478430615e−52 |
| C220 | $x^{10} y^{10}$ | 2.1597222382e−49 | −2.4993374762e−50 | −3.5104364078e−52 |
| C222 | $x^8 y^{12}$ | 7.3412490302e−49 | −1.0954673029e−50 | 6.2391791402e−51 |
| C224 | $x^6 y^{14}$ | 9.3482501931e−49 | 8.0941281473e−51 | 9.7733880161e−51 |
| C226 | $x^4 y^{16}$ | −1.0629945009e−48 | 6.2758507426e−51 | 7.2176235176e−51 |
| C228 | $x^2 y^{18}$ | −5.2950748510e−48 | 1.9592009934e−52 | −1.0091955636e−51 |
| C230 | $y^{20}$ | −2.8334862451e−48 | −1.2107464014e−53 | −7.3601477295e−53 |

Table 3b for FIG. 24

| Coefficient | Formula | M04 | M05 | M06 |
|---|---|---|---|---|
| C7 | $x^2 y$ | −4.8025678767e−08 | 1.4389539524e−07 | −1.3672417366e−07 |
| C9 | $y^3$ | 1.0625847178e−08 | 1.7266473550e−07 | 9.7745473980e−08 |

-continued

| | | Table 3b for FIG. 24 | | |
|---|---|---|---|---|
| Coefficient | Formula | M04 | M05 | M06 |
| C10 | $x^4$ | −6.0604081624e−12 | −8.8653242315e−11 | 1.3556415481e−11 |
| C12 | $x^2 y^2$ | 1.2213973056e−11 | −2.7037708117e−10 | 3.1050599922e−10 |
| C14 | $y^4$ | −3.3278065740e−11 | −5.5502731293e−11 | 2.3782195227e−10 |
| C16 | $x^4 y$ | 4.8327950447e−14 | 1.4841568691e−13 | −1.9157398868e−14 |
| C18 | $x^2 y^3$ | −2.7878880873e−14 | 1.5792574639e−14 | 1.2190894935e−13 |
| C20 | $y^5$ | 2.3755329816e−14 | −1.1664598498e−13 | 1.3542296260e−13 |
| C21 | $x^6$ | −2.2816664426e−16 | 1.6320277133e−17 | 7.2119424668e−17 |
| C23 | $x^4 y^2$ | −5.1052347610e−18 | 1.6428867584e−17 | −2.1057206300e−16 |
| C25 | $x^2 y^4$ | 2.7248202711e−17 | 4.4242554168e−16 | −1.8870434687e−15 |
| C27 | $y^6$ | −9.2667824469e−17 | 4.8991401299e−16 | 2.4300986257e−15 |
| C29 | $x^6 y$ | −5.4438667227e−20 | 1.8574212569e−19 | −3.6514374528e−19 |
| C31 | $x^4 y^3$ | 6.0293306702e−20 | −6.3477648706e−19 | −5.4027364515e−19 |
| C33 | $x^2 y^5$ | −1.9737058795e−19 | −1.5987830910e−18 | −7.8977520540e−18 |
| C35 | $y^7$ | 1.4139291631e−19 | −1.6217937724e−18 | −1.3048700069e−17 |
| C36 | $x^8$ | −1.0996111909e−22 | 6.8721581330e−23 | 1.2399686880e−22 |
| C38 | $x^6 y^2$ | 6.1013394207e−23 | 4.5391991400e−22 | −1.0875862047e−21 |
| C40 | $x^4 y^4$ | −5.2498963770e−22 | 9.7330780478e−22 | −7.2184337159e−22 |
| C42 | $x^2 y^6$ | 4.3733824110e−22 | 7.4648192482e−21 | −4.5183939760e−20 |
| C44 | $y^8$ | 3.2469041284e−22 | 1.1100685020e−20 | 2.0699633075e−20 |
| C46 | $x^8 y$ | −1.5101064213e−25 | −2.9792451067e−25 | −1.4428024255e−24 |
| C48 | $x^6 y^3$ | −1.3988015196e−24 | 2.5878953176e−24 | 1.5156563243e−23 |
| C50 | $x^4 y^5$ | −5.8959032872e−25 | −1.5646013899e−24 | 2.7983741486e−22 |
| C52 | $x^2 y^7$ | −1.6238995950e−24 | 1.6258954683e−23 | 2.0954797440e−21 |
| C54 | $y^9$ | −2.0956125197e−24 | 1.4494064686e−23 | 9.5688720846e−21 |
| C55 | $x^{10}$ | 1.4623819808e−27 | −8.0283670021e−28 | −2.2858000741e−27 |
| C57 | $x^8 y^2$ | −1.1989069648e−27 | −2.7776998564e−27 | 7.4426312326e−27 |
| C59 | $x^6 y^4$ | −1.8003069368e−28 | −4.4483838365e−27 | 3.4916710208e−25 |
| C61 | $x^4 y^6$ | −6.0408655936e−27 | −1.1189732002e−25 | 3.6001205383e−24 |
| C63 | $x^2 y^8$ | −2.8943331096e−26 | −8.2318639770e−25 | 6.6172353967e−24 |
| C65 | $y^{10}$ | −3.0567456188e−26 | −1.4578699932e−24 | −5.8100938291e−24 |
| C67 | $x^{10} y$ | 1.0728946292e−30 | 2.7018048337e−30 | −8.7806240051e−30 |
| C69 | $x^8 y^3$ | 2.1109544738e−30 | −9.6681344235e−30 | −4.0731022051e−28 |
| C71 | $x^6 y^5$ | 7.9708367784e−30 | 1.1113584318e−28 | −7.7163557193e−27 |
| C73 | $x^4 y^7$ | −5.5263550120e−29 | 8.7671453365e−28 | −6.6302797501e−26 |
| C75 | $x^2 y^9$ | −4.1156063574e−29 | 5.1172912443e−27 | −5.7598914948e−25 |
| C77 | $y^{11}$ | −2.0333349942e−30 | 1.8457481996e−26 | −2.2977041637e−24 |
| C78 | $x^{12}$ | 1.1909352511e−33 | 7.4914712145e−34 | 2.0056574900e−32 |
| C80 | $x^{10} y^2$ | 6.9897714625e−33 | −5.7924669001e−33 | −1.4957294673e−31 |
| C82 | $x^8 y^4$ | −8.1886943881e−33 | 2.4589568451e−32 | −7.0817463929e−30 |
| C84 | $x^6 y^6$ | −1.1715752064e−31 | 2.4621630015e−31 | −1.0432604349e−28 |
| C86 | $x^4 y^8$ | 2.3474984808e−32 | 7.4447956123e−31 | −6.4599491066e−28 |
| C88 | $x^2 y^{10}$ | 5.2843044349e−31 | −9.7104741676e−30 | −1.3521861515e−28 |
| C90 | $y^{12}$ | 8.4616264305e−31 | −5.9669993437e−29 | 1.5094637607e−27 |
| C92 | $x^{12} y$ | 1.0727884118e−36 | −6.0126372957e−36 | 3.4276629980e−34 |
| C94 | $x^{10} y^3$ | −4.9827392931e−35 | −3.8465713442e−35 | 4.5042418595e−33 |
| C96 | $x^8 y^5$ | −3.9932948106e−34 | −1.3111285559e−33 | 1.2588784055e−31 |
| C98 | $x^6 y^7$ | 1.4458307077e−34 | −7.9065941782e−33 | 1.3309550623e−30 |
| C100 | $x^4 y^9$ | 1.2975870926e−33 | −1.3129056891e−32 | 1.1088424250e−29 |
| C102 | $x^2 y^{11}$ | 2.5828094640e−33 | −1.0437931825e−31 | 9.1976840955e−29 |
| C104 | $y^{13}$ | 1.6486118199e−33 | −1.2725447782e−31 | 3.0552187947e−28 |
| C105 | $x^{14}$ | −2.7797610244e−38 | −5.4616954773e−39 | −4.3337339971e−38 |
| C107 | $x^{12} y^2$ | −1.6283018019e−37 | 1.9448639136e−37 | 2.3273303282e−36 |
| C109 | $x^{10} y^4$ | −3.0549834242e−37 | 3.9098820361e−37 | 7.7098939589e−35 |
| C111 | $x^8 y^6$ | 2.9226624965e−37 | 5.8672790820e−36 | 1.5306669592e−33 |
| C113 | $x^6 y^8$ | 4.3352907715e−36 | 3.6845025042e−35 | 1.5261124919e−32 |
| C115 | $x^4 y^{10}$ | 5.0347585694e−36 | −4.4217093830e−35 | 6.3182654945e−32 |
| C117 | $x^2 y^{12}$ | −2.6654412356e−36 | 1.0766374581e−33 | −6.6907916891e−32 |
| C119 | $y^{14}$ | −1.2791516843e−35 | −1.3826240590e−33 | −4.5997441197e−31 |
| C121 | $x^{14} y$ | −9.6626691508e−41 | −7.6889975382e−41 | −2.5311014454e−39 |
| C123 | $x^{12} y^3$ | 5.2298421712e−41 | 4.0810646821e−40 | −2.3419080252e−38 |
| C125 | $x^{10} y^5$ | 2.3378609613e−39 | 4.8931661453e−39 | −1.0971619767e−36 |
| C127 | $x^8 y^7$ | 6.6695138771e−39 | 1.0178398234e−38 | −1.5937467028e−35 |
| C129 | $x^6 y^9$ | 3.3373129625e−39 | −1.3016976532e−37 | −1.3238169660e−34 |
| C131 | $x^4 y^{11}$ | 1.0196292940e−39 | 1.4079158144e−38 | −1.1279795226e−33 |
| C133 | $x^2 y^{13}$ | −5.0206257031e−38 | −1.4179676012e−36 | −8.2894166547e−33 |
| C135 | $y^{15}$ | −4.3253431001e−38 | 1.2169205777e−35 | −2.4458436729e−32 |
| C136 | $x^{16}$ | 4.5171524900e−44 | 1.1703530985e−43 | −4.8538909013e−43 |
| C138 | $x^{14} y^2$ | 9.6200314032e−43 | −1.2201756715e−42 | −1.6211646695e−41 |
| C140 | $x^{12} y^4$ | 2.4639923110e−42 | −4.5733680382e−42 | −4.7606139448e−40 |
| C142 | $x^{10} y^6$ | 1.1273631295e−41 | −5.1611255493e−41 | −1.2828276962e−38 |
| C144 | $x^8 y^8$ | −1.7777457196e−41 | −2.1634280035e−41 | −1.6606057519e−37 |
| C146 | $x^6 y^{10}$ | −6.2923933882e−41 | 3.5501132359e−41 | −1.2610734358e−36 |
| C148 | $x^4 y^{12}$ | −7.0097565030e−41 | 3.2696027596e−39 | −3.3368615732e−36 |
| C150 | $x^2 y^{14}$ | −8.7648018463e−41 | 2.0223044052e−39 | 1.0060508777e−35 |
| C152 | $y^{16}$ | 7.1440952420e−41 | 1.1614816198e−38 | 6.7164213856e−35 |

-continued

| | | Table 3b for FIG. 24 | | |
|---|---|---|---|---|
| Coefficient | Formula | M04 | M05 | M06 |
| C154 | $x^{16}\,y$ | 4.8521065900e−46 | 5.9276549336e−46 | 6.4923879991e−45 |
| C156 | $x^{14}\,y^3$ | 1.8108550880e−45 | 1.3331424237e−47 | 4.5431109549e−44 |
| C158 | $x^{12}\,y^5$ | 2.2933119641e−45 | 1.5577253372e−44 | 4.6992813341e−42 |
| C160 | $x^{10}\,y^7$ | −3.3992590035e−44 | 1.1819615845e−44 | 9.4748180681e−41 |
| C162 | $x^{8}\,y^9$ | −9.6423596974e−44 | 8.9092543628e−43 | 9.5687929046e−40 |
| C164 | $x^{6}\,y^{11}$ | −3.1754541452e−43 | −2.1257385088e−42 | 6.9912360736e−39 |
| C166 | $x^{4}\,y^{13}$ | −2.2425969994e−43 | −2.4764145481e−42 | 6.2626709586e−38 |
| C168 | $x^{2}\,y^{15}$ | 2.3361005665e−43 | −1.3345295915e−40 | 3.9397332622e−37 |
| C170 | $y^{17}$ | 4.5641977577e−43 | −2.1388128419e−41 | 1.1170039376e−36 |
| C171 | $x^{18}$ | 3.5977705014e−50 | −4.7061684127e−49 | 2.7394935115e−48 |
| C173 | $x^{16}\,y^2$ | −2.0889836899e−48 | 2.7072157285e−48 | 4.3691482696e−47 |
| C175 | $x^{14}\,y^4$ | −2.7606658056e−48 | 7.9700889434e−48 | 1.4960267733e−45 |
| C177 | $x^{12}\,y^6$ | −7.0611165855e−47 | 1.1815951383e−46 | 5.7878782376e−44 |
| C179 | $x^{10}\,y^8$ | −7.7937394107e−47 | −1.3502507299e−46 | 9.1916142607e−43 |
| C181 | $x^{8}\,y^{10}$ | −1.2568873747e−46 | −1.7028866685e−45 | 9.2781245328e−42 |
| C183 | $x^{6}\,y^{12}$ | −5.3087267763e−46 | −6.8644522124e−46 | 5.2850872324e−41 |
| C185 | $x^{4}\,y^{14}$ | −5.2127763954e−46 | 1.7487286763e−44 | 8.1862522344e−41 |
| C187 | $x^{2}\,y^{16}$ | 1.1726783409e−45 | −3.0634584652e−44 | −6.6542577047e−40 |
| C189 | $y^{18}$ | 1.9738789157e−46 | 2.3252359373e−45 | −4.4976216181e−39 |
| C191 | $x^{18}\,y$ | −8.2248377907e−52 | −1.1431956881e−51 | −3.7404764234e−51 |
| C193 | $x^{16}\,y^3$ | −7.8544535975e−51 | −3.5014580741e−51 | 3.3421956002e−51 |
| C195 | $x^{14}\,y^5$ | −4.9326147367e−50 | −8.1768221945e−50 | −7.7237451724e−48 |
| C197 | $x^{12}\,y^7$ | −9.6942373108e−50 | −2.5476028386e−49 | −2.1297702621e−46 |
| C199 | $x^{10}\,y^9$ | −4.3960068690e−50 | −1.2756493649e−49 | −2.7601040441e−45 |
| C201 | $x^{8}\,y^{11}$ | 2.8889667664e−49 | 8.8443761939e−49 | −2.1645305460e−44 |
| C203 | $x^{6}\,y^{13}$ | −5.7548870393e−49 | −2.9592524545e−47 | −1.5921092463e−43 |
| C205 | $x^{4}\,y^{15}$ | −9.4537403519e−49 | 5.4370746779e−46 | −1.4227142912e−42 |
| C207 | $x^{2}\,y^{17}$ | 1.9260445572e−48 | 6.0730203347e−46 | −7.7424913361e−42 |
| C209 | $y^{19}$ | −1.5714649143e−48 | −2.8721939092e−47 | −2.2395184274e−41 |
| C210 | $x^{20}$ | −9.6507190360e−56 | 6.0475468659e−55 | −3.7974898739e−54 |
| C212 | $x^{18}\,y^2$ | 3.5097355334e−55 | −1.0071821253e−54 | −2.6218505183e−53 |
| C214 | $x^{16}\,y^4$ | −2.5476749021e−53 | 1.3148765025e−53 | −1.7481600420e−51 |
| C216 | $x^{14}\,y^6$ | −1.0486851626e−53 | 9.6826498134e−53 | −1.0686650591e−49 |
| C218 | $x^{12}\,y^8$ | −1.0013401555e−52 | 1.3483472303e−52 | −2.0723139893e−48 |
| C220 | $x^{10}\,y^{10}$ | 1.9070649861e−52 | 5.6645715145e−52 | −2.5368720845e−47 |
| C222 | $x^{8}\,y^{12}$ | 3.3059792089e−52 | 2.7839185145e−50 | −1.9785476007e−46 |
| C224 | $x^{6}\,y^{14}$ | −4.0161094642e−52 | −1.9765520074e−49 | −8.9371557120e−46 |
| C226 | $x^{4}\,y^{16}$ | −7.4292770920e−52 | −4.3708654390e−49 | −2.8711239142e−46 |
| C228 | $x^{2}\,y^{18}$ | 1.2373927292e−51 | −1.2171805623e−48 | 1.7160602813e−44 |
| C230 | $y^{20}$ | −2.0816607358e−51 | 1.0535594055e−50 | 1.1594561261e−43 |

| | | Table 3c for FIG. 24 | | |
|---|---|---|---|---|
| Coefficient | Formula | M07 | M08 | M09 |
| C7 | $x^{2}\,y$ | −1.7224057428e−08 | 2.0665071135e−07 | −1.3011488342e−08 |
| C9 | $y^3$ | −1.0109390036e−07 | 1.4709925716e−07 | −5.6938396913e−07 |
| C10 | $x^4$ | −1.5932842728e−10 | −3.0226799607e−10 | 1.9509767370e−10 |
| C12 | $x^{2}\,y^2$ | 4.5339212082e−10 | −8.0347905837e−12 | 5.3037193458e−12 |
| C14 | $y^4$ | 1.4269000201e−09 | −4.9042892576e−10 | 3.2757176326e−09 |
| C16 | $x^{4}\,y$ | 1.8404261345e−12 | −1.5126574087e−13 | 6.8238519428e−13 |
| C18 | $x^{2}\,y^3$ | 3.6705743661e−12 | 2.5546083927e−12 | −5.6740419820e−12 |
| C20 | $y^5$ | −8.5793081386e−12 | 1.7042445001e−12 | −1.8386043051e−11 |
| C21 | $x^6$ | 1.0866353515e−15 | −1.5804427649e−16 | 3.3768736220e−15 |
| C23 | $x^{4}\,y^2$ | −8.0628658734e−17 | −4.4114085913e−15 | 1.0757943667e−14 |
| C25 | $x^{2}\,y^4$ | −3.9916054581e−14 | −4.0891087562e−15 | 4.4277959782e−15 |
| C27 | $y^6$ | 3.0166502165e−14 | −7.0953909637e−15 | 1.2695258567e−13 |
| C29 | $x^{6}\,y$ | −5.9873357656e−18 | −7.5950402523e−19 | −1.8065438743e−17 |
| C31 | $x^{4}\,y^3$ | −7.3591064193e−17 | 8.6340120401e−18 | −1.0014127698e−16 |
| C33 | $x^{2}\,y^5$ | 1.6580549448e−16 | 3.6271901713e−17 | −1.9449109556e−16 |
| C35 | $y^7$ | −3.4798238210e−16 | 2.9309937869e−17 | −8.3474136204e−16 |
| C36 | $x^8$ | −9.6939020734e−21 | 6.3682478858e−20 | −2.4257145601e−18 |
| C38 | $x^{6}\,y^2$ | −3.7041914369e−20 | −8.0421388403e−20 | −3.6497554163e−18 |
| C40 | $x^{4}\,y^4$ | 5.5572070389e−19 | −1.1942095710e−19 | −2.0510090998e−18 |
| C42 | $x^{2}\,y^6$ | −1.4084277609e−18 | −1.2326257998e−19 | 9.8557159293e−19 |
| C44 | $y^8$ | 2.1349783898e−18 | −1.2987507882e−19 | 5.4728586548e−18 |
| C46 | $x^{8}\,y$ | 1.2825104249e−22 | 9.1035186585e−22 | −2.7640502222e−20 |
| C48 | $x^{6}\,y^3$ | 9.8201156861e−22 | −5.5088294347e−22 | 3.4358440735e−20 |
| C50 | $x^{4}\,y^5$ | −3.6190457262e−21 | −1.4213390737e−22 | 5.7623651305e−20 |
| C52 | $x^{2}\,y^7$ | 1.0953332866e−20 | 1.2088607813e−22 | 2.7667287353e−21 |
| C54 | $y^9$ | 3.9900275653e−20 | 2.9744696803e−22 | −3.7937719381e−20 |
| C55 | $x^{10}$ | 2.3922600605e−25 | −8.7004984890e−25 | 7.2209297044e−22 |

Table 3c for FIG. 24

| Coefficient | Formula | M07 | M08 | M09 |
|---|---|---|---|---|
| C57 | $x^8 y^2$ | 1.9054899128e−25 | 1.2197620439e−23 | 1.9079983276e−21 |
| C59 | $x^6 y^4$ | −6.8571452727e−24 | 8.6894920185e−24 | 1.5854109463e−21 |
| C61 | $x^4 y^6$ | −4.1755610007e−24 | −2.1638955139e−24 | 6.9976516020e−22 |
| C63 | $x^2 y^8$ | 1.0143857693e−22 | −8.7536248037e−24 | 1.0343884473e−22 |
| C65 | $y^{10}$ | −5.6533192410e−23 | 5.4929752921e−25 | 4.4381295194e−22 |
| C67 | $x^{10} y$ | −2.7986968076e−27 | −7.7440864108e−26 | 2.3572186315e−23 |
| C69 | $x^8 y^3$ | −9.8169759538e−27 | 1.0562806731e−25 | 6.1419757996e−24 |
| C71 | $x^6 y^5$ | −4.2675912378e−26 | 1.6313326625e−25 | −1.3545915547e−23 |
| C73 | $x^4 y^7$ | 9.7021660398e−27 | 1.5154426687e−25 | −1.6740759512e−23 |
| C75 | $x^2 y^9$ | −7.3175963227e−25 | 2.0243563004e−25 | −2.8607153745e−24 |
| C77 | $y^{11}$ | −6.7341110942e−24 | 1.2680844281e−26 | −3.7229456903e−24 |
| C78 | $x^{12}$ | −3.5740727257e−30 | −1.7831495359e−28 | −9.0087887157e−26 |
| C80 | $x^{10} y^2$ | 7.1946788308e−31 | −1.3732539087e−27 | −3.7528505287e−25 |
| C82 | $x^8 y^4$ | −2.0969278166e−28 | −1.0361274550e−27 | −4.1255021356e−25 |
| C84 | $x^6 y^6$ | 1.0132149185e−27 | −2.7285791667e−28 | −3.7695693416e−25 |
| C86 | $x^4 y^8$ | −1.7446925469e−27 | 3.8207902812e−28 | −9.9510411533e−26 |
| C88 | $x^2 y^{10}$ | −1.1722002116e−26 | 8.1944999958e−29 | 6.7494512734e−27 |
| C90 | $y^{12}$ | 2.7239688935e−27 | −3.1618838519e−28 | −2.4693650645e−26 |
| C92 | $x^{12} y$ | 4.3867915266e−32 | 2.1508045938e−30 | −6.2043966265e−27 |
| C94 | $x^{10} y^3$ | −2.0566438915e−31 | −1.2068364558e−29 | −5.0321474008e−27 |
| C96 | $x^8 y^5$ | 2.3174419435e−30 | −1.9998974290e−29 | −2.9482996021e−28 |
| C98 | $x^6 y^7$ | −1.9503378688e−30 | −1.7822936801e−29 | 2.6858708559e−27 |
| C100 | $x^4 y^9$ | 4.2473710544e−29 | −1.9051012633e−29 | 2.6523568692e−27 |
| C102 | $x^2 y^{11}$ | −1.2908918250e−28 | −1.9990948746e−29 | −1.5936802758e−28 |
| C104 | $y^{13}$ | 6.9858363703e−28 | 2.4684455549e−30 | 3.4292666442e−28 |
| C105 | $x^{14}$ | 3.7515505365e−35 | 1.1575169643e−32 | 4.6930820872e−31 |
| C107 | $x^{12} y^2$ | −5.3900030816e−35 | 7.3081266723e−32 | 2.1908554647e−29 |
| C109 | $x^{10} y^4$ | 7.6639171643e−33 | 5.4657361532e−32 | 2.4156194038e−29 |
| C111 | $x^8 y^6$ | −2.4661583999e−32 | 9.8464680436e−33 | 6.1733697702e−29 |
| C113 | $x^6 y^8$ | 6.6109953354e−32 | −3.3289211898e−32 | 4.6485956640e−29 |
| C115 | $x^4 y^{10}$ | −3.5513670833e−31 | −1.7898551685e−32 | 6.0947923786e−30 |
| C117 | $x^2 y^{12}$ | −1.4417826604e−30 | 2.5258860259e−32 | 3.4035332823e−30 |
| C119 | $y^{14}$ | 3.1463400028e−30 | 1.7918359694e−33 | 8.4956685149e−30 |
| C121 | $x^{14} y$ | −6.6872727252e−37 | 2.6206377439e−35 | 7.4322568175e−31 |
| C123 | $x^{12} y^3$ | 6.3085891289e−36 | 8.0139136220e−34 | 7.0614811170e−31 |
| C125 | $x^{10} y^5$ | −3.3318152546e−35 | 1.3327455969e−33 | 2.6053824405e−31 |
| C127 | $x^8 y^7$ | −1.9105027058e−35 | 1.3454239492e−33 | 5.4016791346e−32 |
| C129 | $x^6 y^9$ | −7.2417414164e−34 | 1.2435524621e−33 | −2.7254410964e−31 |
| C131 | $x^4 y^{11}$ | −8.4684017787e−33 | 1.3079255333e−33 | −2.1977843862e−31 |
| C133 | $x^2 y^{13}$ | 9.8683889579e−33 | 1.2184541736e−33 | 4.2994753781e−32 |
| C135 | $y^{15}$ | −6.6138913364e−33 | −1.6285103837e−34 | −1.0889096993e−31 |
| C136 | $x^{16}$ | −3.4215532077e−40 | −2.9465885612e−37 | 1.0109278782e−33 |
| C138 | $x^{14} y^2$ | −9.7335531930e−40 | −1.5210301598e−36 | 6.6035141764e−34 |
| C140 | $x^{12} y^4$ | −8.5634280204e−38 | −1.6470124500e−37 | 2.0015387437e−33 |
| C142 | $x^{10} y^6$ | −1.1100822982e−37 | 1.4820830362e−36 | −1.8967956017e−33 |
| C144 | $x^8 y^8$ | 1.1697049616e−36 | 1.9967592475e−36 | −4.6572396473e−33 |
| C146 | $x^6 y^{10}$ | −1.0975975007e−35 | 2.9817284932e−36 | −2.7767104548e−33 |
| C148 | $x^4 y^{12}$ | 4.5315420159e−35 | −1.3286320932e−36 | −7.0767764683e−35 |
| C150 | $x^2 y^{14}$ | 1.0272852181e−34 | −3.1576776365e−36 | −8.1019040178e−34 |
| C152 | $y^{16}$ | −6.7061832974e−36 | 5.8751587590e−37 | −5.1504050482e−34 |
| C154 | $x^{16} y$ | 8.3083420344e−42 | −1.9679434889e−39 | −4.2337516647e−35 |
| C156 | $x^{14} y^3$ | −5.1416304751e−41 | −2.3879553746e−38 | −3.0181812957e−35 |
| C158 | $x^{12} y^5$ | −1.8535482814e−40 | −4.4457558446e−38 | 5.4892640958e−36 |
| C160 | $x^{10} y^7$ | 1.6389472689e−39 | −4.6681852798e−38 | −2.2807927345e−35 |
| C162 | $x^8 y^9$ | −3.6663265867e−39 | −5.2186328838e−38 | −4.4636885760e−36 |
| C164 | $x^6 y^{11}$ | 4.5514017960e−38 | −4.0784947240e−38 | 1.0387447308e−35 |
| C166 | $x^4 y^{13}$ | 5.0893322207e−37 | −4.0817534626e−38 | 8.0778620451e−36 |
| C168 | $x^2 y^{15}$ | 2.5611809253e−37 | −3.7295684774e−38 | −9.8579017550e−37 |
| C170 | $y^{17}$ | −4.4001383055e−36 | 4.1364996264e−39 | 1.0046364350e−35 |
| C171 | $x^{18}$ | 2.7915088923e−45 | 3.4347216170e−42 | −9.6862616410e−38 |
| C173 | $x^{16} y^2$ | 5.3765128011e−44 | 4.9396771927e−42 | −4.6597697330e−38 |
| C175 | $x^{14} y^4$ | −1.5887639036e−44 | −6.0806051413e−41 | −1.0002778625e−38 |
| C177 | $x^{12} y^6$ | 7.4364136995e−42 | −1.0643590550e−40 | −1.7425454854e−38 |
| C179 | $x^{10} y^8$ | −4.6023152045e−41 | −1.2527630866e−40 | 8.8480946963e−39 |
| C181 | $x^8 y^{10}$ | 1.4605701126e−41 | −9.7784107430e−41 | 6.4674776908e−38 |
| C183 | $x^6 y^{12}$ | −1.0154002205e−39 | −1.2120863530e−40 | 8.1977871878e−38 |
| C185 | $x^4 y^{14}$ | 1.9738216893e−39 | 8.6699553121e−41 | −4.2193336815e−39 |
| C187 | $x^2 y^{16}$ | 4.2022392775e−39 | 1.2041943206e−40 | 6.0799361154e−38 |
| C189 | $y^{18}$ | −8.6512174393e−38 | −2.6120286880e−41 | 1.8494149763e−38 |
| C191 | $x^{18} y$ | −4.6447957646e−47 | 2.3088502394e−44 | 9.9811673988e−40 |
| C193 | $x^{16} y^3$ | 6.8702255885e−47 | 2.6018761512e−43 | 7.9607054718e−40 |
| C195 | $x^{14} y^5$ | 6.4175386127e−45 | 5.7943102060e−43 | −1.9158114052e−43 |
| C197 | $x^{12} y^7$ | −8.7797418074e−45 | 6.3466779933e−43 | −2.3976481383e−43 |
| C199 | $x^{10} y^9$ | −1.0518945571e−43 | 8.6422805543e−43 | −1.3726395944e−43 |
| C201 | $x^8 y^{11}$ | −2.8854965068e−42 | 7.4419609306e−43 | −6.7579618953e−44 |

-continued

Table 3c for FIG. 24

| Coefficient | Formula | M07 | M08 | M09 |
|---|---|---|---|---|
| C203 | $x^6 y^{13}$ | −2.6954953782e−42 | 5.2805578784e−43 | −2.5569314410e−44 |
| C205 | $x^4 y^{15}$ | −3.0449794129e−42 | 5.5597531262e−43 | −8.1688524133e−41 |
| C207 | $x^2 y^{17}$ | 5.6076187389e−41 | 5.4659883193e−43 | −2.5761923190e−40 |
| C209 | $y^{19}$ | −5.6610471118e−40 | −5.6578095704e−46 | −6.4622023555e−40 |
| C210 | $x^{20}$ | −1.2319343525e−50 | −1.4621924424e−47 | 3.0656719077e−42 |
| C212 | $x^{18} y^2$ | −5.1512244822e−49 | 1.4146461029e−46 | −2.7706734020e−45 |
| C214 | $x^{16} y^4$ | 5.2302065065e−48 | 1.1991561318e−45 | −6.8647913071e−46 |
| C216 | $x^{14} y^6$ | −3.3165722760e−47 | 2.0652442326e−45 | 3.7700441451e−45 |
| C218 | $x^{12} y^8$ | 3.1188735505e−46 | 2.3194805119e−45 | 1.9013808471e−45 |
| C220 | $x^{10} y^{10}$ | −2.6328733821e−45 | 2.7237178119e−45 | 1.0576701007e−45 |
| C222 | $x^8 y^{12}$ | −3.0413810056e−45 | 1.3910749730e−45 | 4.4536515963e−46 |
| C224 | $x^6 y^{14}$ | −5.4723785190e−45 | 2.0759677985e−45 | 2.9715487171e−46 |
| C226 | $x^4 y^{16}$ | −1.5154964780e−44 | −1.8135388196e−45 | 3.4042903298e−46 |
| C228 | $x^2 y^{18}$ | 1.8200880350e−43 | −2.0901687127e−45 | 1.2875940281e−43 |
| C230 | $y^{20}$ | −1.2814102263e−42 | 1.5506268697e−46 | 2.1777293777e−42 |

Table 3d for FIG. 24

| Coefficient | Formula | M10 | M11 |
|---|---|---|---|
| C7 | $x^2 y$ | −1.0496635534e−06 | 5.1289259077e−09 |
| C9 | $y^3$ | 2.2520329727e−06 | −2.3253792018e−08 |
| C10 | $x^4$ | 6.0810428875e−10 | −3.4438692411e−11 |
| C12 | $x^2 y^2$ | −9.5214908407e−10 | −5.2749193599e−11 |
| C14 | $y^4$ | 2.2997576588e−09 | −3.6262042550e−12 |
| C16 | $x^4 y$ | 3.4697107078e−13 | 9.2308520526e−16 |
| C18 | $x^2 y^3$ | −6.2552554797e−12 | −1.7987972015e−14 |
| C20 | $y^5$ | 2.1415305189e−11 | −3.7531114481e−14 |
| C21 | $x^6$ | 6.0354430294e−16 | −2.6416890144e−17 |
| C23 | $x^4 y^2$ | 9.2956195569e−15 | −1.4633660764e−16 |
| C25 | $x^2 y^4$ | −1.1704524177e−14 | −1.1199781212e−16 |
| C27 | $y^6$ | 3.5588298539e−14 | −4.0587037039e−18 |
| C29 | $x^6 y$ | −3.9552562530e−18 | 3.6842804865e−20 |
| C31 | $x^4 y^3$ | −9.0346432250e−18 | −9.3114362802e−21 |
| C33 | $x^2 y^5$ | 1.2744022025e−16 | −7.9764335747e−20 |
| C35 | $y^7$ | −7.8781321664e−17 | −6.1836373732e−20 |
| C36 | $x^8$ | 8.7810658057e−22 | −5.1122733471e−23 |
| C38 | $x^6 y^2$ | 5.5926525700e−20 | −2.4554831831e−22 |
| C40 | $x^4 y^4$ | −2.8225082818e−19 | −4.2121800978e−22 |
| C42 | $x^2 y^6$ | 1.4701153432e−18 | −2.0173631414e−22 |
| C44 | $y^8$ | 1.0298612414e−18 | −7.6716821285e−24 |
| C46 | $x^8 y$ | −5.3279976148e−23 | 3.1143894563e−26 |
| C48 | $x^6 y^3$ | 1.6836595523e−22 | 1.8318229567e−26 |
| C50 | $x^4 y^5$ | −3.4647890382e−21 | −1.2914717123e−25 |
| C52 | $x^2 y^7$ | −4.3705360197e−21 | −1.4573129548e−25 |
| C54 | $y^9$ | 2.2087649882e−20 | −6.5157955425e−26 |
| C55 | $x^{10}$ | −1.1091227548e−26 | −3.6915897743e−29 |
| C57 | $x^8 y^2$ | −1.1791833335e−24 | −3.7478576472e−29 |
| C59 | $x^6 y^4$ | −1.8820242946e−24 | −1.2198510752e−28 |
| C61 | $x^4 y^6$ | −3.1003108546e−24 | −1.2342428856e−28 |
| C63 | $x^2 y^8$ | −1.3523780908e−22 | −1.0607607865e−28 |
| C65 | $y^{10}$ | 1.4082549194e−22 | −3.3812059803e−29 |
| C67 | $x^{10} y$ | 1.0100289193e−27 | −2.4141156767e−32 |
| C69 | $x^8 y^3$ | 1.2502921952e−26 | 3.2608884102e−31 |
| C71 | $x^6 y^5$ | 5.2595866595e−26 | 2.6914820693e−31 |
| C73 | $x^4 y^7$ | 3.9900633341e−25 | −8.0720238197e−31 |
| C75 | $x^2 y^9$ | −5.8203507564e−25 | −1.2122689459e−30 |
| C77 | $y^{11}$ | 9.0571709503e−25 | −4.3690037004e−31 |
| C78 | $x^{12}$ | 3.8675917808e−31 | −4.3578196270e−34 |
| C80 | $x^{10} y^2$ | 1.7143437050e−29 | −3.3028925763e−33 |
| C82 | $x^8 y^4$ | 1.6272796438e−28 | −1.0103889923e−32 |
| C84 | $x^6 y^6$ | 1.1233335114e−28 | −1.5181752322e−32 |
| C86 | $x^4 y^8$ | 2.5570151258e−27 | −1.0299611305e−32 |
| C88 | $x^2 y^{10}$ | −6.6651805077e−28 | −2.4320604088e−33 |
| C90 | $y^{12}$ | 7.9400703740e−27 | 9.9880298175e−36 |
| C92 | $x^{12} y$ | −1.9411406017e−32 | 7.6751661894e−39 |
| C94 | $x^{10} y^3$ | −4.5003137710e−31 | −1.2471663922e−36 |
| C96 | $x^8 y^5$ | −1.8404287302e−30 | −4.6521406627e−36 |
| C98 | $x^6 y^7$ | −8.8675540545e−30 | −3.5610030791e−37 |
| C100 | $x^4 y^9$ | −5.5305717221e−30 | 6.6975911582e−36 |
| C102 | $x^2 y^{11}$ | −1.6718804545e−29 | 6.4265399756e−36 |
| C104 | $y^{13}$ | 3.3333634313e−29 | 1.6796002659e−36 |

-continued

Table 3d for FIG. 24

| Coefficient | Formula | M10 | M11 |
|---|---|---|---|
| C105 | $x^{14}$ | −3.7765069939e−36 | 1.6438978195e−39 |
| C107 | $x^{12} y^2$ | −1.0801273299e−34 | 1.3131597794e−38 |
| C109 | $x^{10} y^4$ | −2.1572247734e−33 | 5.0738780873e−38 |
| C111 | $x^8 y^6$ | −4.9605167516e−33 | 1.0245481060e−37 |
| C113 | $x^6 y^8$ | −2.7372730075e−32 | 1.0933927432e−37 |
| C115 | $x^4 y^{10}$ | −2.0706262333e−32 | 5.3812751409e−38 |
| C117 | $x^2 y^{12}$ | −7.8998202013e−32 | 9.1828878529e−39 |
| C119 | $y^{14}$ | −7.4972119102e−32 | 9.6937477231e−41 |
| C121 | $x^{14} y$ | 2.1560623845e−37 | 1.9480888836e−43 |
| C123 | $x^{12} y^3$ | 6.7209138357e−36 | 4.1514537914e−42 |
| C125 | $x^{10} y^5$ | 4.1002521767e−35 | 2.4459536051e−41 |
| C127 | $x^8 y^7$ | 1.5947416749e−34 | 1.3552500153e−41 |
| C129 | $x^6 y^9$ | 3.2340395390e−34 | −3.9368279412e−41 |
| C131 | $x^4 y^{11}$ | 3.1699640670e−34 | −6.3690783523e−41 |
| C133 | $x^2 y^{13}$ | 7.3873979472e−34 | −3.9490833992e−41 |
| C135 | $y^{15}$ | −1.3299743172e−33 | −8.2599201028e−42 |
| C136 | $x^{16}$ | 1.7681683748e−41 | −4.5530807476e−45 |
| C138 | $x^{14} y^2$ | −3.1297801726e−40 | −4.6866658569e−44 |
| C140 | $x^{12} y^4$ | 2.7661375734e−39 | −2.0719100828e−43 |
| C142 | $X^{10} y^6$ | 1.8885705469e−38 | −5.0661785872e−43 |
| C144 | $x^8 y^8$ | 8.9734302137e−38 | −7.3473093101e−43 |
| C146 | $x^6 y^{10}$ | 7.8400122741e−37 | −5.9624206832e−43 |
| C148 | $x^4 y^{12}$ | −2.5804769230e−36 | −2.3795163268e−43 |
| C150 | $x^2 y^{14}$ | 6.0723474278e−36 | −3.8175770619e−44 |
| C152 | $y^{16}$ | −6.1725153142e−36 | −2.0985203060e−45 |
| C154 | $x^{16} y$ | −1.2784223600e−42 | 3.5470524515e−49 |
| C156 | $x^{14} y^3$ | −4.9052812228e−41 | −6.0504467187e−48 |
| C158 | $x^{12} y^5$ | −4.2083443731e−40 | −6.2425390894e−47 |
| C160 | $x^{10} y^7$ | −1.7350267972e−39 | −7.4128435763e−47 |
| C162 | $x^8 y^9$ | −5.5446113919e−39 | 6.5168144505e−47 |
| C164 | $x^6 y^{11}$ | −3.2279802281e−39 | 2.1455691201e−46 |
| C166 | $x^4 y^{13}$ | −3.2815460073e−38 | 2.1002814760e−46 |
| C168 | $x^2 y^{15}$ | 2.2197881354e−38 | 1.0180615512e−46 |
| C170 | $y^{17}$ | −1.4611013042e−38 | 1.8255671269e−47 |
| C171 | $x^{18}$ | −1.9427172905e−47 | 6.6345891821e−51 |
| C173 | $x^{16} y^2$ | 8.6959124379e−45 | 8.4011819708e−50 |
| C175 | $x^{14} y^4$ | 1.4125593318e−43 | 4.0878898522e−49 |
| C177 | $x^{12} y^6$ | 7.1314703954e−43 | 1.1664367269e−48 |
| C179 | $x^{10} y^8$ | 2.8697801874e−42 | 2.1075038520e−48 |
| C181 | $x^8 y^{10}$ | −5.7889272955e−42 | 2.3685889597e−48 |
| C183 | $x^6 y^{12}$ | 2.7661321735e−41 | 1.5329497739e−48 |
| C185 | $x^4 y^{14}$ | −5.4137787070e−41 | 5.1743395648e−49 |
| C187 | $x^2 y^{16}$ | 1.3135748867e−40 | 7.7319876967e−50 |
| C189 | $y^{18}$ | 3.6966463365e−42 | 5.4639298088e−51 |
| C191 | $x^{18} y$ | 3.0311628175e−46 | −1.1084210008e−55 |
| C193 | $x^{16} y^3$ | 1.4078766229e−46 | 7.5940095339e−54 |
| C195 | $x^{14} y^5$ | 1.5963626285e−45 | 6.8360726466e−53 |
| C197 | $x^{12} y^7$ | 7.8075195962e−45 | 1.1697809894e−52 |
| C199 | $x^{10} y^9$ | 3.1124998815e−44 | −4.8595876136e−53 |
| C201 | $x^8 y^{11}$ | 3.1129916031e−44 | −3.3770489676e−52 |
| C203 | $x^6 y^{13}$ | 2.0108115350e−43 | −4.6862467303e−52 |

Table 3d for FIG. 24

| Coefficient | Formula | M10 | M11 |
|---|---|---|---|
| C205 | $x^4 y^{15}$ | 2.3296342199e-43 | -3.3498605566e-52 |
| C207 | $x^2 y^{17}$ | 5.9875582088e-43 | -1.3171740719e-52 |
| C209 | $y^{19}$ | 1.3345147140e-43 | -2.0888652525e-53 |
| C210 | $x^{20}$ | -5.8312692007e-53 | -4.9995131725e-57 |
| C212 | $x^{18} y^2$ | -3.4287851484e-50 | -7.2793813987e-56 |
| C214 | $x^{16} y^4$ | -7.8283563271e-49 | -3.9400892127e-55 |
| C216 | $x^{14} y^6$ | -5.7229625752e-48 | -1.2790162676e-54 |
| C218 | $x^{12} y^8$ | -2.5084425144e-47 | -2.7196946310e-54 |
| C220 | $x^{10} y^{10}$ | -3.2925425093e-47 | -3.8642829354e-54 |
| C222 | $x^8 y^{12}$ | -5.2565666713e-47 | -3.5085391614e-54 |
| C224 | $x^6 y^{14}$ | 2.4067140278e-46 | -1.9446576855e-54 |
| C226 | $x^4 y^{16}$ | 6.0928638143e-46 | -6.1416537876e-55 |
| C228 | $x^2 y^{18}$ | 9.7171168631e-46 | -9.8729191734e-56 |
| C230 | $y^{20}$ | 2.5053942857e-46 | -7.7936758004e-57 |

Table 4 for FIG. 24
Coordinates of the stop edge

| $x_i$ [mm] | $y_i$ [mm] | $x_{i+N/2}$ [mm] | $y_{i+N/2}$ [mm] |
|---|---|---|---|
| -378.409313 | 53.458994 | 380.988391 | 42.616944 |
| -376.791936 | 58.679281 | 381.945491 | 36.996667 |
| -374.959428 | 63.765157 | 382.678264 | 31.244930 |
| -372.914630 | 68.716497 | 383.184954 | 25.363032 |
| -370.660582 | 73.533431 | 383.464022 | 19.352477 |
| -368.200527 | 78.216346 | 383.514134 | 13.214965 |
| -365.537884 | 82.765876 | 383.334157 | 6.952384 |
| -362.676247 | 87.182895 | 382.923147 | 0.566807 |
| -359.619355 | 91.468502 | 382.280337 | -5.939498 |
| -356.371081 | 95.624004 | 381.405121 | -12.564071 |
| -352.935406 | 99.650898 | 380.297036 | -19.304242 |
| -349.316398 | 103.550852 | 378.955743 | -26.157123 |
| -345.518187 | 107.325681 | 377.381006 | -33.119586 |
| -341.544948 | 110.977331 | 375.572664 | -40.188245 |
| -337.400876 | 114.507857 | 373.530613 | -47.359436 |
| -333.090174 | 117.919408 | 371.254779 | -54.629191 |
| -328.617030 | 121.214208 | 368.745092 | -61.993219 |
| -323.985612 | 124.394542 | 366.001469 | -69.446873 |
| -319.200053 | 127.462742 | 363.023790 | -76.985134 |
| -314.264447 | 130.421177 | 359.811881 | -84.602581 |
| -309.182841 | 133.272239 | 356.365504 | -92.293368 |
| -303.959231 | 136.018333 | 352.684346 | -100.051204 |
| -298.597559 | 138.661871 | 348.768019 | -107.869324 |
| -293.101709 | 141.205259 | 344.616055 | -115.740478 |
| -287.475504 | 143.650894 | 340.227924 | -123.656907 |
| -281.722697 | 146.001152 | 335.603036 | -131.610330 |
| -275.846975 | 148.258388 | 330.740770 | -139.591931 |
| -269.851944 | 150.424922 | 325.640492 | -147.592353 |
| -263.741132 | 152.503043 | 320.301583 | -155.601688 |
| -257.517975 | 154.495000 | 314.723476 | -163.609483 |
| -251.185822 | 156.402998 | 308.905684 | -171.604738 |
| -244.747924 | 158.229199 | 302.847845 | -179.575921 |
| -238.207436 | 159.975714 | 296.549755 | -187.510979 |
| -231.567417 | 161.644606 | 290.011413 | -195.397363 |
| -224.830830 | 163.237888 | 283.233061 | -203.222055 |
| -218.000552 | 164.757520 | 276.215225 | -210.971600 |
| -211.079375 | 166.205407 | 268.958757 | -218.632150 |
| -204.070019 | 167.583403 | 261.464876 | -226.189506 |
| -196.975145 | 168.893308 | 253.735209 | -233.629170 |
| -189.797365 | 170.136868 | 245.771829 | -240.936404 |
| -182.539260 | 171.315773 | 237.577292 | -248.096282 |
| -175.203393 | 172.431663 | 229.154671 | -255.093757 |
| -167.792329 | 173.486118 | 220.507590 | -261.913723 |
| -160.308649 | 174.480668 | 211.640253 | -268.541079 |
| -152.754968 | 175.416784 | 202.557465 | -274.960795 |
| -145.133946 | 176.295883 | 193.264655 | -281.157978 |
| -137.448311 | 177.119324 | 183.767891 | -287.117938 |
| -129.700861 | 177.888407 | 174.073890 | -292.826258 |
| -121.894484 | 178.604373 | 164.190022 | -298.268855 |
| -114.032162 | 179.268399 | 154.124310 | -303.432052 |
| -106.116978 | 179.881602 | 143.885423 | -308.302645 |
| -98.152123 | 180.445030 | 133.482663 | -312.867970 |
| -90.140895 | 180.959665 | 122.925948 | -317.115972 |
| -82.086702 | 181.426420 | 112.225789 | -321.035268 |
| -73.993057 | 181.846135 | 101.393261 | -324.615217 |
| -65.863579 | 182.219576 | 90.439969 | -327.845979 |
| -57.701981 | 182.547435 | 79.378013 | -330.718576 |
| -49.512068 | 182.830324 | 68.219939 | -333.224948 |
| -41.297726 | 183.068779 | 56.978701 | -335.358003 |
| -33.062912 | 183.263255 | 45.667603 | -337.111660 |
| -24.811647 | 183.414125 | 34.300250 | -338.480892 |
| -16.547997 | 183.521681 | 22.890489 | -339.461754 |
| -8.276071 | 183.586130 | 11.452354 | -340.051410 |
| 0.000000 | 183.607600 | 0.000000 | -340.248153 |
| 8.276071 | 183.586130 | -11.452354 | -340.051410 |
| 16.547997 | 183.521681 | -22.890489 | -339.461754 |
| 24.811647 | 183.414125 | -34.300250 | -338.480892 |
| 33.062912 | 183.263255 | -45.667603 | -337.111660 |
| 41.297726 | 183.068779 | -56.978701 | -335.358003 |
| 49.512068 | 182.830324 | -68.219939 | -333.224948 |
| 57.701981 | 182.547435 | -79.378013 | -330.718576 |
| 65.863579 | 182.219576 | -90.439969 | -327.845979 |
| 73.993057 | 181.846135 | -101.393261 | -324.615217 |
| 82.086702 | 181.426420 | -112.225789 | -321.035268 |
| 90.140895 | 180.959665 | -122.925948 | -317.115972 |
| 98.152123 | 180.445030 | -133.482663 | -312.867970 |
| 106.116978 | 179.881602 | -143.885423 | -308.302645 |
| 114.032162 | 179.268399 | -154.124310 | -303.432052 |
| 121.894484 | 178.604373 | -164.190022 | -298.268855 |
| 129.700861 | 177.888407 | -174.073890 | -292.826258 |
| 137.448311 | 177.119324 | -183.767891 | -287.117938 |
| 145.133946 | 176.295883 | -193.264655 | -281.157978 |
| 152.754968 | 175.416784 | -202.557465 | -274.960795 |
| 160.308649 | 174.480668 | -211.640253 | -268.541079 |
| 167.792329 | 173.486118 | -220.507590 | -261.913723 |
| 175.203393 | 172.431663 | -229.154671 | -255.093757 |
| 182.539260 | 171.315773 | -237.577292 | -248.096282 |
| 189.797365 | 170.136868 | -245.771829 | -240.936404 |
| 196.975145 | 168.893308 | -253.735209 | -233.629170 |
| 204.070019 | 167.583403 | -261.464876 | -226.189506 |
| 211.079375 | 166.205407 | -268.958757 | -218.632150 |
| 218.000552 | 164.757520 | -276.215225 | -210.971600 |
| 224.830830 | 163.237888 | -283.233061 | -203.222055 |
| 231.567417 | 161.644606 | -290.011413 | -195.397363 |
| 238.207436 | 159.975714 | -296.549755 | -187.510979 |
| 244.747924 | 158.229199 | -302.847845 | -179.575921 |
| 251.185822 | 156.402998 | -308.905684 | -171.604738 |
| 257.517975 | 154.495000 | -314.723476 | -163.609483 |
| 263.741132 | 152.503043 | -320.301583 | -155.601688 |
| 269.851944 | 150.424922 | -325.640492 | -147.592353 |
| 275.846975 | 148.258388 | -330.740770 | -139.591931 |
| 281.722697 | 146.001152 | -335.603036 | -131.610330 |
| 287.475504 | 143.650894 | -340.227924 | -123.656907 |
| 293.101709 | 141.205259 | -344.616055 | -115.740478 |
| 298.597559 | 138.661871 | -348.768019 | -107.869324 |
| 303.959231 | 136.018333 | -352.684346 | -100.051204 |
| 309.182841 | 133.272239 | -356.365504 | -92.293368 |
| 314.264447 | 130.421177 | -359.811881 | -84.602581 |
| 319.200053 | 127.462742 | -363.023790 | -76.985134 |
| 323.985612 | 124.394542 | -366.001469 | -69.446873 |
| 328.617030 | 121.214208 | -368.745092 | -61.993219 |
| 333.090174 | 117.919408 | -371.254779 | -54.629191 |
| 337.400876 | 114.507857 | -373.530613 | -47.359436 |
| 341.544948 | 110.977331 | -375.572664 | -40.188245 |
| 345.518187 | 107.325681 | -377.381006 | -33.119586 |
| 349.316398 | 103.550852 | -378.955743 | -26.157123 |
| 352.935406 | 99.650898 | -380.297036 | -19.304242 |
| 356.371081 | 95.624004 | -381.405121 | -12.564071 |
| 359.619355 | 91.468502 | -382.280337 | -5.939498 |
| 362.676247 | 87.182895 | -382.923147 | 0.566807 |
| 365.537884 | 82.765876 | -383.334157 | 6.952384 |
| 368.200527 | 78.216346 | -383.514134 | 13.214965 |
| 370.660582 | 73.533431 | -383.464022 | 19.352477 |
| 372.914630 | 68.716497 | -383.184954 | 25.363032 |
| 374.959428 | 63.765157 | -382.678264 | 31.244930 |
| 376.791936 | 58.679281 | -381.945491 | 36.996667 |

-continued

Table 4 for FIG. 24
Coordinates of the stop edge

| $x_i$ [mm] | $y_i$ [mm] | $x_{i+N/2}$ [mm] | $y_{i+N/2}$ [mm] |
|---|---|---|---|
| 378.409313 | 53.458994 | −380.988391 | 42.616944 |
| 379.808935 | 48.104673 | −379.808935 | 48.104673 |

Table 5 for FIG. 24

| NA | Numerical aperture | 0.75 |
|---|---|---|
| $|\beta x|$ | Magnification scale in the cross-scan direction | 4.3 |
| $|\beta y|$ | Magnification scale in the scan direction | 8.0 |
| RMS | Scanned wavefront deviation | 9.4 m$\lambda$ |
| N | Number of mirrors | 11 |

The mirrors M1, M4, M5, M6, M7 and M11 have negative values for the radius, i.e. they are, in principle, concave mirrors. The mirror M10 has positive radius values, that is to say in principle is a convex mirror. The mirrors M2, M3, M8 and M9 have $R_x$, $R_y$ radius values with differing signs in each case, i.e. are saddle-shaped as a matter of principle.

FIGS. 25 to 35 show edge contours of used reflection surfaces of the mirrors M1 to M11. As explained above in conjunction with the mirrors M1 to M8 of the projection optical unit 7, some of the mirrors M1 to M11 of the projection optical unit 31 have an x/y-aspect ratio that deviates significantly from 1. This applies for example to the GI mirrors M5 to M7.

FIGS. 36 to 46 show the coverage of edge contours $28_{M1}$ to $28_{M11}$ of test light beam paths in respectively optimized DOE arrangement planes for measuring the mirrors M1 to M8 within each case a minimized number of DOEs $16_i$.

The edge contours $28_{M6}$, $28_{M7}$, $28_{M9}$ and $28_{M11}$ each have such a small areal extent that they can be covered by exactly one DOE 16. The edge contours $28_{M1}$, $28_{M5}$ and $28_{M8}$ can be covered by exactly two DOEs $16_1$, $16_2$. Five DOEs $16_i$ (i=1 to 5) are used to cover the edge contour $28_{M4}$. Six DOEs $16_i$ (i=1 to 6) are used in each case to cover the edge contours $28_{M2}$ and $28_{M10}$. Seven DOEs $16_i$ (i=1 to 7) are used to cover the edge contour $28_{M3}$.

A total of 34 DOEs $16_i$ are used to cover the edge contours $28_{M1}$ to $28_{M11}$ of the respective test light beam path for the purposes of measuring all used reflection surfaces of the mirrors M1 to M11. Thus, 34/11=3.09 DOEs $16_i$ are used per mirror. The optimized number of DOEs $16_i$ or of DOE test positions for measuring the mirrors M1 to M11 therefore is 3.09-times as large as a number of mirrors and the imaging optical unit 31.

Figure 47:
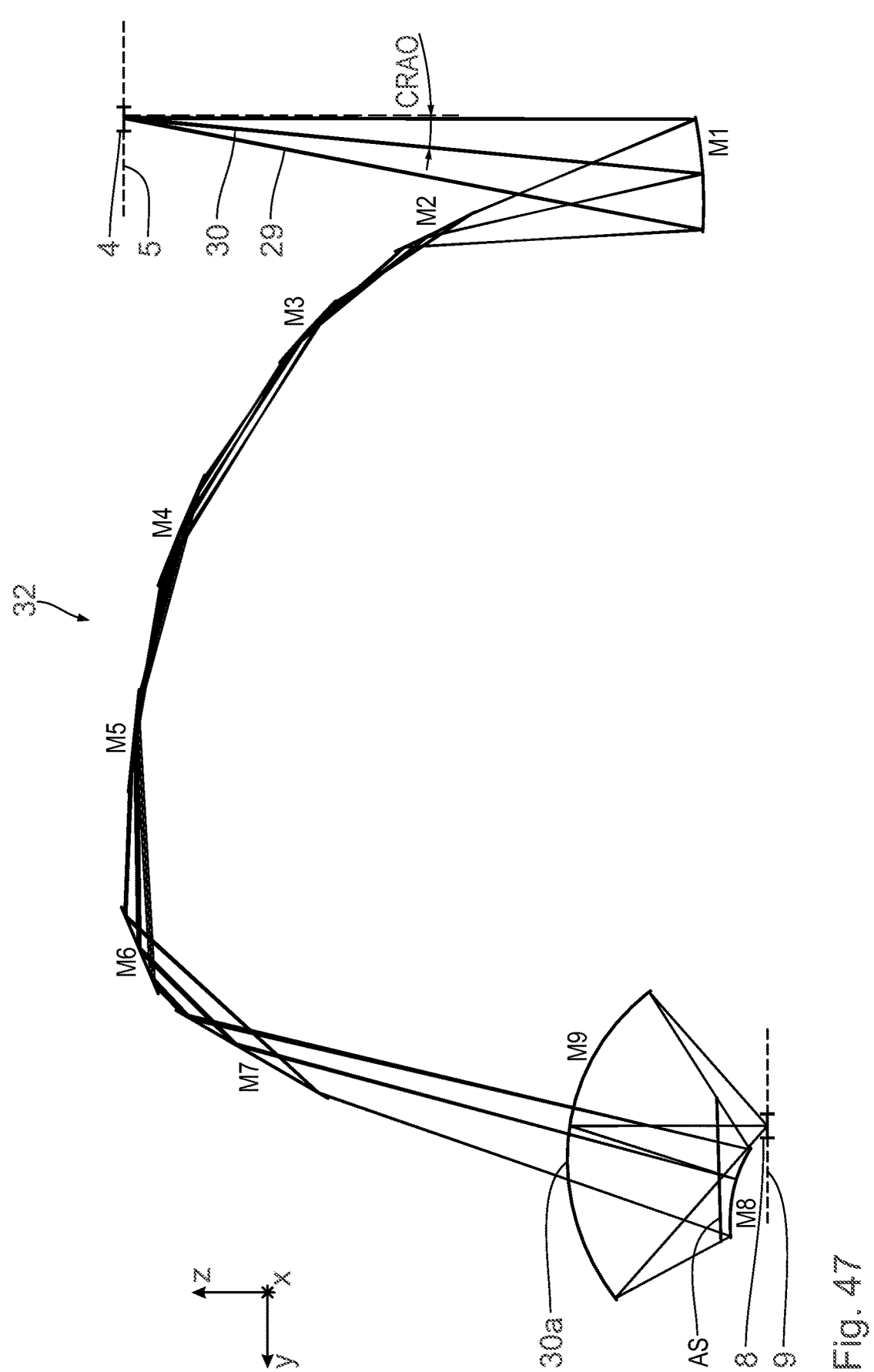
FIG. 47 shows, in an illustration similar to FIG. 7, a further embodiment of an imaging optical unit which is usable as a projection optical unit in the projection exposure apparatus in FIG. 1.
Figures 54, 55, 56:
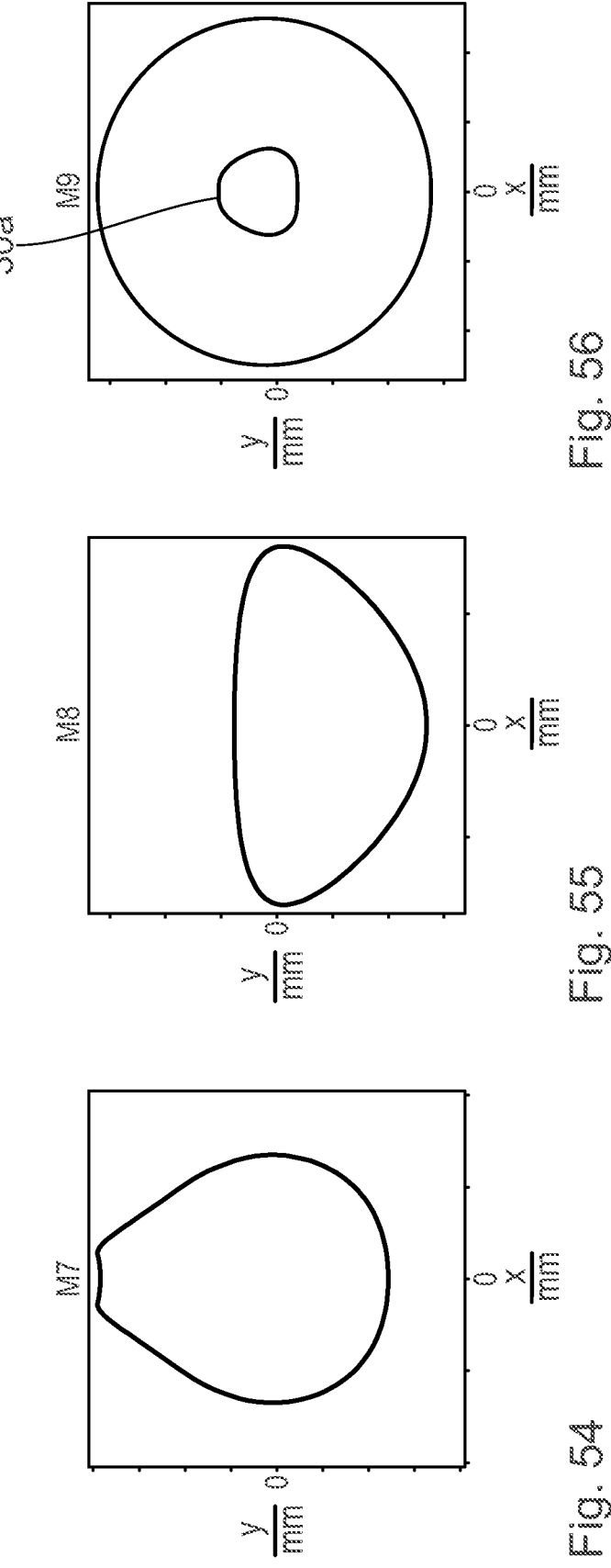

FIG. 47 shows a further embodiment of a projection optical unit or imaging optical unit 32, which can be used in the projection exposure apparatus 1 instead of the projection optical unit 7. Components and functions corresponding to those which have already been explained above with reference to FIGS. 1 to 46, and for example in conjunction with FIGS. 7 and 24, are denoted by the same reference signs and are not discussed in detail again.

The projection optical unit 32 has an image-side numerical aperture of 0.75.

The projection optical unit 32 according to FIG. 47 has a total of nine mirrors M1 to M9. The mirrors M1, M8 and M9 are embodied as mirrors for normal incidence (NI mirrors). The mirrors M2 to M7 are each embodied as mirrors for grazing incidence (GI mirrors). The projection optical unit 32 therefore comprises three NI mirrors and six GI mirrors.

The NI mirrors M2 to M7 reflect the imaging light 3 in such a way that the angles of reflection of the individual rays 29 at the respective mirrors M2 to M7 add up, i.e., lead to an amplification of the deflection effect thereof. The projection optical unit 32 has no counter GI image.

The projection optical unit 32 is approximately telecentric on the object side. If the imaging beam path is only taken into account in relation to the individual rays that pass through the object field 4, the entrance pupil is located 4671.44 mm downstream of the object field 4 in the xz-plane and 5335.68 mm downstream of the object field 4 in the yz-plane.

In the projection optical unit 32, a pupil plane is located in the imaging beam path between the mirrors M1 and M2. A first intermediate image plane is located in the beam path between the mirrors M2 and M3. A further pupil plane is located between the mirrors M3 and M4. A further intermediate image plane is located in the region of a reflection on the mirror M5. The number of intermediate image planes differs from the number of intermediate images in the meridional plane according to FIG. 47 from the number of intermediate images in a plane perpendicular thereto. Such projection optical units with different numbers of intermediate images in mutually perpendicular planes are known from WO 2016/166080 A1 and DE 10 2015 226 531 A1 as a matter of principle.

Apart from the number of GI mirrors and the lack of an arrangement of a counter GI mirror, the projection optical unit 32, in terms of its basic structure, corresponds to the projection optical unit 31.

The optical design data for the projection optical unit 32 according to FIG. 47 emerge from following Tables 1 to 5, which correspond to Tables 1 to 5 relating to the embodiment according to FIGS. 7 and 24.

Table 1 for FIG. 47
Radii of the surfaces

| | Radius$_x$ [mm] | Power$_x$ [1/mm] | Radius$_y$ [mm] | Power$_y$ [1/mm] |
|---|---|---|---|---|
| M01 | −4071.44068277 | 0.00048123 | −1631.52471239 | 0.00120091 |
| M02 | 48896.91761640 | −0.00000359 | 2239.64298509 | −0.00007832 |
| M03 | −9752.10004581 | 0.00004360 | −3438.06627919 | 0.00012366 |
| M04 | −5485.71780854 | 0.00007159 | −5283.45110120 | 0.00007433 |
| M05 | 481013.70359341 | −0.00000026 | −182300.88785044 | 0.00000069 |
| M06 | −1661.90840851 | 0.00050804 | −21118.37212071 | 0.00003998 |
| M07 | −1745.11630488 | 0.00022875 | 75100.37434981 | −0.00000532 |
| M08 | 3797.59962465 | −0.00047858 | 426.01140990 | −0.00426618 |
| M09 | −965.71033134 | 0.00203925 | −846.27428788 | 0.00232705 |

Table 2 for FIG. 47
Decentring (location, angle) the surfaces

| | $D_x$ [mm] | $D_y$ [mm] | $D_z$ [mm] |
|---|---|---|---|
| Reticle | 0.000000000 | 0.000000000 | 0.000000000 |
| M01 | 0.000000000 | −211.581911687 | 2248.834227099 |
| M02 | 0.000000000 | −460.586657372 | 1180.941821471 |
| M03 | 0.000000000 | −849.553269374 | 694.272659077 |
| M04 | 0.000000000 | −1620.859258566 | 211.688781499 |
| M05 | 0.000000000 | −2348.798909307 | 46.116316591 |
| M06 | 0.000000000 | −3228.280224576 | 58.856326318 |
| M07 | 0.000000000 | −3600.398400344 | 432.512361743 |
| M08 | 0.000000000 | −4079.186351741 | 2394.780244510 |
| Stop | 0.000000000 | −4058.585126397 | 2310.348038728 |
| M09 | 0.000000000 | −3917.700827396 | 1732.946844089 |
| Wafer | 0.000000000 | −3917.700831432 | 2499.378943080 |

Table 2 for FIG. 47
Decentring (location, angle) the surfaces

| | $\alpha_x$ [°] | $\alpha_y$ [°] | $\alpha_z$ [°] |
|---|---|---|---|
| Reticle | 0.000000000 | 0.000000000 | 0.000000000 |
| M01 | −3.875252178 | 0.000000000 | 0.000000000 |
| M02 | 244.120653147 | 0.000000000 | −0.000000000 |
| M03 | 221.699848190 | −0.000000000 | −0.000000000 |
| M04 | 202.423571742 | −0.000000000 | −0.000000000 |
| M05 | 185.992099661 | −0.000000000 | −0.000000000 |
| M06 | 157.025966115 | −0.000000000 | −0.000000000 |
| M07 | 119.296969179 | −0.000000000 | −0.000000000 |
| M08 | 13.712087714 | 0.000000000 | −0.000000000 |
| Stop | 178.328611199 | −0.000000000 | −0.000000000 |
| M09 | 186.856044008 | −0.000000000 | −0.000000000 |
| Wafer | 0.000000302 | 0.000000000 | 180.000000000 |

Table 3a for FIG. 47
Free-form coefficients of the surfaces

| Coefficient | Formula | M01 | M02 | M03 |
|---|---|---|---|---|
| C2 | $y$ | −2.3184573390e−04 | −1.5255109035e−03 | −1.1286552982e−03 |
| C7 | $x^2\,y$ | −1.3331858915e−09 | −2.0537689606e−08 | −9.5071643339e−08 |
| C9 | $y^3$ | −1.8241116714e−08 | 5.9465242700e−07 | 2.3149662265e−08 |
| C10 | $x^4$ | 1.7305129211e−11 | 3.1854556108e−11 | −6.9339830289e−12 |
| C12 | $x^2\,y^2$ | 1.2616639269e−12 | −3.6674576966e−10 | 2.7066148116e−11 |
| C14 | $y^4$ | −8.3137652607e−12 | 1.9944929919e−10 | −3.0742437401e−11 |
| C16 | $x^4\,y$ | 1.9873920432e−14 | 5.6217422917e−14 | 6.0056753966e−14 |
| C18 | $x^2\,y^3$ | −3.1180553335e−14 | −1.2980711349e−12 | −2.5782594383e−14 |
| C20 | $y^5$ | −2.4986055339e−14 | −5.7054060338e−12 | 5.5353721940e−14 |
| C21 | $x^6$ | 1.0573403792e−17 | −1.9617443509e−17 | −2.3101613421e−16 |
| C23 | $x^4\,y^2$ | 3.4368916661e−17 | 2.3818729172e−16 | 1.0407136606e−16 |
| C25 | $x^2\,y^4$ | −8.4595676345e−17 | −5.8809754843e−15 | 8.8813855889e−17 |
| C27 | $y^6$ | −2.3626287952e−16 | −3.0376197642e−14 | 7.9925849232e−17 |
| C29 | $x^6\,y$ | 6.5674489968e−21 | 2.8360686950e−19 | −4.0866058998e−20 |
| C31 | $x^4\,y^3$ | 8.4977841943e−20 | −2.1173720737e−18 | −6.5494996176e−20 |
| C33 | $x^2\,y^5$ | −3.3338610455e−19 | −1.0094613043e−17 | −1.1567684999e−19 |
| C35 | $y^7$ | −1.6704685989e−18 | −9.2195054449e−17 | −8.4447753000e−19 |
| C36 | $x^8$ | 3.1181197044e−24 | 1.9560605067e−22 | 1.9016106238e−22 |
| C38 | $x^6\,y^2$ | 2.9970101616e−23 | 6.5536840945e−22 | −1.0360493775e−22 |
| C40 | $x^4\,y^4$ | 9.4322614516e−22 | −7.2581886014e−21 | −1.2339170479e−22 |
| C42 | $x^2\,y^6$ | 5.0325627266e−21 | 5.3033051790e−20 | −7.9963812100e−24 |
| C44 | $y^8$ | 1.2904810476e−20 | −1.0294838393e−19 | −1.4629225979e−20 |
| C46 | $x^8\,y$ | −1.1732863762e−25 | 1.7004470173e−25 | 9.7630893676e−26 |
| C48 | $x^6\,y^3$ | −1.8635901269e−24 | 9.9599340459e−25 | −5.2498436998e−26 |
| C50 | $x^4\,y^5$ | −3.9370076842e−24 | 1.5026535840e−23 | −2.2405536888e−24 |
| C52 | $x^2\,y^7$ | 7.1535294967e−23 | 5.7406843465e−22 | 2.2730738918e−23 |
| C54 | $y^9$ | 2.4174147962e−22 | −8.1371011561e−22 | 1.6938607727e−23 |
| C55 | $x^{10}$ | −4.3425214758e−29 | −1.4095736159e−27 | 1.8673968142e−28 |
| C57 | $x^8\,y^2$ | −8.5281848525e−28 | −4.5931956384e−27 | −2.9699306843e−28 |
| C59 | $x^6\,y^4$ | −9.1863282877e−27 | 3.3133803471e−26 | 5.9991225241e−27 |
| C61 | $x^4\,y^6$ | −1.5049146826e−25 | 2.7350429322e−25 | −1.2734790180e−27 |
| C63 | $x^2\,y^8$ | −4.5541182822e−25 | −2.9012338475e−25 | 1.8416377958e−25 |
| C65 | $y^{10}$ | 2.8108050624e−26 | −2.0895881659e−23 | 9.0362082512e−25 |
| C67 | $x^{10}\,y$ | 1.7112746062e−30 | −5.3844172661e−30 | 1.2297311485e−30 |
| C69 | $x^8\,y^3$ | 4.4172364770e−29 | −6.0358521114e−29 | −1.6716088551e−30 |
| C71 | $x^6\,y^5$ | 3.0650119877e−28 | −1.7933829536e−28 | 1.0741458763e−29 |
| C73 | $x^4\,y^7$ | −5.2911237125e−28 | −1.2991327929e−27 | −2.5311444056e−28 |
| C75 | $x^2\,y^9$ | −9.3187901532e−27 | −1.9938354883e−26 | −1.4975662295e−27 |
| C77 | $y^{11}$ | −1.7120201396e−26 | 2.8075804792e−26 | 2.4918778681e−27 |
| C78 | $x^{12}$ | 4.4094849311e−34 | 6.9758999733e−33 | −8.1074904275e−33 |
| C80 | $x^{10}\,y^2$ | 1.6619975470e−32 | −4.0044525397e−33 | −5.4957211134e−33 |
| C82 | $x^8\,y^4$ | 5.6410256892e−32 | −3.6155104569e−31 | −4.6518714971e−32 |
| C84 | $x^6\,y^6$ | 1.0672623949e−30 | −3.3644640485e−30 | −2.0640533876e−31 |
| C86 | $x^4\,y^8$ | 1.4919955190e−29 | −1.2103699794e−29 | 1.0473536668e−30 |
| C88 | $x^2\,y^{10}$ | 1.9907514191e−29 | 2.8804078931e−28 | −2.3926852531e−29 |
| C90 | $y^{12}$ | −5.3269493685e−29 | 2.3654977370e−27 | −1.6733268314e−29 |
| C92 | $x^{12}\,y$ | −1.7585571219e−35 | 3.7411514561e−35 | −4.3150967049e−36 |
| C94 | $x^{10}\,y^3$ | −6.4283977529e−34 | 3.3273880789e−34 | 3.5044614453e−35 |
| C96 | $x^8\,y^5$ | −6.4717964413e−33 | 2.1470323895e−33 | 6.2572826770e−35 |
| C98 | $x^6\,y^7$ | −1.7663954729e−32 | −7.7762333665e−34 | −3.2379425599e−34 |
| C100 | $x^4\,y^9$ | 1.4548705846e−31 | 1.6761161297e−31 | 3.4011836303e−32 |
| C102 | $x^2\,y^{11}$ | 6.9585886896e−31 | 3.6134437221e−30 | −4.1163103244e−32 |
| C104 | $y^{13}$ | 6.8004392936e−31 | 1.1344539745e−29 | −9.5981222150e−32 |

-continued

Table 3a for FIG. 47
Free-form coefficients of the surfaces

| Coefficient | Formula | M01 | M02 | M03 |
|---|---|---|---|---|
| C105 | $x^{14}$ | −4.2075694046e−39 | −3.3660308274e−38 | 4.6054390658e−38 |
| C107 | $x^{12} y^2$ | −2.3805630370e−37 | −3.7958640098e−38 | 2.4664262926e−38 |
| C109 | $x^{10} y^4$ | −9.9104194339e−37 | 1.3627358303e−36 | 6.4355004883e−38 |
| C111 | $x^8 y^6$ | 1.0226577321e−35 | 2.8294634180e−35 | 3.0265658246e−36 |
| C113 | $x^6 y^8$ | −8.4722268648e−35 | 1.7797604917e−34 | −1.8248560547e−35 |
| C115 | $x^4 y^{10}$ | −8.4696633962e−34 | 1.0031711908e−33 | 1.2519498432e−34 |
| C117 | $x^2 y^{12}$ | −2.4871741470e−34 | −1.3797757588e−33 | 6.3184579787e−34 |
| C119 | $y^{14}$ | 3.3923228716e−33 | −4.5088492717e−32 | −5.2090166177e−35 |
| C121 | $x^{14} y$ | 1.1661146813e−40 | −2.3524422935e−40 | −1.2550553725e−41 |
| C123 | $x^{12} y^3$ | 6.0745387259e−39 | −1.2189060905e−39 | −1.2895577644e−40 |
| C125 | $x^{10} y^5$ | 7.9590097953e−38 | −9.0639664337e−39 | −1.1773393314e−39 |
| C127 | $x^8 y^7$ | 4.6043831471e−37 | 6.5923649152e−38 | 1.4983727545e−38 |
| C129 | $x^6 y^9$ | −2.5563164384e−37 | 4.5986519964e−37 | −2.0390199926e−37 |
| C131 | $x^4 y^{11}$ | −1.3129043411e−35 | −7.3141324547e−36 | −3.7185479589e−37 |
| C133 | $x^2 y^{13}$ | −3.2884800377e−35 | −1.5960184203e−34 | 2.5789695384e−36 |
| C135 | $y^{15}$ | −1.5746790552e−35 | −5.6416956835e−34 | 1.6837951325e−37 |
| C136 | $x^{16}$ | 3.4369798479e−44 | 8.1470832447e−44 | −9.3679073274e−44 |
| C138 | $x^{14} y^2$ | 2.2352130961e−42 | 2.0201664921e−43 | −3.9727188811e−44 |
| C140 | $x^{12} y^4$ | 1.9936318708e−41 | −1.0259601910e−42 | 1.4348956538e−43 |
| C142 | $x^{10} y^6$ | −1.8585887813e−40 | −6.0423447158e−41 | −1.0060355795e−41 |
| C144 | $x^8 y^8$ | −1.3045015555e−39 | −5.3138679547e−40 | 3.9565043288e−41 |
| C146 | $x^6 y^{10}$ | 4.4444195371e−39 | −3.4722184265e−39 | −3.7382073551e−41 |
| C148 | $x^4 y^{12}$ | 2.8022527364e−38 | −6.4096708792e−38 | −3.0036474983e−39 |
| C150 | $x^2 y^{14}$ | −1.4465129759e−38 | −7.3536175671e−37 | −2.7536686630e−39 |
| C152 | $y^{16}$ | −1.0216643204e−37 | −1.8369691553e−36 | −5.9764600284e−40 |
| C154 | $x^{16} y$ | −4.3688299026e−46 | 6.0943439591e−46 | 6.8998294212e−47 |
| C156 | $x^{14} y^3$ | −3.5586185636e−44 | 1.7264894143e−45 | 1.4173204641e−46 |
| C158 | $x^{12} y^5$ | −6.1435885861e−43 | 2.2514830819e−44 | 3.7874585441e−45 |
| C160 | $x^{10} y^7$ | −5.3231713306e−42 | −1.8040507908e−43 | −3.8619882787e−44 |
| C162 | $x^8 y^9$ | −1.5536485752e−41 | −2.3503693967e−42 | 2.4778842178e−43 |
| C164 | $x^6 y^{11}$ | 8.0571018451e−41 | −1.2736777612e−41 | 2.7352811645e−42 |
| C166 | $x^4 y^{13}$ | 6.3332706731e−40 | −1.2402156842e−40 | −6.2497089172e−42 |
| C168 | $x^2 y^{15}$ | 1.0156682986e−39 | −1.0576096900e−39 | −1.6336149125e−41 |
| C170 | $y^{17}$ | 2.0905689949e−40 | −2.0852349937e−39 | −2.5485060777e−42 |
| C171 | $x^{18}$ | −2.0084338634e−49 | 0.0000000000e+00 | 0.0000000000e+00 |
| C173 | $x^{16} y^2$ | −1.3337668867e−47 | 0.0000000000e+00 | 0.0000000000e+00 |
| C175 | $x^{14} y^4$ | −2.0156419058e−46 | 0.0000000000e+00 | 0.0000000000e+00 |
| C177 | $x^{12} y^6$ | 8.4741622513e−46 | 0.0000000000e+00 | 0.0000000000e+00 |
| C179 | $x^{10} y^8$ | 2.0004310427e−44 | 0.0000000000e+00 | 0.0000000000e+00 |
| C181 | $x^8 y^{10}$ | 6.3209832571e−44 | 0.0000000000e+00 | 0.0000000000e+00 |
| C183 | $x^6 y^{12}$ | −1.4025055911e−43 | 0.0000000000e+00 | 0.0000000000e+00 |
| C185 | $x^4 y^{14}$ | −5.0183873622e−43 | 0.0000000000e+00 | 0.0000000000e+00 |
| C187 | $x^2 y^{16}$ | 7.7684870467e−43 | 0.0000000000e+00 | 0.0000000000e+00 |
| C189 | $y^{18}$ | 1.5258203758e−42 | 0.0000000000e+00 | 0.0000000000e+00 |
| C191 | $x^{18} y$ | 5.3651700308e−52 | 0.0000000000e+00 | 0.0000000000e+00 |
| C193 | $x^{16} y^3$ | 1.1345988661e−49 | 0.0000000000e+00 | 0.0000000000e+00 |
| C195 | $x^{14} y^5$ | 2.8368903193e−48 | 0.0000000000e+00 | 0.0000000000e+00 |
| C197 | $x^{12} y^7$ | 3.5470571553e−47 | 0.0000000000e+00 | 0.0000000000e+00 |
| C199 | $x^{10} y^9$ | 2.0087162926e−46 | 0.0000000000e+00 | 0.0000000000e+00 |
| C201 | $x^8 y^{11}$ | 1.3833409443e−46 | 0.0000000000e+00 | 0.0000000000e+00 |
| C203 | $x^6 y^{13}$ | −4.1423526372e−45 | 0.0000000000e+00 | 0.0000000000e+00 |
| C205 | $x^4 y^{15}$ | −1.7908645151e−44 | 0.0000000000e+00 | 0.0000000000e+00 |
| C207 | $x^2 y^{17}$ | −2.0416998917e−44 | 0.0000000000e+00 | 0.0000000000e+00 |
| C209 | $y^{19}$ | −1.9940585597e−45 | 0.0000000000e+00 | 0.0000000000e+00 |
| C210 | $x^{20}$ | 7.5428628658e−55 | 0.0000000000e+00 | 0.0000000000e+00 |
| C212 | $x^{18} y^2$ | 4.8930258599e−53 | 0.0000000000e+00 | 0.0000000000e+00 |
| C214 | $x^{16} y^4$ | 1.0714819061e−51 | 0.0000000000e+00 | 0.0000000000e+00 |
| C216 | $x^{14} y^6$ | 2.8127311346e−52 | 0.0000000000e+00 | 0.0000000000e+00 |
| C218 | $x^{12} y^8$ | −1.0390367029e−49 | 0.0000000000e+00 | 0.0000000000e+00 |
| C220 | $x^{10} y^{10}$ | −7.7393488061e−49 | 0.0000000000e+00 | 0.0000000000e+00 |
| C222 | $x^8 y^{12}$ | −1.5962328657e−48 | 0.0000000000e+00 | 0.0000000000e+00 |
| C224 | $x^6 y^{14}$ | 2.5067287280e−48 | 0.0000000000e+00 | 0.0000000000e+00 |
| C226 | $x^4 y^{16}$ | 3.3997896018e−48 | 0.0000000000e+00 | 0.0000000000e+00 |
| C228 | $x^2 y^{18}$ | −1.6905629123e−47 | 0.0000000000e+00 | 0.0000000000e+00 |
| C230 | $y^{20}$ | −6.8861001997e−48 | 0.0000000000e+00 | 0.0000000000e+00 |
| C232 | $x^{20} y$ | 2.1157822918e−57 | 0.0000000000e+00 | 0.0000000000e+00 |
| C234 | $x^{18} y^3$ | −1.0692365216e−55 | 0.0000000000e+00 | 0.0000000000e+00 |
| C236 | $x^{16} y^5$ | −6.6401826707e−54 | 0.0000000000e+00 | 0.0000000000e+00 |
| C238 | $x^{14} y^7$ | −1.3488102964e−52 | 0.0000000000e+00 | 0.0000000000e+00 |
| C240 | $x^{12} y^9$ | −1.1538483153e−51 | 0.0000000000e+00 | 0.0000000000e+00 |
| C242 | $x^{10} y^{11}$ | −4.1696714982e−51 | 0.0000000000e+00 | 0.0000000000e+00 |
| C244 | $x^8 y^{13}$ | 5.4963186121e−51 | 0.0000000000e+00 | 0.0000000000e+00 |
| C246 | $x^6 y^{15}$ | 1.0145599907e−49 | 0.0000000000e+00 | 0.0000000000e+00 |
| C248 | $x^4 y^{17}$ | 2.9668225460e−49 | 0.0000000000e+00 | 0.0000000000e+00 |

Table 3a for FIG. 47
Free-form coefficients of the surfaces

| Coefficient | Formula | M01 | M02 | M03 |
|---|---|---|---|---|
| C250 | $x^2 y^{19}$ | 2.5667063887e−49 | 0.0000000000e+00 | 0.0000000000e+00 |
| C252 | $y^{21}$ | 3.2888915028e−50 | 0.0000000000e+00 | 0.0000000000e+00 |
| C253 | $x^{22}$ | −1.6089478503e−60 | 0.0000000000e+00 | 0.0000000000e+00 |
| C255 | $x^{20} y^2$ | −1.0090570538e−58 | 0.0000000000e+00 | 0.0000000000e+00 |
| C257 | $x^{18} y^4$ | −2.9286023568e−57 | 0.0000000000e+00 | 0.0000000000e+00 |
| C259 | $x^{16} y^6$ | −1.2205530502e−56 | 0.0000000000e+00 | 0.0000000000e+00 |
| C261 | $x^{14} y^8$ | 2.2961571495e−55 | 0.0000000000e+00 | 0.0000000000e+00 |
| C263 | $x^{12} y^{10}$ | 2.9358318814e−54 | 0.0000000000e+00 | 0.0000000000e+00 |
| C265 | $x^{10} y^{12}$ | 1.3749132147e−53 | 0.0000000000e+00 | 0.0000000000e+00 |
| C267 | $x^8 y^{14}$ | 2.0918004190e−53 | 0.0000000000e+00 | 0.0000000000e+00 |
| C269 | $x^6 y^{16}$ | −2.2722234003e−53 | 0.0000000000e+00 | 0.0000000000e+00 |
| C271 | $x^4 y^{18}$ | 2.2436398414e−53 | 0.0000000000e+00 | 0.0000000000e+00 |
| C273 | $x^2 y^{20}$ | 1.8450778253e−52 | 0.0000000000e+00 | 0.0000000000e+00 |
| C275 | $y^{22}$ | −8.2025345565e−53 | 0.0000000000e+00 | 0.0000000000e+00 |
| C277 | $x^{22} y$ | −8.8433848309e−63 | 0.0000000000e+00 | 0.0000000000e+00 |
| C279 | $x^{20} y^3$ | −3.5802029359e−61 | 0.0000000000e+00 | 0.0000000000e+00 |
| C281 | $x^{18} y^5$ | 3.4692856549e−60 | 0.0000000000e+00 | 0.0000000000e+00 |
| C283 | $x^{16} y^7$ | 2.5477574638e−58 | 0.0000000000e+00 | 0.0000000000e+00 |
| C285 | $x^{14} y^9$ | 3.2521088120e−57 | 0.0000000000e+00 | 0.0000000000e+00 |
| C287 | $x^{12} y^{11}$ | 1.9286432862e−56 | 0.0000000000e+00 | 0.0000000000e+00 |
| C289 | $x^{10} y^{13}$ | 4.3855267915e−56 | 0.0000000000e+00 | 0.0000000000e+00 |
| C291 | $x^8 y^{15}$ | −1.5413178747e−55 | 0.0000000000e+00 | 0.0000000000e+00 |
| C293 | $x^6 y^{17}$ | −1.2410698499e−54 | 0.0000000000e+00 | 0.0000000000e+00 |
| C295 | $x^4 y^{19}$ | −2.6540993396e−54 | 0.0000000000e+00 | 0.0000000000e+00 |
| C297 | $x^2 y^{21}$ | −1.8206827092e−54 | 0.0000000000e+00 | 0.0000000000e+00 |
| C299 | $y^{23}$ | −5.3154888302e−55 | 0.0000000000e+00 | 0.0000000000e+00 |
| C300 | $x^{24}$ | 1.4688507051e−66 | 0.0000000000e+00 | 0.0000000000e+00 |
| C302 | $x^{22} y^2$ | 8.9691922801e−65 | 0.0000000000e+00 | 0.0000000000e+00 |
| C304 | $x^{20} y^4$ | 3.2649481684e−63 | 0.0000000000e+00 | 0.0000000000e+00 |
| C306 | $x^{18} y^6$ | 2.5343730471e−62 | 0.0000000000e+00 | 0.0000000000e+00 |
| C308 | $x^{16} y^8$ | −1.5958235876e−61 | 0.0000000000e+00 | 0.0000000000e+00 |
| C310 | $x^{14} y^{10}$ | −3.7833229473e−60 | 0.0000000000e+00 | 0.0000000000e+00 |
| C312 | $x^{12} y^{12}$ | −2.7205267770e−59 | 0.0000000000e+00 | 0.0000000000e+00 |
| C314 | $x^{10} y^{14}$ | −9.4145268130e−59 | 0.0000000000e+00 | 0.0000000000e+00 |
| C316 | $x^8 y^{16}$ | −1.1213358579e−58 | 0.0000000000e+00 | 0.0000000000e+00 |
| C318 | $x^6 y^{18}$ | 7.6578376835e−59 | 0.0000000000e+00 | 0.0000000000e+00 |
| C320 | $x^4 y^{20}$ | −3.4804656424e−58 | 0.0000000000e+00 | 0.0000000000e+00 |
| C322 | $x^2 y^{22}$ | −8.3372754965e−58 | 0.0000000000e+00 | 0.0000000000e+00 |
| C324 | $y^{24}$ | 8.1511862048e−58 | 0.0000000000e+00 | 0.0000000000e+00 |
| C326 | $x^{24} y$ | 9.8401518662e−69 | 0.0000000000e+00 | 0.0000000000e+00 |
| C328 | $x^{22} y^3$ | 7.9730201262e−67 | 0.0000000000e+00 | 0.0000000000e+00 |
| C330 | $x^{20} y^5$ | 8.6746312634e−66 | 0.0000000000e+00 | 0.0000000000e+00 |
| C332 | $x^{18} y^7$ | −1.5679275633e−64 | 0.0000000000e+00 | 0.0000000000e+00 |
| C334 | $x^{16} y^9$ | −3.5504813557e−63 | 0.0000000000e+00 | 0.0000000000e+00 |
| C336 | $x^{14} y^{11}$ | −2.9643234290e−62 | 0.0000000000e+00 | 0.0000000000e+00 |
| C338 | $x^{12} y^{13}$ | −1.3010189625e−61 | 0.0000000000e+00 | 0.0000000000e+00 |
| C340 | $x^{10} y^{15}$ | −1.7901748795e−61 | 0.0000000000e+00 | 0.0000000000e+00 |
| C342 | $x^8 y^{17}$ | 1.1535660450e−60 | 0.0000000000e+00 | 0.0000000000e+00 |
| C344 | $x^6 y^{19}$ | 6.0904574722e−60 | 0.0000000000e+00 | 0.0000000000e+00 |
| C346 | $x^4 y^{21}$ | 9.8131191576e−60 | 0.0000000000e+00 | 0.0000000000e+00 |
| C348 | $x^2 y^{23}$ | 5.4883732930e−60 | 0.0000000000e+00 | 0.0000000000e+00 |
| C350 | $y^{25}$ | 3.3464858570e−60 | 0.0000000000e+00 | 0.0000000000e+00 |

Table 3b for FIG. 47

| Coefficient | Formula | M04 | M05 | M06 |
|---|---|---|---|---|
| C2 | $y$ | 1.1037254798e−04 | −9.7175319626e−05 | −5.5480776939e−04 |
| C7 | $x^2 y$ | −2.3441646363e−08 | −2.7429915033e−08 | 6.4291720674e−08 |
| C9 | $y^3$ | 2.3836393452e−08 | 6.1152565541e−09 | −1.6846800716e−09 |
| C10 | $x^4$ | 4.8112515241e−11 | −4.5107269820e−11 | 2.8336781157e−11 |
| C12 | $x^2 y^2$ | 5.3478561388e−11 | −1.5073027813e−11 | 1.5242085259e−11 |
| C14 | $y^4$ | 1.9442406609e−11 | 1.1831405428e−12 | 1.4440044701e−11 |
| C16 | $x^4 y$ | −2.5039841987e−14 | 1.0019079534e−13 | 3.3684858290e−14 |
| C18 | $x^2 y^3$ | −3.9662080156e−14 | −2.4510647904e−14 | 1.3893214000e−13 |
| C20 | $y^5$ | −5.7409414277e−15 | 1.0152127084e−14 | −2.1466776311e−13 |
| C21 | $x^6$ | −8.8292191086e−17 | 5.9164044908e−17 | 4.5728863270e−17 |
| C23 | $x^4 y^2$ | 1.0897086151e−17 | −1.1582313041e−17 | 2.3125096959e−16 |
| C25 | $x^2 y^4$ | −4.4784973801e−17 | −2.1473270989e−17 | −7.7952138847e−16 |
| C27 | $y^6$ | −1.7009085998e−17 | −1.4262903543e−16 | −1.0100066226e−15 |
| C29 | $x^6 y$ | 1.3505931159e−20 | −6.6095754364e−20 | 2.6644795131e−19 |

-continued

| | | Table 3b for FIG. 47 | | |
|---|---|---|---|---|
| Coefficient | Formula | M04 | M05 | M06 |
| C31 | $x^4 y^3$ | 1.1039245583e−19 | 9.4356252935e−20 | −1.7514803151e−18 |
| C33 | $x^2 y^5$ | 3.9148772688e−20 | 1.4640824719e−19 | −5.8256378113e−18 |
| C35 | $y^7$ | 3.0720918130e−20 | 7.1010299407e−19 | 2.6423204282e−18 |
| C36 | $x^8$ | 2.7464586045e−23 | 6.5251633661e−23 | 1.4729938431e−22 |
| C38 | $x^6 y^2$ | −9.6659372838e−23 | −1.1778523602e−22 | −1.8769372638e−21 |
| C40 | $x^4 y^4$ | 4.1174478008e−22 | −8.4237491781e−22 | −1.5733679081e−20 |
| C42 | $x^2 y^6$ | 1.2985602072e−22 | −1.7272729531e−21 | 1.7919878801e−20 |
| C44 | $y^8$ | −2.9526520034e−22 | 1.5739161803e−20 | 3.3316533161e−22 |
| C46 | $x^8 y$ | −2.6555453862e−25 | −1.8372007090e−25 | −1.0754552731e−24 |
| C48 | $x^6 y^3$ | −1.3031291975e−24 | 1.3387047447e−24 | −1.9996184246e−23 |
| C50 | $x^4 y^5$ | −1.2534025709e−24 | 5.9788531677e−24 | 4.8208560039e−23 |
| C52 | $x^2 y^7$ | −2.0033352324e−24 | −1.6058317162e−23 | 6.0263924778e−23 |
| C54 | $y^9$ | −2.5505944479e−24 | −1.4391763457e−22 | −7.4410171060e−23 |
| C55 | $x^{10}$ | 6.0367981985e−28 | −1.3063584935e−27 | −3.1916723745e−28 |
| C57 | $x^8 y^2$ | 8.8919092395e−28 | 9.5143686302e−28 | −1.4320807569e−26 |
| C59 | $x^6 y^4$ | −7.8519597882e−28 | 8.4393638279e−27 | 7.2711882803e−26 |
| C61 | $x^4 y^6$ | 6.2308362927e−27 | 3.1110070053e−26 | 3.5584604903e−25 |
| C63 | $x^2 y^8$ | 6.8207573377e−27 | 1.6301661775e−25 | −1.9131265163e−25 |
| C65 | $y^{10}$ | 2.7828866032e−26 | −7.9125906150e−25 | −1.1250049343e−25 |
| C67 | $x^{10} y$ | −3.8510365503e−31 | −6.4767773809e−31 | −7.9236092470e−30 |
| C69 | $x^8 y^3$ | 6.3749497678e−30 | −1.8637817752e−29 | 2.9447310306e−29 |
| C71 | $x^6 y^5$ | 1.7425565993e−29 | −1.5862090603e−28 | 9.2097219390e−28 |
| C73 | $x^4 y^7$ | 6.0802410006e−29 | −5.1352890548e−28 | −4.8057821375e−28 |
| C75 | $x^2 y^9$ | 4.1556674412e−29 | 1.3099667754e−27 | −1.9002604012e−27 |
| C77 | $y^{11}$ | 1.7228196166e−28 | 1.4774568216e−26 | 5.9158703045e−27 |
| C78 | $x^{12}$ | −2.7123531988e−33 | 1.0143726062e−32 | −1.0045662986e−33 |
| C80 | $x^{10} y^2$ | −6.7525586756e−33 | −2.6793542815e−33 | −4.3017238928e−32 |
| C82 | $x^8 y^4$ | −9.4458910559e−33 | 4.2777410541e−33 | 1.0114016556e−30 |
| C84 | $x^6 y^6$ | −1.8119399881e−31 | 4.7911076163e−31 | −7.6779697730e−31 |
| C86 | $x^4 y^8$ | −3.6596815698e−31 | 1.1923767583e−30 | −1.5414617010e−29 |
| C88 | $x^2 y^{10}$ | −6.3489167289e−31 | −1.7055017166e−29 | 3.5159821727e−29 |
| C90 | $y^{12}$ | −7.5908058214e−31 | −3.7988294369e−29 | −2.0103142784e−29 |
| C92 | $x^{12} y$ | 6.6064017100e−36 | −4.8416317536e−36 | −2.8296826478e−35 |
| C94 | $x^{10} y^3$ | −2.5843036145e−35 | 9.1281887744e−35 | 7.7097251747e−34 |
| C96 | $x^8 y^5$ | −8.9625012630e−35 | 1.2060875663e−33 | −1.9330196917e−33 |
| C98 | $x^6 y^7$ | −5.1265752726e−34 | 3.7861182320e−33 | −5.0248599797e−32 |
| C100 | $x^4 y^9$ | −4.6651036388e−34 | −8.8016661601e−34 | 1.2451277078e−31 |
| C102 | $x^2 y^{11}$ | −1.0346359877e−33 | 1.6595580632e−32 | −2.0602434378e−31 |
| C104 | $y^{13}$ | −4.4859462239e−33 | −4.1456701409e−31 | −4.8323761522e−32 |
| C105 | $x^{14}$ | 7.7845241534e−39 | −3.7681391059e−38 | −3.4930703038e−38 |
| C107 | $x^{12} y^2$ | 2.4706968276e−38 | 5.0983540171e−38 | 5.5905809854e−37 |
| C109 | $x^{10} y^4$ | 4.1570320654e−38 | −2.9003376271e−37 | 2.0323022007e−36 |
| C111 | $x^8 y^6$ | 1.7327211039e−36 | −5.3445882429e−36 | −9.7040604897e−35 |
| C113 | $x^6 y^8$ | 6.0620176482e−36 | −3.9889661271e−35 | 2.6527161248e−34 |
| C115 | $x^4 y^{10}$ | 9.7315813133e−36 | 9.4677255853e−35 | −6.3133535299e−34 |
| C117 | $x^2 y^{12}$ | 1.3087845218e−35 | 4.6853694525e−34 | −1.2064030920e−34 |
| C119 | $y^{14}$ | 9.5829113558e−36 | 3.6899928836e−35 | −6.8580345501e−35 |
| C121 | $x^{14} y$ | −3.2010889419e−41 | 2.1446568474e−41 | −3.6062391556e−42 |
| C123 | $x^{12} y^3$ | 8.0214560389e−41 | −4.1724986144e−40 | 4.3368247074e−39 |
| C125 | $x^{10} y^5$ | 1.0222565194e−40 | −4.5579682373e−39 | −8.9371715612e−38 |
| C127 | $x^8 y^7$ | −1.2743112288e−39 | −4.2208879614e−39 | 3.8491341790e−37 |
| C129 | $x^6 y^9$ | −2.1230879978e−39 | 1.9758309493e−37 | −1.2314046235e−36 |
| C131 | $x^4 y^{11}$ | −1.1786966884e−38 | −8.6667062968e−37 | −9.5806335728e−38 |
| C133 | $x^2 y^{13}$ | 1.4869988767e−38 | −2.4576573898e−36 | 8.2456539748e−37 |
| C135 | $y^{15}$ | 5.4539894890e−38 | −1.2920304446e−35 | 4.0804864419e−37 |
| C136 | $x^{16}$ | −1.0197286924e−44 | 6.1630014930e−44 | 1.8522372876e−43 |
| C138 | $x^{14} y^2$ | −3.0893654206e−44 | −1.5559495582e−43 | 1.7345751230e−42 |
| C140 | $x^{12} y^4$ | 2.5655339835e−44 | 1.8585998437e−42 | −6.7711206644e−41 |
| C142 | $x^{10} y^6$ | −4.8097311714e−42 | 3.9864706403e−41 | 4.4181684825e−40 |
| C144 | $x^8 y^8$ | −3.0088640854e−41 | 4.6729196459e−42 | −1.1247481416e−39 |
| C146 | $x^6 y^{10}$ | −6.0311448365e−41 | −4.5877802851e−40 | −1.0086738522e−39 |
| C148 | $x^4 y^{12}$ | −8.3439482012e−41 | 2.8243021132e−39 | 2.0092440999e−39 |
| C150 | $x^2 y^{14}$ | −8.5596667670e−41 | 4.7459028803e−39 | 2.7367905146e−39 |
| C152 | $y^{16}$ | −4.9147603952e−41 | 2.2116872467e−38 | 1.4072168179e−39 |
| C154 | $x^{16} y$ | 6.9877086116e−47 | −2.4596688259e−47 | 2.2377426674e−45 |
| C156 | $x^{14} y^3$ | −1.4575982984e−46 | 1.0870510355e−45 | −3.5267657142e−44 |
| C158 | $x^{12} y^5$ | −5.3293692170e−47 | −1.0272567049e−44 | 1.8177286416e−43 |
| C160 | $x^{10} y^7$ | 1.6120980481e−44 | −5.2076419532e−44 | −2.2362514039e−43 |
| C162 | $x^8 y^9$ | 6.0765762358e−44 | 4.1614420059e−44 | −8.6328188868e−43 |
| C164 | $x^6 y^{11}$ | 1.1550944765e−43 | 3.7744556328e−43 | 2.6888635332e−43 |
| C166 | $x^4 y^{13}$ | 1.5769336338e−43 | −3.2211660440e−42 | 2.6078920248e−42 |
| C168 | $x_2 y^{15}$ | −8.3121271856e−44 | −3.0988314881e−42 | 2.7770939759e−42 |
| C170 | $y^{17}$ | −2.6757018919e−43 | −1.5320981053e−41 | 7.9309823805e−43 |

Table 3c for FIG. 47

| Coefficient | Formula | M07 | M08 | M09 |
|---|---|---|---|---|
| C2 | $y$ | 1.1253272212e−02 | 1.4921285929e−01 | 3.5724901001e−02 |
| C7 | $x^2 y$ | −1.3904485414e−07 | −6.0397082184e−07 | 1.1829356713e−08 |
| C9 | $y^3$ | 2.1181283420e−08 | 2.2014836008e−06 | 5.2325711869e−08 |
| C10 | $x^4$ | 6.0945764519e−11 | 3.4492522441e−10 | −1.4175746734e−11 |
| C12 | $x^2 y^2$ | −1.6577833008e−10 | 1.1162195581e−09 | −5.8919643067e−11 |
| C14 | $y^4$ | −7.6502132946e−13 | 7.8590255603e−09 | −1.5967328995e−11 |
| C16 | $x^4 y$ | 1.8250460390e−13 | −7.3176565409e−13 | 7.7848835690e−15 |
| C18 | $x^2 y^3$ | −1.7932896207e−14 | −5.5819003742e−13 | 6.0428847020e−14 |
| C20 | $y^5$ | −9.2211060758e−15 | 4.1598927511e−11 | 5.7809599245e−14 |
| C21 | $x^6$ | −1.4388904513e−16 | 3.4350663163e−16 | −1.3390708650e−17 |
| C23 | $x^4 y^2$ | 6.3897794069e−18 | 5.2261966696e−15 | −1.1477717204e−16 |
| C25 | $x^2 y^4$ | 7.9944716417e−20 | 1.4680876404e−14 | −1.2000553177e−16 |
| C27 | $y^6$ | 1.1944325884e−16 | 2.1117947506e−13 | −3.1047627466e−17 |
| C29 | $x^6 y$ | −1.1781453713e−19 | −2.1289500586e−18 | −1.4381666033e−21 |
| C31 | $x^4 y^3$ | −2.2566395562e−19 | −6.6897378217e−19 | 7.6005507410e−20 |
| C33 | $x^2 y^5$ | −9.5458552382e−19 | 5.6426096103e−17 | 1.3933717172e−19 |
| C35 | $y^7$ | −2.0361166187e−19 | 1.1837424583e−15 | 6.8423643071e−20 |
| C36 | $x^8$ | −2.8367536606e−22 | 2.7902750649e−22 | −2.4129645374e−23 |
| C38 | $x^6 y^2$ | 1.0581053412e−22 | 1.9876919873e−20 | −1.7206570904e−22 |
| C40 | $x^4 y^4$ | 3.7451207202e−21 | 1.1223397531e−19 | −3.0878959077e−22 |
| C42 | $x^2 y^6$ | 1.1758270291e−21 | 3.5765157442e−20 | −2.1169927353e−22 |
| C44 | $y^8$ | −9.7130783328e−23 | 6.1792191031e−18 | −4.1497031031e−23 |
| C46 | $x^8 y$ | −3.8872941057e−24 | −1.3279847513e−23 | −4.4474792963e−28 |
| C48 | $x^6 y^3$ | −9.7130256349e−24 | −8.2366962263e−23 | 7.8184416087e−26 |
| C50 | $x^4 y^5$ | −2.6578478493e−24 | 4.6934331533e−22 | 2.4492456019e−25 |
| C52 | $x^2 y^7$ | 3.7125499500e−24 | 2.7293360646e−21 | 2.7554250808e−25 |
| C54 | $y^9$ | 2.4428573025e−25 | 4.8484839871e−20 | 1.3324088159e−25 |
| C55 | $x^{10}$ | 4.5095697017e−27 | 1.7951960251e−26 | −2.5232429141e−29 |
| C57 | $x^8 y^2$ | 3.1155943314e−27 | 3.2119438389e−26 | −2.0717444962e−28 |
| C59 | $x^6 y^4$ | 2.0171984312e−27 | −8.9376682249e−25 | −5.6906902589e−28 |
| C61 | $x^4 y^6$ | −3.0361839034e−26 | 5.6784447963e−24 | −7.6942227498e−28 |
| C63 | $x^2 y^8$ | −1.4184565574e−26 | 9.3118046150e−23 | −4.0724540256e−28 |
| C65 | $y^{10}$ | 3.0493505995e−27 | 6.4943696975e−22 | −1.0912083734e−28 |
| C67 | $x^{10} y$ | 5.0080848622e−29 | 7.9224015032e−30 | 3.3767363386e−32 |
| C69 | $x^8 y^3$ | 3.7230304464e−29 | 1.5009720679e−28 | 3.0924714531e−31 |
| C71 | $x^6 y^5$ | 1.5488250830e−28 | 1.6460106000e−26 | 9.0195122147e−31 |
| C73 | $x^4 y^7$ | 9.9140643500e−29 | 1.0607284006e−25 | 1.1519950368e−30 |
| C75 | $x^2 y^9$ | 1.7320227167e−29 | 2.5517394833e−25 | 6.1281659387e−31 |
| C77 | $y^{11}$ | −7.4674262311e−31 | 5.4827901118e−24 | −5.8207230145e−32 |
| C78 | $x^{12}$ | 6.6161749913e−33 | −1.7436484283e−31 | −3.6942824616e−35 |
| C80 | $x^{10} y^2$ | 1.0164437427e−31 | 9.2788630272e−31 | −7.4353437705e−34 |
| C82 | $x^8 y^4$ | −3.3360988652e−31 | 2.9406711517e−29 | −2.4807970391e−33 |
| C84 | $x^6 y^6$ | −6.0826783863e−31 | 3.2203462494e−28 | −2.6960079077e−33 |
| C86 | $x^4 y^8$ | 6.3949583504e−33 | 4.7687999826e−28 | −8.7385159762e−34 |
| C88 | $x^2 y^{10}$ | −6.2025652737e−32 | −9.9498761988e−27 | −5.3601484811e−34 |
| C90 | $y^{12}$ | −4.1853700186e−32 | 1.0800044272e−26 | −4.1305815319e−35 |
| C92 | $x^{12} y$ | −5.4834461581e−34 | −2.8884550371e−34 | −4.1519881561e−37 |
| C94 | $x^{10} y^3$ | −7.0908831698e−34 | 4.9143545274e−32 | −1.6027084193e−36 |
| C96 | $x^8 y^5$ | −4.4089993469e−34 | −1.3237773617e−31 | −4.0112132321e−36 |
| C98 | $x^6 y^7$ | −4.9767173830e−34 | −3.2006085584e−30 | −6.0927548716e−36 |
| C100 | $x^4 y^9$ | −3.5943943681e−34 | −9.3100371924e−30 | −4.8868416149e−36 |
| C102 | $x^2 y^{11}$ | −3.9205497722e−34 | −6.7611885196e−29 | −1.7018665218e−36 |
| C104 | $y^{13}$ | 7.7452228772e−35 | −1.8156326470e−28 | 1.8609627336e−37 |
| C105 | $x^{14}$ | −3.2816261383e−37 | 1.6426903878e−36 | 1.4710333927e−41 |
| C107 | $x^{12} y^2$ | −8.0482553389e−37 | 3.8756486731e−36 | 3.0036309795e−39 |
| C109 | $x^{10} y^4$ | −2.1441444642e−36 | −2.0117519913e−35 | 1.4297040199e−38 |
| C111 | $x^8 y^6$ | 8.4054613977e−36 | −7.7210492428e−33 | 2.1321175491e−38 |
| C113 | $x^6 y^8$ | 1.1677778557e−35 | −6.3792271864e−32 | 8.5964525686e−39 |
| C115 | $x^4 y^{10}$ | 3.3706087764e−36 | −8.9180858882e−32 | −4.1406691713e−39 |
| C117 | $x^2 y^{12}$ | 2.8341212071e−36 | 5.8835815737e−31 | −6.2320392576e−40 |
| C119 | $y^{14}$ | 4.0231609241e−37 | −1.5299880615e−30 | −1.3514587116e−39 |
| C121 | $x^{14} y$ | 2.7296958229e−39 | 4.6260611166e−39 | 2.4849436821e−42 |
| C123 | $x^{12} y^3$ | 1.5440578227e−38 | −1.6464470674e−36 | 1.0220286826e−41 |
| C125 | $x^{10} y^5$ | 8.6933684139e−39 | −1.0726494425e−35 | 3.0709815390e−41 |
| C127 | $x^8 y^7$ | −3.2877499875e−38 | 2.6762285737e−35 | 6.4924684463e−41 |
| C129 | $x^6 y^9$ | −2.8433707954e−38 | 1.0528704176e−34 | 8.1928255838e−41 |
| C131 | $x^4 y^{11}$ | −1.2832120430e−38 | 2.8445474547e−34 | 6.4381500397e−41 |
| C133 | $x^2 y^{13}$ | −4.4428328781e−39 | 9.7510323927e−33 | 2.3135145825e−41 |
| C135 | $y^{15}$ | −2.2746041569e−39 | −4.4032235145e−33 | 4.8032657066e−42 |
| C136 | $x^{16}$ | 1.5877574956e−42 | −8.1293044845e−42 | −3.1286487679e−46 |
| C138 | $x^{14} y^2$ | −1.3928009908e−42 | −4.8202791128e−40 | −1.7051634821e−44 |
| C140 | $x^{12} y^4$ | 3.0437929719e−41 | −1.4031322020e−38 | −1.0382383916e−43 |
| C142 | $x^{10} y^6$ | 2.2881433169e−41 | −1.1161126258e−38 | −2.3290815021e−43 |
| C144 | $x^8 y^8$ | −8.4661055093e−41 | 1.5128033484e−36 | −2.4656516492e−43 |
| C146 | $x^6 y^{10}$ | −4.9403868496e−42 | 6.0078170595e−36 | −1.1878989416e−43 |
| C148 | $x^4 y^{12}$ | 1.5754610775e−41 | 7.0252707207e−36 | −2.9464571967e−44 |
| C150 | $x^2 y^{14}$ | −7.9566997587e−43 | 5.0575487992e−35 | −1.2996017096e−44 |

-continued

| | | Table 3c for FIG. 47 | | |
|---|---|---|---|---|
| Coefficient | Formula | M07 | M08 | M09 |
| C152 | $y^{16}$ | 4.3233131806e−42 | −2.4910075117e−36 | 1.0975856828e−44 |
| C154 | $x^{16}y$ | −1.4845528842e−45 | −1.7102484580e−43 | −1.0334614796e−47 |
| C156 | $x^{14}y^3$ | −6.3059177620e−44 | 2.3319504159e−41 | −4.0087306982e−47 |
| C158 | $x^{12}y^5$ | −1.3830359017e−43 | 3.2004033664e−40 | −1.1286748739e−46 |
| C160 | $x^{10}y^7$ | 1.3950473225e−43 | 6.4854322912e−40 | −2.9435802625e−46 |
| C162 | $x^8y^9$ | 2.7815952247e−43 | 5.9647262723e−39 | −5.0393651757e−46 |
| C164 | $x^6y^{11}$ | 5.9563083763e−44 | 2.4446415586e−38 | −5.0393651757e−46 |
| C166 | $x^4y^{13}$ | −4.7206580031e−45 | 3.1930559804e−38 | −3.5993733683e−46 |
| C168 | $x^2y^{15}$ | 4.7352521920e−45 | 9.1923888951e−38 | −9.5474713309e−47 |
| C170 | $y^{17}$ | −2.9669143048e−45 | −1.1343343347e−38 | −2.0691468766e−47 |
| C171 | $x^{18}$ | 0.0000000000e+00 | −2.1427877754e−49 | 6.0739162577e−52 |
| C173 | $x^{16}y^2$ | 0.0000000000e+00 | 1.0234714935e−44 | 5.0747892198e−50 |
| C175 | $x^{14}y^4$ | 0.0000000000e+00 | 3.6326235942e−43 | 3.8924847901e−49 |
| C177 | $x^{12}y^6$ | 0.0000000000e+00 | 3.3791132050e−42 | 1.1152489194e−48 |
| C179 | $x^{10}y^8$ | 0.0000000000e+00 | −6.8990236007e−42 | 1.6522472985e−48 |
| C181 | $x^8y^{10}$ | 0.0000000000e+00 | −8.2287000378e−41 | 1.3444791764e−48 |
| C183 | $x^6y^{12}$ | 0.0000000000e+00 | −1.1918931637e−40 | 6.0887708423e−49 |
| C185 | $x^4y^{14}$ | 0.0000000000e+00 | 4.5358366765e−41 | 2.2905942612e−49 |
| C187 | $x^2y^{16}$ | 0.0000000000e+00 | −1.7190141620e−40 | 7.1828545634e−50 |
| C189 | $y^{18}$ | 0.0000000000e+00 | −1.8713090065e−40 | −4.9272549104e−50 |
| C191 | $x^{18}y$ | 0.0000000000e+00 | 2.8866550001e−48 | 2.9501627645e−53 |
| C193 | $x^{16}y^3$ | 0.0000000000e+00 | −1.5457048242e−46 | 1.0946581241e−52 |
| C195 | $x^{14}y^5$ | 0.0000000000e+00 | −3.4392588731e−45 | 2.5416326564e−52 |
| C197 | $x^{12}y^7$ | 0.0000000000e+00 | −1.3285862952e−44 | 8.1318440770e−52 |
| C199 | $x^{10}y^9$ | 0.0000000000e+00 | −1.0365533050e−43 | 1.7578366190e−51 |
| C201 | $x^8y^{11}$ | 0.0000000000e+00 | −8.7280103204e−43 | 2.3250278207e−51 |
| C203 | $x^6y^{13}$ | 0.0000000000e+00 | −1.1224907951e−42 | 2.1676785450e−51 |
| C205 | $x^4y^{15}$ | 0.0000000000e+00 | 2.9975670179e−43 | 1.3845380468e−51 |
| C207 | $x^2y^{17}$ | 0.0000000000e+00 | −1.0621221719e−42 | 2.5728022433e−52 |
| C209 | $y^{19}$ | 0.0000000000e+00 | −6.4846364680e−43 | 4.4176804355e−53 |
| C210 | $x^{20}$ | 0.0000000000e+00 | 2.2672673105e−52 | −1.2438974035e−57 |
| C212 | $x^{18}y^2$ | 0.0000000000e+00 | −1.0271848983e−49 | −1.0280522086e−55 |
| C214 | $x^{16}y^4$ | 0.0000000000e+00 | −4.3255291671e−48 | −9.3559786835e−55 |
| C216 | $x^{14}y^6$ | 0.0000000000e+00 | −5.9642756397e−47 | −3.2759733761e−54 |
| C218 | $x^{12}y^8$ | 0.0000000000e+00 | −1.8927696102e−46 | −6.2098380132e−54 |
| C220 | $x^{10}y^{10}$ | 0.0000000000e+00 | 1.9490021078e−46 | −7.1456201347e−54 |
| C222 | $x^8y^{12}$ | 0.0000000000e+00 | −2.8769838414e−45 | −5.1091699520e−54 |
| C224 | $x^6y^{14}$ | 0.0000000000e+00 | −1.8257369589e−45 | −2.4686937839e−54 |
| C226 | $x^4y^{16}$ | 0.0000000000e+00 | 3.9497379473e−45 | −1.0848536851e−54 |
| C228 | $x^2y^{18}$ | 0.0000000000e+00 | −1.7743864580e−45 | −3.1849650114e−55 |
| C230 | $y^{20}$ | 0.0000000000e+00 | −6.2859777559e−46 | 1.0696110246e−55 |
| C232 | $x^{20}y$ | 0.0000000000e+00 | −2.7623432056e−53 | −5.4229389061e−59 |
| C234 | $x^{18}y^3$ | 0.0000000000e+00 | 1.5916077951e−52 | −1.9474521858e−58 |
| C236 | $x^{16}y^5$ | 0.0000000000e+00 | 1.0835875420e−50 | −2.5096646182e−58 |
| C238 | $x^{14}y^7$ | 0.0000000000e+00 | 2.0146061254e−50 | −9.1470612210e−58 |
| C240 | $x^{12}y^9$ | 0.0000000000e+00 | 2.4162424603e−49 | −2.9873841027e−57 |
| C242 | $x^{10}y^{11}$ | 0.0000000000e+00 | 7.4670512256e−48 | −5.4249328882e−57 |
| C244 | $x^8y^{13}$ | 0.0000000000e+00 | 1.3261577559e−48 | −6.0025157437e−57 |
| C246 | $x^6y^{15}$ | 0.0000000000e+00 | 9.1801564316e−48 | −5.0664777869e−57 |
| C248 | $x^4y^{17}$ | 0.0000000000e+00 | 1.9360320003e−47 | −2.8980004588e−57 |
| C250 | $x^2y^{19}$ | 0.0000000000e+00 | −2.3119926406e−48 | −3.0642788120e−58 |
| C252 | $y^{21}$ | 0.0000000000e+00 | 2.7372982169e−49 | −3.4937403630e−59 |
| C253 | $x^{22}$ | 0.0000000000e+00 | −1.0505462482e−57 | 1.6106171843e−63 |
| C255 | $x^{20}y^2$ | 0.0000000000e+00 | 5.2087559037e−55 | 1.1729045977e−61 |
| C257 | $x^{18}y^4$ | 0.0000000000e+00 | 2.5659731772e−53 | 1.2362748348e−60 |
| C259 | $x^{16}y^6$ | 0.0000000000e+00 | 4.4709548708e−52 | 5.1362054220e−60 |
| C261 | $x^{14}y^8$ | 0.0000000000e+00 | 2.5321380661e−51 | 1.1789286309e−59 |
| C263 | $x^{12}y^{10}$ | 0.0000000000e+00 | 5.1269085300e−51 | 1.7207445115e−59 |
| C265 | $x^{10}y^{12}$ | 0.0000000000e+00 | 4.2104605832e−50 | 1.6690607190e−59 |
| C267 | $x^8y^{14}$ | 0.0000000000e+00 | 4.5597477697e−50 | 1.1116278592e−59 |
| C269 | $x^6y^{16}$ | 0.0000000000e+00 | 5.3935412784e−50 | 5.5193029662e−60 |
| C271 | $x^4y^{18}$ | 0.0000000000e+00 | 4.3434038909e−50 | 2.4051939290e−60 |
| C273 | $x^2y^{20}$ | 0.0000000000e+00 | −6.0096960611e−51 | 6.4274002650e−61 |
| C275 | $y^{22}$ | 0.0000000000e+00 | −1.3021508509e−51 | −1.1395989861e−61 |
| C277 | $x^{22}y$ | 0.0000000000e+00 | 1.3843145871e−58 | 5.7336735689e−65 |
| C279 | $x^{20}y^3$ | 0.0000000000e+00 | 3.3689831674e−57 | 2.1001876745e−64 |
| C281 | $x^{18}y^5$ | 0.0000000000e+00 | 5.8599645759e−56 | −9.6815586258e−66 |
| C283 | $x^{16}y^7$ | 0.0000000000e+00 | 9.6873249049e−55 | −2.5514146676e−64 |
| C285 | $x^{14}y^9$ | 0.0000000000e+00 | 5.4224346543e−54 | 1.2090102246e−63 |
| C287 | $x^{12}y^{11}$ | 0.0000000000e+00 | 1.7485606322e−54 | 4.6890819900e−63 |
| C289 | $x^{10}y^{13}$ | 0.0000000000e+00 | 1.1088779879e−52 | 7.6516504310e−63 |
| C291 | $x^8y^{15}$ | 0.0000000000e+00 | 1.9572091832e−52 | 7.0789228727e−63 |
| C293 | $x^6y^{17}$ | 0.0000000000e+00 | 1.4804486848e−52 | 5.7194098781e−63 |
| C295 | $x^4y^{19}$ | 0.0000000000e+00 | 3.8969616151e−53 | 2.9596283225e−63 |
| C297 | $x^2y^{21}$ | 0.0000000000e+00 | −3.8027771945e−54 | 1.8555504317e−65 |

-continued

Table 3c for FIG. 47

| Coefficient | Formula | M07 | M08 | M09 |
|---|---|---|---|---|
| C299 | $y^{23}$ | 0.0000000000e+00 | −4.2737061590e−54 | −1.2109652827e−65 |
| C300 | $x^{24}$ | 0.0000000000e+00 | 1.6055365413e−63 | −1.2790165087e−69 |
| C302 | $x^{22} y^2$ | 0.0000000000e+00 | −1.0651360525e−60 | −6.5053347096e−68 |
| C304 | $x^{20} y^4$ | 0.0000000000e+00 | −6.0939459751e−59 | −7.5186990495e−67 |
| C306 | $x^{18} y^6$ | 0.0000000000e+00 | −1.2760718528e−57 | −3.6122692448e−66 |
| C308 | $x^{16} y^8$ | 0.0000000000e+00 | −9.1166048282e−57 | −9.7904222346e−66 |
| C310 | $x^{14} y^{10}$ | 0.0000000000e+00 | −2.4699290258e−56 | −1.7460975853e−65 |
| C312 | $x^{12} y^{12}$ | 0.0000000000e+00 | −5.9501975338e−56 | −2.1567692389e−65 |
| C314 | $x^{10} y^{14}$ | 0.0000000000e+00 | 1.5550861351e−55 | −1.9126618063e−65 |
| C316 | $x^8 y^{16}$ | 0.0000000000e+00 | 4.3285892864e−55 | −1.2543765110e−65 |
| C318 | $x^6 y18$ | 0.0000000000e+00 | 2.6472816107e−55 | −6.2534997801e−66 |
| C320 | $x^4 y^{20}$ | 0.0000000000e+00 | −5.0341715487e−57 | −2.5101604091e−66 |
| C322 | $x^2 y^{22}$ | 0.0000000000e+00 | 2.0820712384e−56 | −6.0517880294e−67 |
| C324 | $y^{24}$ | 0.0000000000e+00 | 2.4368204644e−57 | 3.5843553381e−68 |
| C326 | $x^{24} y$ | 0.0000000000e+00 | −2.8648220984e−64 | −2.7011589444e−71 |
| C328 | $x^{22} y^3$ | 0.0000000000e+00 | −1.3044072620e−62 | −1.0322876695e−70 |
| C330 | $x^{20} y^5$ | 0.0000000000e+00 | −3.6493773410e−61 | 1.7229848360e−70 |
| C332 | $x^{18} y^7$ | 0.0000000000e+00 | −5.2594213902e−60 | 1.2214579542e−69 |
| C334 | $x^{16} y^9$ | 0.0000000000e+00 | −3.0109277510e−59 | 2.2746932377e−69 |
| C336 | $x^{14} y^{11}$ | 0.0000000000e+00 | −7.0890336363e−59 | 2.5309526540e−69 |
| C338 | $x^{12} y^{13}$ | 0.0000000000e+00 | −1.0681994694e−58 | 1.3256002937e−69 |
| C340 | $x^{10} y^{15}$ | 0.0000000000e+00 | 1.0686329810e−58 | 6.2284749243e−70 |
| C342 | $x^8 y^{17}$ | 0.0000000000e+00 | 4.0840274610e−58 | 8.1461582459e−70 |
| C344 | $x^6 y^{19}$ | 0.0000000000e+00 | 2.3168314365e−58 | −3.8844860003e−70 |
| C346 | $x^4 y^{21}$ | 0.0000000000e+00 | −1.9330354259e−59 | −3.5576032025e−70 |
| C348 | $x^2 y^{23}$ | 0.0000000000e+00 | 2.9729672713e−59 | 3.3853565023e−70 |
| C350 | $y^{25}$ | 0.0000000000e+00 | 8.7582083938e−60 | 4.0051948646e−71 |

Table 4 for FIG. 47
Coordinates of the stop edge

| $x_i$ [mm] | $y_i$ [mm] | $x_{i+N/2}$ [mm] | $y_{i+N/2}$ [mm] |
|---|---|---|---|
| −383.448470 | −0.138724 | 383.731999 | −13.334719 |
| −382.871028 | 6.515194 | 383.439072 | −19.870019 |
| −382.003607 | 13.201685 | 382.858111 | −26.359193 |
| −380.847412 | 19.917081 | 381.991232 | −32.799141 |
| −379.404322 | 26.657606 | 380.841150 | −39.186873 |
| −377.676878 | 33.419387 | 379.411145 | −45.519513 |
| −375.668256 | 40.198453 | 377.705019 | −51.794391 |
| −373.382248 | 46.990753 | 375.727052 | −58.008540 |
| −370.823220 | 53.792158 | 373.481953 | −64.159687 |
| −367.996084 | 60.598474 | 370.974809 | −70.245252 |
| −364.906252 | 67.405455 | 368.211041 | −76.262834 |
| −361.559597 | 74.208811 | 365.196345 | −82.210107 |
| −357.962408 | 81.004214 | 361.936651 | −88.084811 |
| −354.121346 | 87.787309 | 358.438071 | −93.884744 |
| −350.043396 | 94.553717 | 354.706855 | −99.607756 |
| −345.735819 | 101.299036 | 350.749347 | −105.251743 |
| −341.206114 | 108.018844 | 346.571946 | −110.814640 |
| −336.461962 | 114.708700 | 342.181071 | −116.294417 |
| −331.511189 | 121.364146 | 337.583122 | −121.689078 |
| −326.361720 | 127.980705 | 332.784458 | −126.996652 |
| −321.021540 | 134.553893 | 327.791364 | −132.215197 |
| −315.498652 | 141.079214 | 322.610030 | −137.342794 |
| −309.801042 | 147.552172 | 317.246534 | −142.377550 |
| −303.936644 | 153.968271 | 311.706827 | −147.317594 |
| −297.913308 | 160.323019 | 305.996719 | −152.161082 |
| −291.738768 | 166.611928 | 300.121872 | −156.906194 |
| −285.420616 | 172.830504 | 294.087800 | −161.551141 |
| −278.966275 | 178.974248 | 287.899861 | −166.094160 |
| −272.382980 | 185.038640 | 281.563263 | −170.533525 |
| −265.677756 | 191.019126 | 275.083069 | −174.867544 |
| −258.857401 | 196.911112 | 268.464199 | −179.094563 |
| −251.928475 | 202.709947 | 261.711445 | −183.212968 |
| −244.897290 | 208.410916 | 254.829471 | −187.221189 |
| −237.769903 | 214.009237 | 247.822829 | −191.117699 |
| −230.552112 | 219.500053 | 240.695970 | −194.901016 |
| −223.249455 | 224.878436 | 233.453250 | −198.569706 |
| −215.867212 | 230.139385 | 226.098943 | −202.122380 |
| −208.410409 | 235.277826 | 218.637251 | −205.557697 |
| −200.883818 | 240.288610 | 211.072313 | −208.874364 |
| −193.291970 | 245.166519 | 203.408214 | −212.071134 |
| −185.639154 | 249.906251 | 195.648995 | −215.146807 |
| −177.929433 | 254.502427 | 187.798658 | −218.100231 |
| −170.166648 | 258.949585 | 179.861174 | −220.930298 |
| −162.354430 | 263.242178 | 171.840492 | −223.635949 |
| −154.496210 | 267.374583 | 163.740541 | −226.216170 |
| −146.595236 | 271.341112 | 155.565238 | −228.669994 |
| −138.654581 | 275.136024 | 147.318493 | −230.996500 |
| −130.677159 | 278.753553 | 139.004212 | −233.194813 |
| −122.665740 | 282.187936 | 130.626298 | −235.264107 |
| −114.622962 | 285.433446 | 122.188661 | −237.203601 |
| −106.551346 | 288.484434 | 113.695214 | −239.012562 |
| −98.453309 | 291.335369 | 105.149877 | −240.690306 |
| −90.331173 | 293.980881 | 96.556580 | −242.236195 |
| −82.187183 | 296.415805 | 87.919265 | −243.649643 |
| −74.023510 | 298.635227 | 79.241883 | −244.930110 |
| −65.842268 | 300.634526 | 70.528397 | −246.077109 |
| −57.645517 | 302.409422 | 61.782782 | −247.090202 |
| −49.435276 | 303.956012 | 53.009026 | −247.969001 |
| −41.213530 | 305.270819 | 44.211126 | −248.713171 |
| −32.982233 | 306.350825 | 35.393090 | −249.322425 |
| −24.743319 | 307.193509 | 26.558933 | −249.796532 |
| −16.498706 | 307.796873 | 17.712679 | −250.135310 |
| −8.250301 | 308.159475 | 8.858357 | −250.338628 |
| 0.000000 | 308.280440 | 0.000000 | −250.406409 |
| 8.250301 | 308.159475 | −8.858357 | −250.338628 |
| 16.498706 | 307.796873 | −17.712679 | −250.135310 |
| 24.743319 | 307.193509 | −26.558933 | −249.796532 |
| 32.982233 | 306.350825 | −35.393090 | −249.322425 |
| 41.213530 | 305.270819 | −44.211126 | −248.713171 |
| 49.435276 | 303.956012 | −53.009026 | −247.969001 |
| 57.645517 | 302.409422 | −61.782782 | −247.090202 |
| 65.842268 | 300.634526 | −70.528397 | −246.077109 |
| 74.023510 | 298.635227 | −79.241883 | −244.930110 |
| 82.187183 | 296.415805 | −87.919265 | −243.649643 |
| 90.331173 | 293.980881 | −96.556580 | −242.236195 |
| 98.453309 | 291.335369 | −105.149877 | −240.690306 |
| 106.551346 | 288.484434 | −113.695214 | −239.012562 |

-continued

-continued

Table 4 for FIG. 47
Coordinates of the stop edge

| $x_i$ [mm] | $y_i$ [mm] | $x_{i+N/2}$ [mm] | $y_{i+N/2}$ [mm] |
|---|---|---|---|
| 114.622962 | 285.433446 | −122.188661 | −237.203601 |
| 122.665740 | 282.187936 | −130.626298 | −235.264107 |
| 130.677159 | 278.753553 | −139.004212 | −233.194813 |
| 138.654581 | 275.136024 | −147.318493 | −230.996500 |
| 146.595236 | 271.341112 | −155.565238 | −228.669994 |
| 154.496210 | 267.374583 | −163.740541 | −226.216170 |
| 162.354430 | 263.242178 | −171.840492 | −223.635949 |
| 170.166648 | 258.949585 | −179.861174 | −220.930298 |
| 177.929433 | 254.502427 | −187.798658 | −218.100231 |
| 185.639154 | 249.906251 | −195.648995 | −215.146807 |
| 193.291970 | 245.166519 | −203.408214 | −212.071134 |
| 200.883818 | 240.288610 | −211.072313 | −208.874364 |
| 208.410409 | 235.277826 | −218.637251 | −205.557697 |
| 215.867212 | 230.139385 | −226.098943 | −202.122380 |
| 223.249455 | 224.878436 | −233.453250 | −198.569706 |
| 230.552112 | 219.500053 | −240.695970 | −194.901016 |
| 237.769903 | 214.009237 | −247.822829 | −191.117699 |
| 244.897290 | 208.410916 | −254.829471 | −187.221189 |
| 251.928475 | 202.709947 | −261.711445 | −183.212968 |
| 258.857401 | 196.911112 | −268.464199 | −179.094563 |
| 265.677756 | 191.019126 | −275.083069 | −174.867544 |
| 272.382980 | 185.038640 | −281.563263 | −170.533525 |
| 278.966275 | 178.974248 | −287.899861 | −166.094160 |
| 285.420616 | 172.830504 | −294.087800 | −161.551141 |
| 291.738768 | 166.611928 | −300.121872 | −156.906194 |
| 297.913308 | 160.323019 | −305.996719 | −152.161082 |
| 303.936644 | 153.968271 | −311.706827 | −147.317594 |
| 309.801042 | 147.552172 | −317.246534 | −142.377550 |
| 315.498652 | 141.079214 | −322.610030 | −137.342794 |
| 321.021540 | 134.553893 | −327.791364 | −132.215197 |
| 326.361720 | 127.980705 | −332.784458 | −126.996652 |
| 331.511189 | 121.364146 | −337.583122 | −121.689078 |
| 336.461962 | 114.708700 | −342.181071 | −116.294417 |
| 341.206114 | 108.018844 | −346.571946 | −110.814640 |
| 345.735819 | 101.299036 | −350.749347 | −105.251743 |
| 350.043396 | 94.553717 | −354.706855 | −99.607756 |
| 354.121346 | 87.787309 | −358.438071 | −93.884744 |
| 357.962408 | 81.004214 | −361.936651 | −88.084811 |
| 361.559597 | 74.208811 | −365.196345 | −82.210107 |
| 364.906252 | 67.405455 | −368.211041 | −76.262834 |
| 367.996084 | 60.598474 | −370.974809 | −70.245252 |
| 370.823220 | 53.792158 | −373.481953 | −64.159687 |
| 373.382248 | 46.990753 | −375.727052 | −58.008540 |
| 375.668256 | 40.198453 | −377.705019 | −51.794291 |
| 377.676878 | 33.419387 | −379.411145 | −45.519513 |
| 379.404322 | 26.657606 | −380.841150 | −39.186873 |
| 380.847412 | 19.917081 | −381.991232 | −32.799141 |
| 382.003607 | 13.201685 | −382.858111 | −26.359193 |
| 382.871028 | 6.515194 | −383.439072 | −19.870019 |
| 383.448470 | −0.138724 | −383.731999 | −13.334719 |
| 383.735407 | −6.756510 | −383.735407 | −6.756510 |

Table 5 for FIG. 47

| NA | Numerical aperture | 0.75 |
|---|---|---|
| $|\beta x|$ | Magnification scale in the cross-scan direction | 4.0 |
| $|\beta y|$ | Magnification scale in the scan direction | 8.0 |
| RMS | Scanned wavefront deviation | 7.8 mλ |
| N | Number of mirrors | 9 |

FIGS. 48 to 56 show the edge contours of the reflection surfaces of the mirrors M1 to M9 of the projection optical unit 31.

The GI mirrors M2 to M6, for example, have an x/y-aspect ratio the deviates significantly from 1.

FIGS. 47 to 65 show, in turn, edge contours $28_{M1}$ to $28_{M9}$ in the case of an arrangement of the respective test light beam path, optimized to minimizing the number of DOEs $16_i$, for measuring the used reflection surfaces of the mirrors M1 to M9.

The edge contour $28_{M9}$ is so small that it can be covered by a single DOE 16. Two DOEs $16_1$, $16_2$ are used to cover the edge contour $28_{M1}$. Three DOEs $16_i$ (i=1 to 3) are used in each case to cover the edge contours $28_{M3}$, $28_{M6}$ and $28_{M7}$. Four DOEs $16_i$ (i=1 to 4) are used in each case to cover the edge contours $28_{M4}$ and $28_{M5}$. Six DOEs $16_i$ (i=1 to 6) are used to cover the edge contour $28_{M8}$.

A total of 32 DOEs $16_i$ or 32 DOE test positions are used to completely measure all reflection surfaces of the mirrors M1 to M9 of the imaging optical unit 32. The ratio of this number 32 of DOEs $16_i$ and the number 9 of mirrors of the imaging optical unit 32 is 32/9=3.56.

The following table once again summarizes the numerical data in respect of number of mirrors and minimum number of DOEs for the three above-described exemplary embodiments.

| Projection optical unit | Number of Mirrors | Minimum number of DOEs | DOEs per Mirror |
|---|---|---|---|
| FIG. 7 | 8 | 24 | 3.00 |
| FIG. 24 | 11 | 34 | 3.09 |
| FIG. 47 | 9 | 32 | 3.56 |

Mirror/DOE numerical data for the exemplary embodiments according to FIGS. 7, 24 and 47.

In order to produce a microstructured or nanostructured component, the projection exposure apparatus 1 is used as follows: first, the reflection mask 10 or the reticle and the substrate or the wafer 11 are provided. Subsequently, a structure on the reticle 10 is projected onto a light-sensitive layer of the wafer 11 with the aid of the projection exposure apparatus 1. Then, a microstructure or nanostructure on the wafer 11, and hence the microstructured component, is produced by developing the light-sensitive layer.

What is claimed is:

1. An imaging optical unit, comprising:
   a plurality of mirrors configured to image an object field into an image field,
   wherein:
      the imaging optical unit has an image-side numerical aperture greater than 0.55;
      each mirror is configured to be measurable by a testing optical unit comprising at least one diffractive optical element (DOE) having a maximum diameter for test wavefront generation;
      the imaging optical unit is configured so that, for a complete measurement of all reflection surfaces of the mirrors of the imaging optical unit, the testing optical unit comprises:
         i) a maximum number of DOEs that is no more than five times the number of mirrors in the imaging optical unit; and
         ii) a maximum number of DOE test positions of the at least one DOE that is used is no more than five times the number of mirrors in the imaging optical unit.

2. The imaging optical unit of claim 1, wherein the at least one DOE has a maximum diameter of less than 500 mm.

3. The imaging optical unit of claim 1, wherein the imaging optical unit is anamorphic optical unit.

4. The imaging optical unit of claim 1, wherein the imaging optical unit has a wavefront aberration of no more than 20 mλ.

5. The imaging optical unit of claim 1, wherein the imaging optical unit comprises a total of at least eight mirrors.

6. The imaging optical unit of claim 1, wherein, for the complete measurement of exactly one reflection surface of the mirrors of the imaging optical unit:

a maximum number of DOEs of the testing optical unit that is used is no more than seven; and/or a maximum number of DOE test positions of the at least one DOE of the testing optical unit that is used is no more than 7.

7. The imaging optical unit of claim 1, wherein the imaging optical unit comprises at least four grazing incidence mirrors.

8. The imaging optical unit of claim 1, wherein the imaging optical unit comprises at least three normal incidence mirrors.

9. The imaging optical unit of claim 1, wherein the at least one DOE has a maximum diameter of less than 500 mm, and the imaging optical unit is an anamorphic optical unit.

10. The imaging optical unit of claim 1, wherein the at least one DOE has a maximum diameter of less than 500 mm, and the imaging optical unit has a wavefront aberration of no more than 20 mλ.

11. The imaging optical unit of claim 1, wherein the at least one DOE has a maximum diameter of less than 500 mm, and the imaging optical unit comprises a total of at least eight mirrors.

12. The imaging optical unit of claim 1, wherein:

the at least one DOE has a maximum diameter of less than 500 mml and for the complete measurement of exactly one reflection surface of the mirrors of the imaging optical unit:

a maximum number of DOEs of the testing optical unit that is used is no more than seven; and/or a maximum number of DOE test positions of the at least one DOE of the testing optical unit that is used is no more than 7.

13. The imaging optical unit of claim 1, wherein the at least one DOE has a maximum diameter of less than 500 mm, and the imaging optical unit comprises at least four grazing incidence mirrors.

14. The imaging optical unit of claim 1, wherein the at least one DOE has a maximum diameter of less than 500 mm, and the imaging optical unit comprises at least three normal incidence mirrors.

15. The imaging optical unit of claim 1, wherein the imaging optical unit comprises at least four grazing incidence mirrors, and the imaging optical unit comprises at least three normal incidence mirrors.

16. The imaging optical unit of claim 15, wherein the at least one DOE has a maximum diameter of less than 500 mm.

17. An optical system, comprising:

an imaging optical unit according to claim 1; and an illumination optical unit configured to illuminate the object field with illumination and imaging light.

18. An illumination system, comprising:

an optical system, comprising:

an imaging optical unit according to claim 1; and an illumination optical unit configured to illuminate the object field with illumination and imaging light; and a light source configured to produce the illumination and imaging light.

19. An apparatus, comprising:

an illumination system, comprising:

an optical system, comprising:

an imaging optical unit according to claim 1; and an illumination optical unit configured to illuminate the object field with illumination and imaging light; and a light source configured to produce the illumination and imaging light, wherein the apparatus is a projection exposure apparatus for projection lithography.

20. A method of using a projection exposure apparatus for projection lithography comprising an imaging optical unit and an illumination optical unit, the method comprising:

using the illumination optical unit to illuminate a reticle; and using the imaging optical unit to an illuminated structure of the reticle onto a light-sensitive material of a wafer, wherein the imaging optical unit is an imaging optical unit according to claim 1.

21. An imaging optical unit, comprising:

a plurality of mirrors configured to image an object field into an image field, wherein:

the imaging optical unit has an image-side numerical aperture greater than 0.55;

each mirror is configured to be measurable by a testing optical unit comprising at least one diffractive optical element (DOE) having a maximum diameter for test wavefront generation;

the imaging optical unit has a wavefront aberration of no more than 20 m; and the imaging optical unit is configured so that, for a complete measurement of all reflection surfaces of the mirrors of the imaging optical unit, the testing optical unit comprises:

i) a maximum number of DOEs that is no more than five times the number of mirrors in the imaging optical unit; and/or ii) a maximum number of DOE test positions of the at least one DOE that is used is no more than five times the number of mirrors in the imaging optical unit.

22. An optical system, comprising:

an imaging optical unit according to claim 21; and an illumination optical unit configured to illuminate the object field with illumination and imaging light.

23. An illumination system, comprising:

an optical system, comprising:

an imaging optical unit according to claim 21; and an illumination optical unit configured to illuminate the object field with illumination and imaging light; and a light source configured to produce the illumination and imaging light.

24. An apparatus, comprising:

an illumination system, comprising:

an optical system, comprising:

an imaging optical unit according to claim 21; and an illumination optical unit configured to illuminate the object field with illumination and imaging light; and a light source configured to produce the illumination and imaging light, wherein the apparatus is a projection exposure apparatus for projection lithography.

25. A method of using a projection exposure apparatus for projection lithography comprising an imaging optical unit and an illumination optical unit, the method comprising:

using the illumination optical unit to illuminate a reticle; and using the imaging optical unit to an illuminated structure of the reticle onto a light-sensitive material of a wafer, wherein the imaging optical unit is an imaging optical unit according to claim 21.

* * * * *